United States Patent [19]

Kuroda et al.

[11] Patent Number: 5,548,146
[45] Date of Patent: Aug. 20, 1996

[54] NONVOLATILE MEMORY DEVICE HAVING SOURCE AND DRAIN OF MEMORY CELLS INTEGRALLY FORMED WITH DATA-SOURCE LINES

[75] Inventors: Kenichi Kuroda, Tachikawa; Kazuyoshi Shiba, Kodaira; Akinori Matsuo, Higashiyamato, all of Japan

[73] Assignees: Hitachi, Ltd.; Hitachi ULSI Engineering Corp., both of Tokyo, Japan

[21] Appl. No.: 470,008

[22] Filed: Jun. 6, 1995

Related U.S. Application Data

[63] Continuation of Ser. No. 138,510, Oct. 20, 1993, abandoned.

[30] Foreign Application Priority Data

Oct. 29, 1992 [JP] Japan .................................. 4-314014
Apr. 27, 1993 [JP] Japan .................................. 5-123531

[51] Int. Cl.⁶ ............................................... H01L 29/788
[52] U.S. Cl. ...................... 257/321; 257/316; 365/185.01
[58] Field of Search ..................................... 257/315, 316, 257/317, 321; 365/185, 900

[56] References Cited

U.S. PATENT DOCUMENTS

| | | | |
|---|---|---|---|
| 4,639,893 | 1/1987 | Eitan | 257/315 |
| 4,868,619 | 9/1989 | Mukherjee et al. | 257/316 |
| 4,887,238 | 12/1989 | Bergemont | 365/185 |
| 4,949,309 | 8/1990 | Rao | 365/218 |
| 5,032,881 | 7/1991 | Sardo et al. | 257/316 |
| 5,153,684 | 10/1992 | Shoji et al. | 257/315 |
| 5,280,446 | 1/1994 | Ma et al. | 257/316 |
| 5,293,331 | 3/1994 | Hart et al. | 257/315 |
| 5,300,802 | 4/1994 | Komori et al. | 257/315 |

FOREIGN PATENT DOCUMENTS

| | | | |
|---|---|---|---|
| 0286121 | 10/1988 | European Pat. Off. | 257/316 |
| 0386631 | 9/1990 | European Pat. Off. | 257/316 |
| 61-32478 | 2/1986 | Japan | 257/316 |
| 62-71277 | 4/1987 | Japan | 257/316 |

OTHER PUBLICATIONS

IEEE Tech. Dig. of IEDM, 1990, pp. 111–114.
IEEE Tech. Dig. of IEDM, 1991, pp. 311–314.
IEEE Tech. Dig. of IEDM, 1988, pp. 432–435.

*Primary Examiner*—Ngân V. Ngô
*Attorney, Agent, or Firm*—Antonelli, Terry, Stout & Kraus

[57] ABSTRACT

A semiconductor substrate of a first conductivity type has formed on its main surface a floating gate through a first gate insulating film and has further formed over the floating gate a control gate through a second gate insulating film. In one of a paired source and drain and across which there is provided the floating gate insulatedly above the main surface of the substrate, a semiconductor region of second conductivity type having a lower impurity concentration than that of the paired source and drain is formed in a portion of the substrate overlapping the floating gate. A nonvolatile memory device thus constructed has its writing operation carried out by extracting electrons from the floating gate to the other of the paired source and drain having a semiconductor region of the second conductivity type, having a higher impurity concentration, by an F-N tunneling of electrons flowing through the first gate insulating film and its erasing operation carried out by injecting from the paired source and drain or the semiconductor substrate into the floating gate by the F-N tunneling of electrons flowing through the first gate insulating film. Data lines or source lines can be shared between memory cells adjacent to each other in a word line direction so that the memory cells can be substantially small-sized. The writing operation and the erasing operation can be carried out by the tunnel current so that the corresponding, necessary high voltages can be generated by the internal circuits.

16 Claims, 52 Drawing Sheets

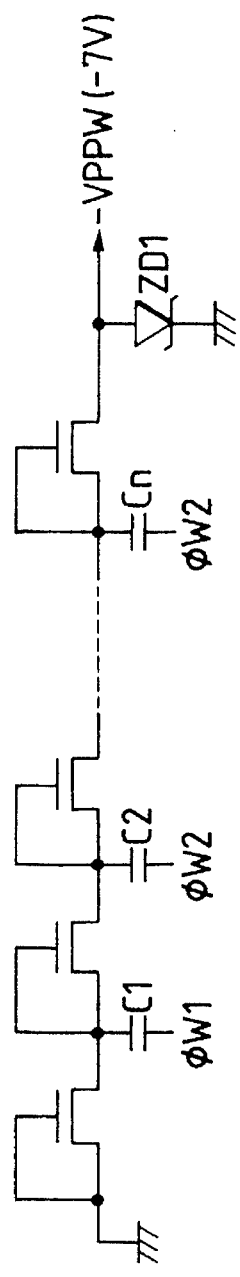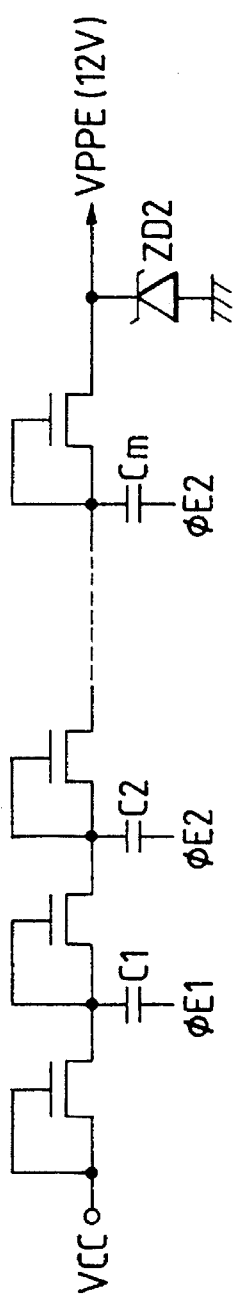
FIG. 22A
FIG. 22B

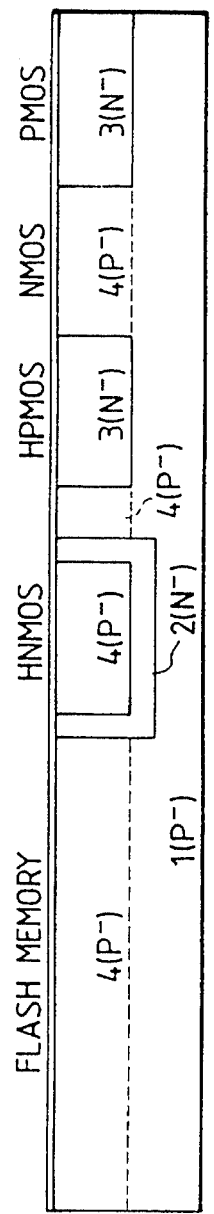
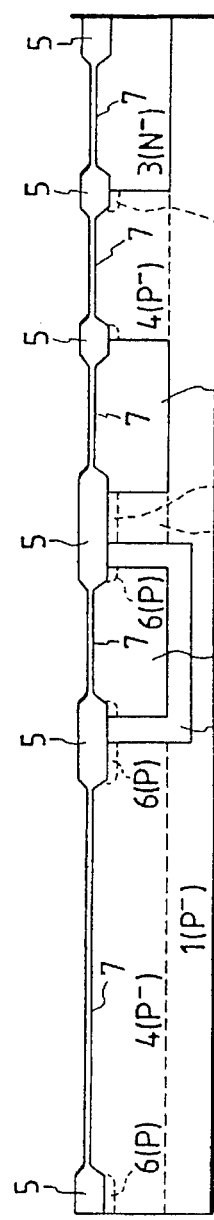
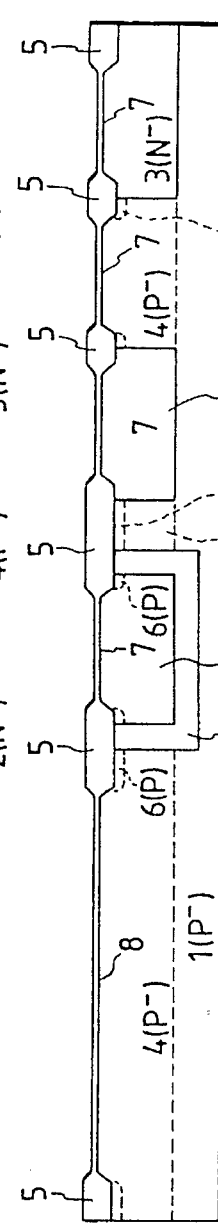
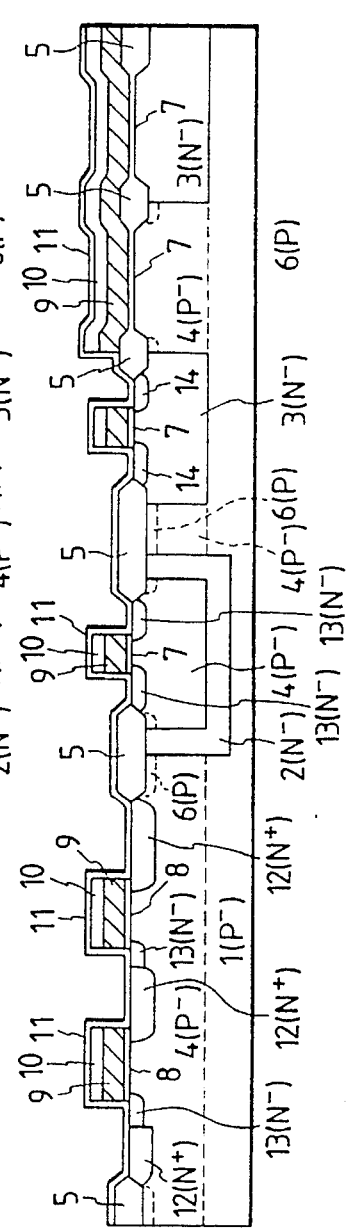
FIG. 34A
FIG. 34B
FIG. 34C
FIG. 34D

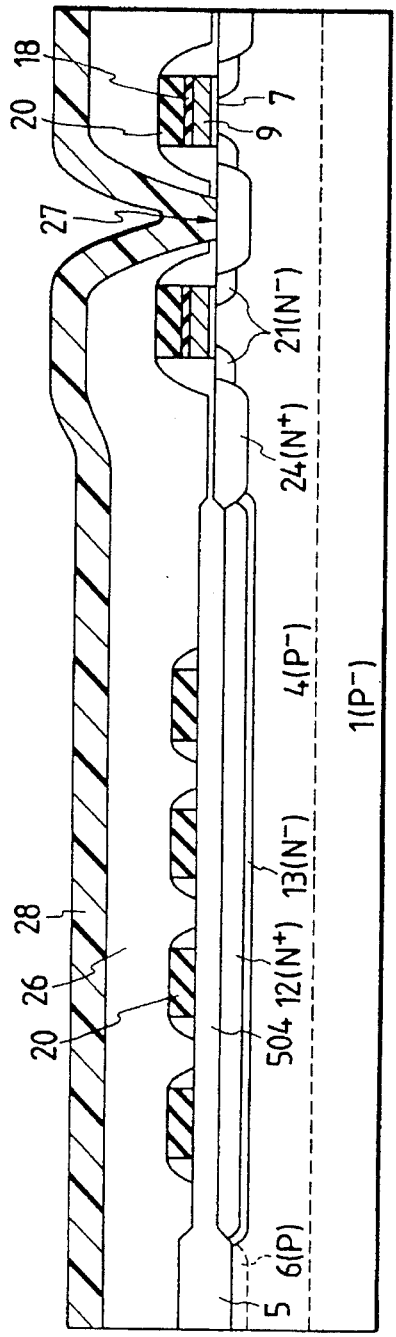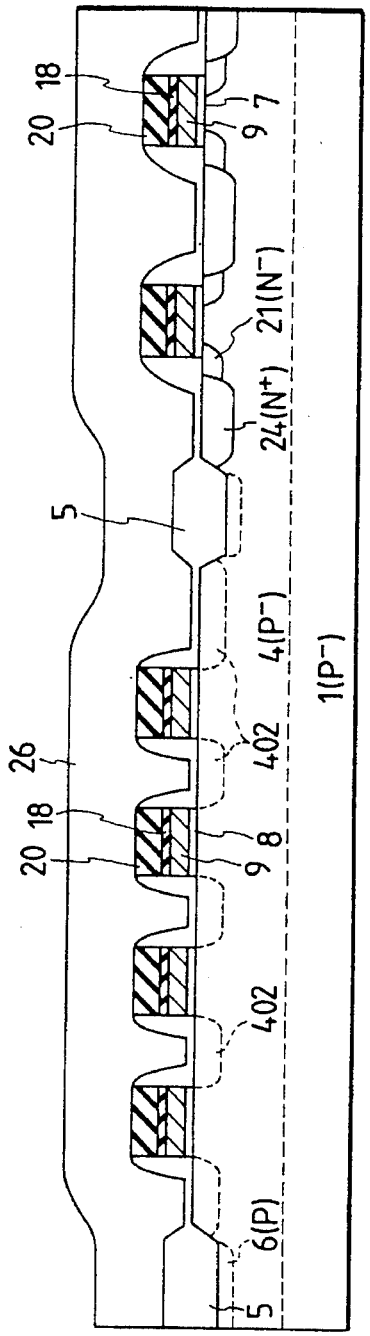

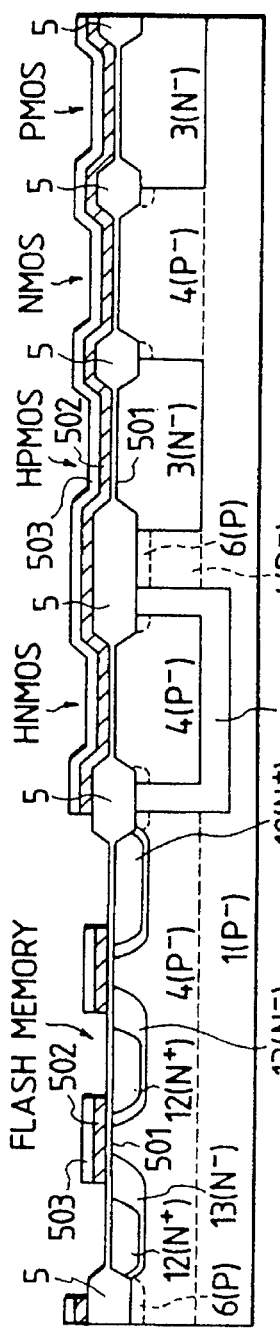
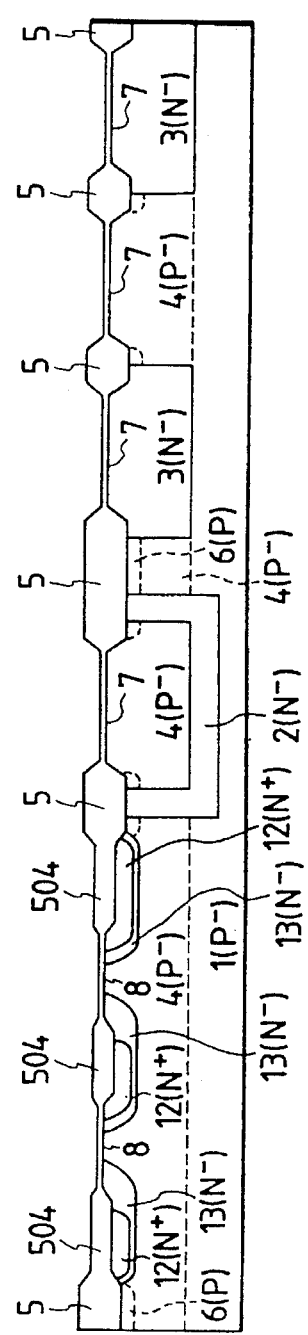
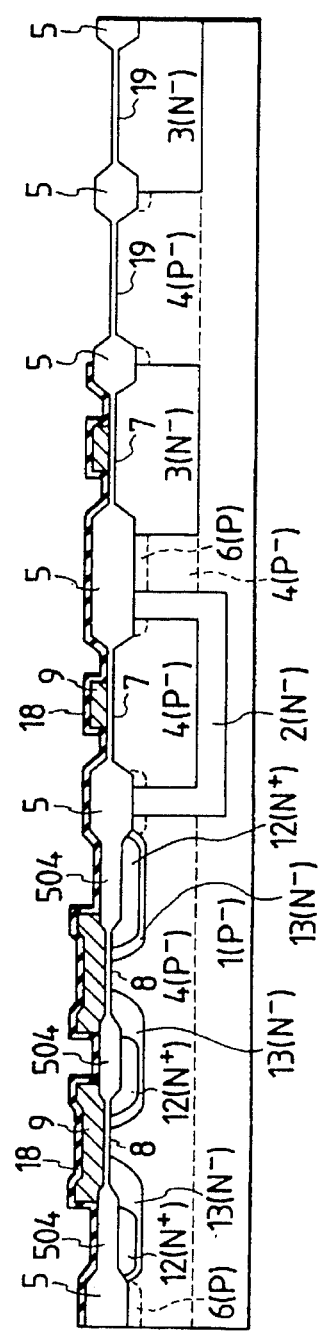
FIG. 58A
FIG. 58B
FIG. 58C

NONVOLATILE MEMORY DEVICE HAVING SOURCE AND DRAIN OF MEMORY CELLS INTEGRALLY FORMED WITH DATA-SOURCE LINES

This application is a continuation of application Ser. No. 08/138,510, filed on Oct. 20, 1993, now abandoned.

BACKGROUND OF THE INVENTION

The present invention relates to a nonvolatile memory device and a process for fabricating the same and, more particularly, to a technology which is effective if applied to a nonvolatile memory device such as the so-called "flash ROM (Read Only Memory)" capable of having electrically writing and erasing operations and a fabricating process of the same.

A program memory in a microcomputer is divided into the ROM (Read Only Memory) in which data are written in its fabrication process, the EPROM (Erasable & Programmable Read Only Memory) in which data are electrically written after the fabrication and erased with the irradiation of ultraviolet rays, and the EEPROM (Electrically Erasable & Programmable Read Only Memory) in which the erasing operation is also electrically carried out. For easy program debugging, the EPROM or EEPROM is widely used.

The flash ROM or a kind of EEPROM is disclosed in U.S. Pat. No. 4,949,309, for example. Here is disclosed a memory array of the so-called "NOR type", in which each of memory cells is comprised of a single MISFET and in which the memory cells are arranged at the intersections of word lines and data lines. Moreover, the write/erase of this kind of flash memory is disclosed on pp. 111 to 114 of 1990 IEDM (International Electron Devices Meeting) Tech. Dig., 1990.

In order to reduce the size of the memory array, on the other hand, there has been developed the so-called "contactless array" in which the proprietary source lines and data lines are not provided unlike the NOR type but in which common source lines and data lines are formed of buried semiconductor regions so that they may be shared between adjacent memory cells. The nonvolatile memory device having such contact array is disclosed, for example, on pp. 311 to 314 of 1991 IEDM (International Electron Devices Meeting) Tech. Dig., 1991 (as will be called as the first reference of the prior art).

In U.S. Pat. No. 4,887,238 (as will be called the second reference of the prior art), there is disclosed the EPROM which is given the split gate structure by interposing both MOSFETs (Metal-Oxide-Semiconductor FETs) comprised of control gates and nonvolatile memory elements comprised of floating gates and control gates between data lines formed of a buried layer.

On pp. 432 to 435 of IEEE, IEDM 88, 1988 (as will be called the third reference of the prior art), there is disclosed an EPROM which is made asymmetric by forming an N$^-$-type layer in one of data lines of a buried N$^+$-type layer so that the writing operation and the erasing operation may be carried out in opposite biases.

SUMMARY OF THE INVENTION

In the aforementioned first to third references, the writing operation is carried out by injecting into the floating gates the hot electrons which are produced when the channel current is fed. This makes it necessary to apply a voltage as high as about 8 V to the drains of the nonvolatile memory elements and to feed a channel current of about several hundreds μA to 1 mA at this time. As a result, it becomes difficult to lower the writing voltage, and it is extremely difficult to generate the aforementioned writing high voltage because of the raised voltage which is generated by internal circuits so as to feed the aforementioned great channel current. Thus, a writing high voltage source is required at the outside. Moreover, the data lines are formed of a diffusion layer and given a parasitic resistance as high as several tens to one hundred Ω. Depending upon the positions of connection with the data lines, the write voltage to be applied to the drains of the nonvolatile memory elements become different to raise a problem that a stable writing operation cannot be achieved.

An object of the present invention is to provide a nonvolatile memory device which has its memory size substantially reduced to realize a low-voltage operation and a low-current operation substantially, and a process for fabricating the nonvolatile memory device.

Another object of the present invention is to provide a nonvolatile memory device which can realize a low-voltage operation and a low-current operation substantially.

The foregoing and other objects and novel features of the present invention will become apparent from the following description to be made with reference to the accompanying drawings.

The summary of a representative of the invention to be disclosed herein will be briefly described in the following. A semiconductor substrate of a first conductivity type has formed on its main surface a floating gate through a first gate insulating film and further has formed over the floating gate a control gate through a second gate insulating film. In one of a source and drain which are of a second conductivity type and which form a paired source and drain formed in the semiconductor substrate beneath the floating gate, a semiconductor region of the second conductivity type having a lower impurity concentration is formed in a portion overlapping, with respect to a plan view, the floating gate. A nonvolatile memory device thus constructed has its writing operation carried out by extracting electrons from the floating gate to the other of the paired source and drain by an F-N (Fowler-Nordheim) tunneling of electrons flowing through the first gate insulating film, its erasing operation carried out by injecting from the paired source and drain or the semiconductor substrate into the floating gate by the F-N tunneling of electrons flowing through the first gate insulating film, and its reading operation carried out by raising the potential of the control gate to sense whether or not the memory current flows from one of the source and drain regions to the other of the source and drain regions.

A semiconductor substrate of a first conductivity type has formed above its main surface a floating gate in a manner in which one end thereof is overlapping, with respect to a plan view, through a first gate insulating film, one of source and drain regions which are semiconductor regions of a second conductivity type forming a paired source and drain and has further formed, over the floating gate and over the semiconductor substrate between the other end of the floating gate and the other one of the source and drain regions, a control gate through a second gate insulating film. A nonvolatile memory device thus constructed has its writing operation carried out by extracting electrons from the floating gate to one of the paired source and drain by the F-N tunneling of electrons flowing through the first gate insulating film, its erasing operation carried out by injecting from the paired source and drain or the semiconductor substrate into the floating gate by the F-N tunneling of electrons, and its reading operation carried out by raising the potential of the control gate to sense whether or not the memory current flows from the other of the source and drain region to one of the source and drain region.

According to the means described above, one source and drain can be shared as the data lines or source lines between memory cells adjacent to each other in a word line direction so that the memory cells can be substantially small-sized. The writing operation and the erasing operation can be carried out by the tunnel current so that their necessary high voltages can be generated by the internal circuit.

BRIEF DESCRIPTION OF THE DRAWINGS

FIGS. 22A and 22B are circuit diagrams showing one embodiment of internal voltage generators;

FIGS. 34A to 34D are sections showing a portion of the structure of one embodiment for explaining a process for fabricating a nonvolatile memory device according to the present invention;

FIGS. 57A and 57B are sections showing the element structures of the remaining portions of FIG. 55;

FIGS. 58A to 58C and FIG. 59 are sections showing fabrication steps of the portions for explaining the process for fabricating the nonvolatile memory device, as has been described with reference to FIGS. 54 to 57.

DESCRIPTION OF THE PREFERRED EMBODIMENTS

Figure 1:
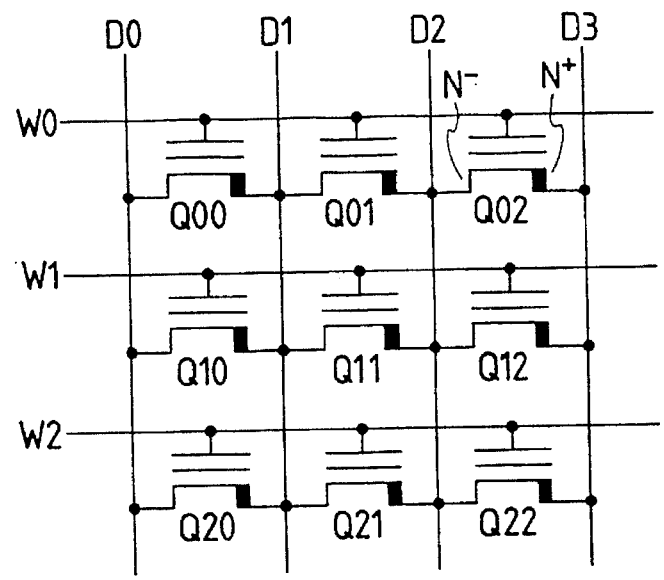
FIG. 1 is a circuit diagram showing one embodiment of a nonvolatile memory device according to the present invention.

FIG. 1 is a circuit diagram showing a memory array portion of one embodiment of the nonvolatile memory device according to the present invention. FIG. 1 shows word lines W0 to W2, data lines D0 to D3 and memory cells Q00 to Q22 representatively.

In the memory cell, as exemplified by Q02, one of the source and drain thereof, as indicated by a thick line, is made of a buried $N^+$-type layer formed as a diffusion layer in a semiconductor substrate and has a portion overlapping a floating gate formed on the semiconductor substrate through a first gate insulating film. On the other hand, the other of the source and drain thereof, as indicated by a thin line, is made of a buried $N^-$-type layer formed as a diffusion layer in the semiconductor substrate and has a portion overlapping the floating gate through the first gate insulating film.

A detailed description will now be made of the structure of memory cell Q01. The source and drain to be connected with the data line D2 is formed of the buried $N^+$-type layer, as described above. In the adjacent memory cell Q02 to be connected with the same data line D2, the source and drain are formed of the $N^-$-type layer, as described above. In one data line D2, therefore, the buried layer $N^+$-type is extended in a longitudinal direction, as shown, and the $N^-$-type layer is juxtaposed to the former at the righthand end. In short, the data line D2 is formed integrally with the buried $N^-$-type and $N^+$-type layers and extended in the longitudinal direction. These arrangement will become apparent from the following layout diagrams and structural sections.

The word lines W0 to W2 are so transversely extended as to intersect the aforementioned data lines D0 to D3, with respect to a top plan view, as shown. The word line W0 is connected with the control gates of the memory cells Q00 to Q02 arranged on a common row. As a matter of fact, the control gate is formed on the floating gate through a second gate insulating film, as will be described later, to integrate the control gates and the word lines.

In the structure of the memory array thus made, the data line D1 is commonly used as the source line for the memory cells Q00 to Q20 arranged at the lefthand side and as the drain line for the memory cells Q01 to Q21 arranged at the righthand side. Likewise, the data line D2 is commonly used as the source line for the memory cells Q01 to Q21 arranged at the lefthand side and as the drain line for the memory cells Q02 to Q22 arranged at the righthand side. Thus, except the data lines D0 and D3 at the two ends of the memory array, the data lines D1 and D2 arranged between them can be shared as the source and drain of the two memory cells adjacent to each other in the word line direction so that the memory cell size can be substantially reduced.

Figure 2:
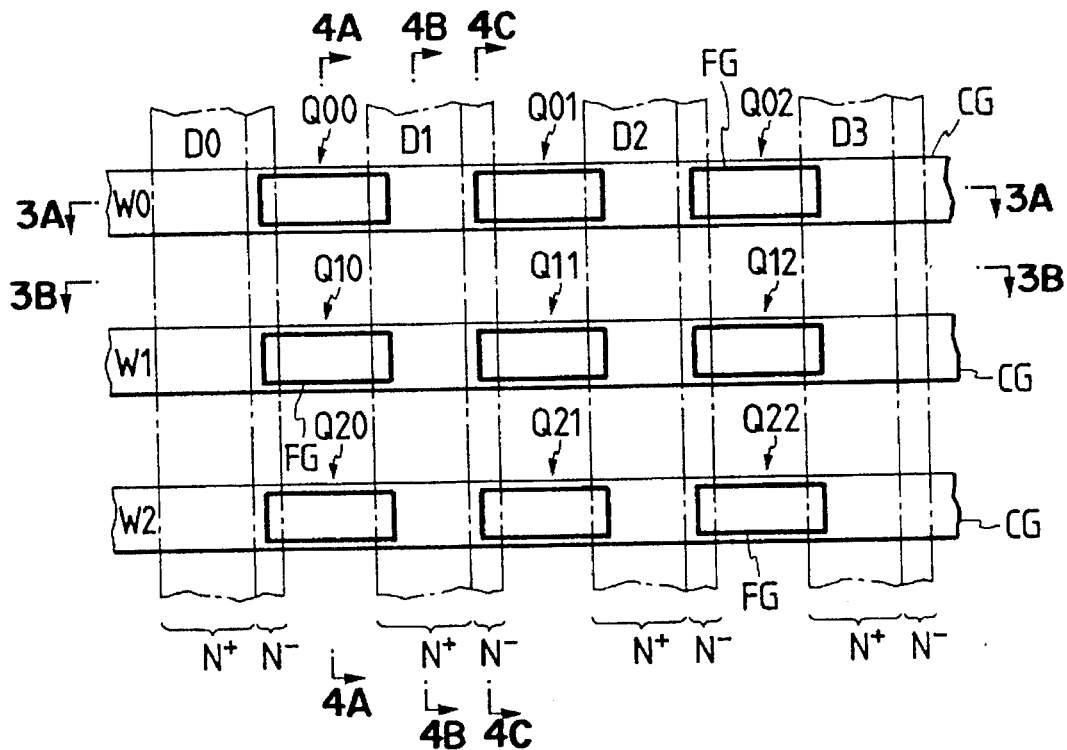
FIG. 2 is a top plan layout diagram showing one embodiment of a memory array portion of FIG. 1.

FIG. 2 is a top plan layout showing one embodiment of the aforementioned memory array portion. As shown, there are transversely extended the word lines W0 to W2 which are formed integrally with the control gates, as indicated by thin lines. On the other hand, the data lines D0 to D3, as indicated by single-dotted lines, are so longitudinally extended as to intersect the word lines. As to the data line D0, the buried $N^-$-type layers having a relatively small width are arranged at the righthand side of the buried $N^+$-type having a relatively large width. This arrangement likewise applies to the other data lines D1 to D3.

Between the aforementioned two data lines D0 and D1, there are disposed floating gates, as indicated by solid lines. These floating gates are formed to overlap the data lines D0 and D1. At this time, the floating gates have their lefthand ends overlapping the buried N⁻-type layer forming the data line D0 and their righthand ends overlapping the buried N⁺-type layer forming the data line D1, with respect to a top plan view of the layout.

Figure 3A:
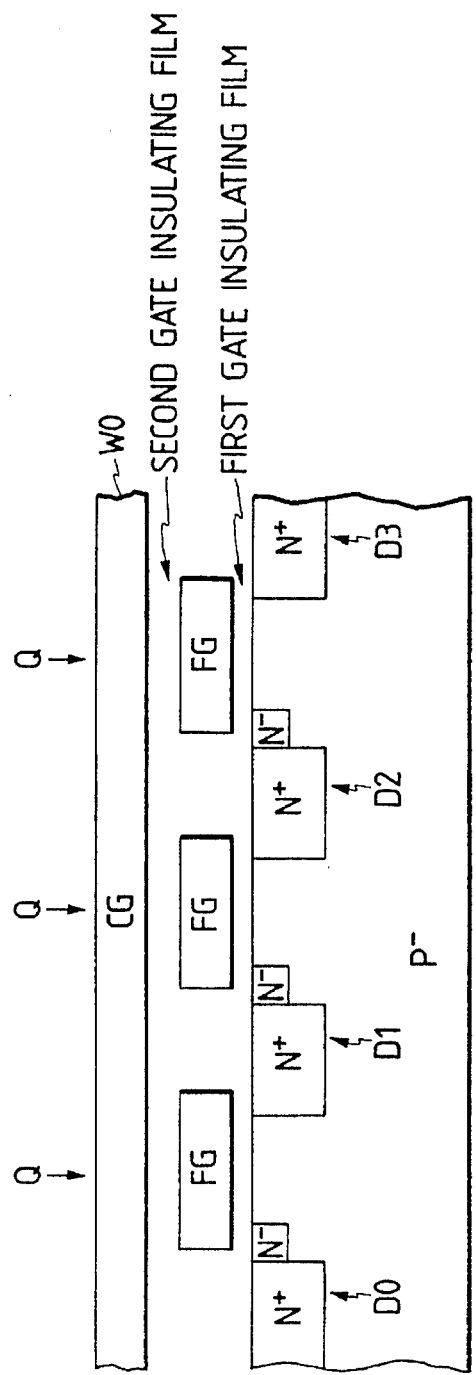
FIGS. 3A and 3B are sections showing partially schematic structures and taken along lines 3A—3A and 3B—3B of the layout of FIG. 2, respectively.
Figure 3B:
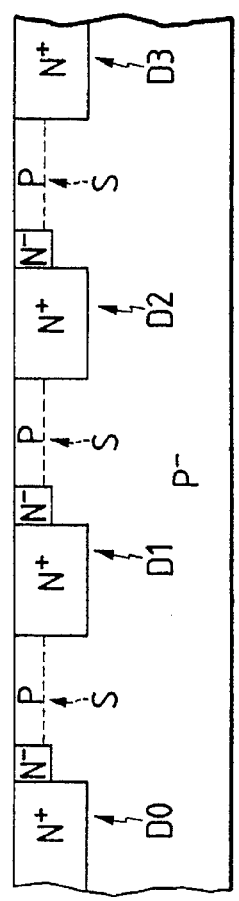

FIG. 3A is a section showing a schematic structure and taken in the direction of the arrows in line 3A—3A of FIG. 2, and FIG. 3B is a section showing a schematic structure and taken in the direction of the arrows in line 3B—3B of FIG. 2. In FIG. 3B, showing a section taken along the word lines, the data lines D0 to D3 are made so asymmetric that the buried N⁻-type layers are formed at the righthand side of the buried N⁺-type layers. The substrate surface is formed between the N⁻-type layers and the N⁺-type layers with floating gates FG through a first gate insulating film having a small thickness and forming a tunnel insulating film. Each of these floating gates FG has its two ends overlapping, with respect to a plan view of the substrate surface, the N⁻-type layer and the N⁺-type layer through the aforementioned first gate insulating film. The word line W0 formed integrally with a control gate CG is formed over the floating gates FG through a second gate insulating film.

FIG. 3B is a section showing a schematic structure of such a portion between the two word lines as is formed with no memory cell. Although omitted from FIG. 2, the portion formed with no element, as shown in FIG. 3B, is formed with P-type channel stopper regions S for preventing any leakage current from flowing between the adjacent memory cells.

Figure 4A:
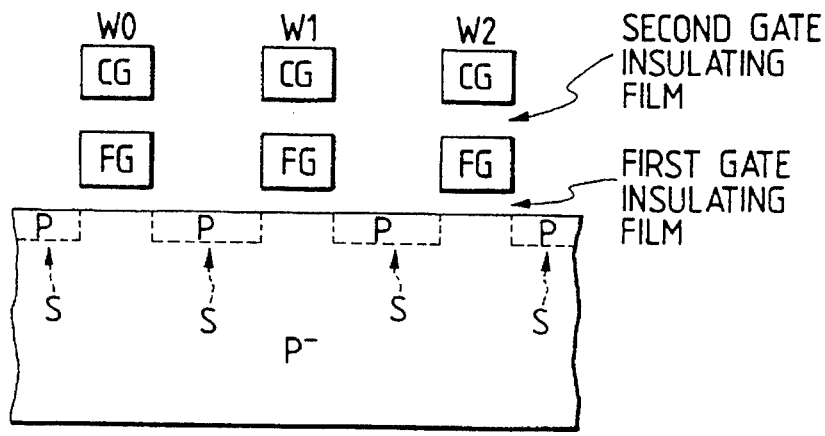
FIGS. 4A, 4B and 4C are sections showing partially schematic structures and taken along lines 4A—4A, 4B—4B and 4C—4C of the layout of FIG. 2, respectively.
Figure 4B:
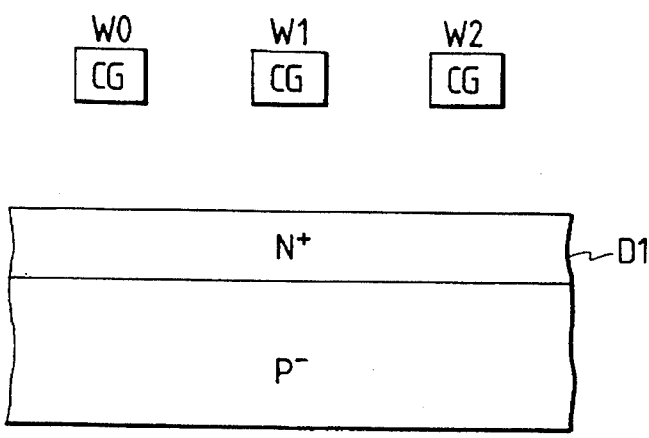

FIG. 4A is a section showing a schematic structure and taken in the direction of the arrows in line 4A—4A of FIG. 2; FIG. 4B is a section showing a schematic structure and taken in the direction of the arrows in line 4B—4B of FIG. 2; and FIG. 4C is a section showing a schematic structure and taken in the direction of the arrows in line 4C—4C of FIG. 2.

In FIG. 4A, presenting a section showing a schematic structure between the adjacent data lines, there are shown the relations among the word lines W0 to W3 (or the control gates CG), the second gate insulating film, the floating gates FG, the first gate insulating film, the P-type channel stopper regions S and a substrate P⁻.

In FIG. 4B, presenting a section showing a schematic structure along the data line, there are shown the relation among the word lines W0 to W3 (or the control gates CG), the buried N⁺-type layer forming the data line D1, and the substrate P⁻.

Figure 4C:
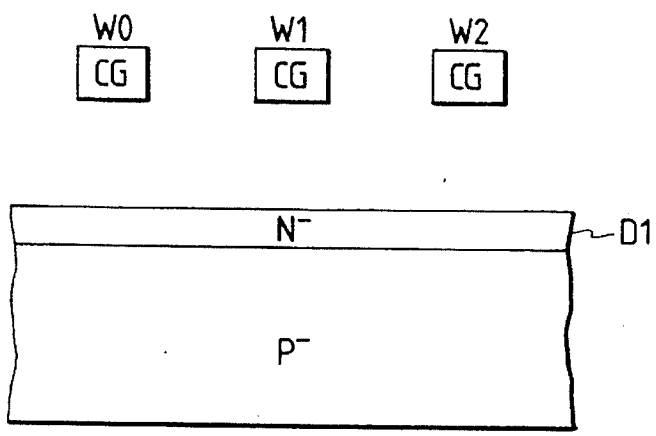

In FIG. 4C, presenting a section showing a schematic structure along the data line, there are shown the relations among the word lines W0 to W3 (or the control gates CG), the buried N⁻-type layer forming the data line D1, and the substrate P⁻.

Figure 5:
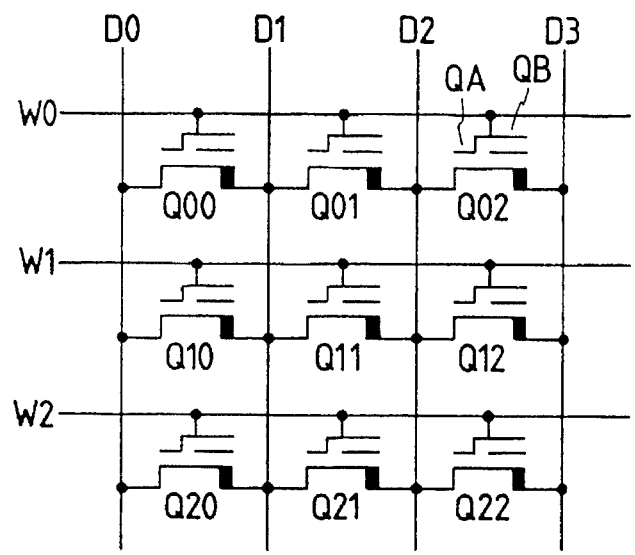
FIG. 5 is a circuit diagram showing a memory array portion of another embodiment of the nonvolatile memory device according to the present invention.

FIG. 5 is a circuit diagram showing a memory array portion of another embodiment of the nonvolatile memory device according to the present invention. FIG. 5 shows word lines W0 to W2, data lines D0 to D3 and memory cells Q00 to Q22 representatively.

The memory cell, as exemplified by Q02, is given the so-called "split gate structure", in which an element QB having a floating gate and a control gate and an element QA having a control gate only are connected in series. The element QB is formed with the floating gate through the first gate insulating film and the control gate over the floating gate through the second gate insulating film. The element QA is formed with the control gate through the third gate insulating film.

The element QB in the memory cell Q01 is arranged at the side of the data line D2, and the element QA in the adjacent memory cell Q02 to be connected with the same data line D2 is arranged at the side of the data line D2. The word lines W0 to W2 are so transversely extended as to intersect the data lines D0 to D3, as shown. The word line W0 is connected with the control gates of the memory cells Q00 to Q02 which are arranged on the common row. As a matter of fact, the control gates and the word line are integrally formed, as will be described hereinafter.

In the aforementioned structure of the memory array, the data line D1 is used as the common source line of the memory cells Q00 to Q20 arranged at the lefthand side thereof and as the common drain line of the memory cells Q01 to Q21 arranged at the righthand side thereof. Likewise, the data line D2 is used as the common source line of the memory cells Q01 to Q21 arranged at the lefthand side thereof and as the common drain line of the memory cells Q02 to Q22 arranged at the righthand side thereof. Thus, the intermediate data lines D1 and D2 excepting the data lines D0 and D3 at the two ends of the memory array can be commonly used as the source and drain of the two memory cells adjacent to each other in the word line direction, to reduce the memory cell size substantially.

Figure 6:
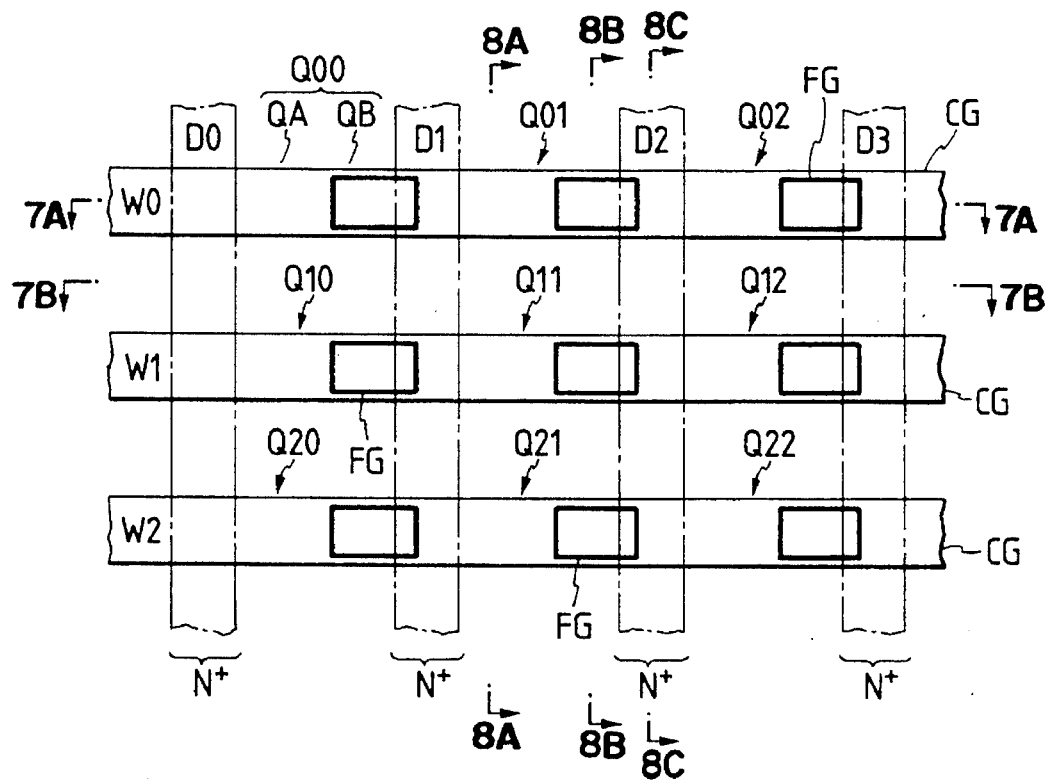
FIG. 6 is a top plan layout diagram showing one embodiment of the memory array portion of FIG. 5.

FIG. 6 is a top plan layout showing one embodiment of the aforementioned memory array portion. As shown, there are transversely extended the word lines W0 to W2 which are formed integrally with the control gates, as indicated by thin lines. On the other hand, the data lines D0 to D3, as indicated by single-dotted lines, are so longitudinally extended as to intersect the word lines.

Between the aforementioned two data lines D0 and D1, there are interposed the floating gates, as indicated by thick solid lines. These floating gates have their righthand ends overlapping the data line D1. At this time, the lefthand ends of the floating gates are spaced, with respect to a plan view, at predetermined gaps from the data line D0. The elements QA having the control gates only are formed in those gaps.

Figure 7A:
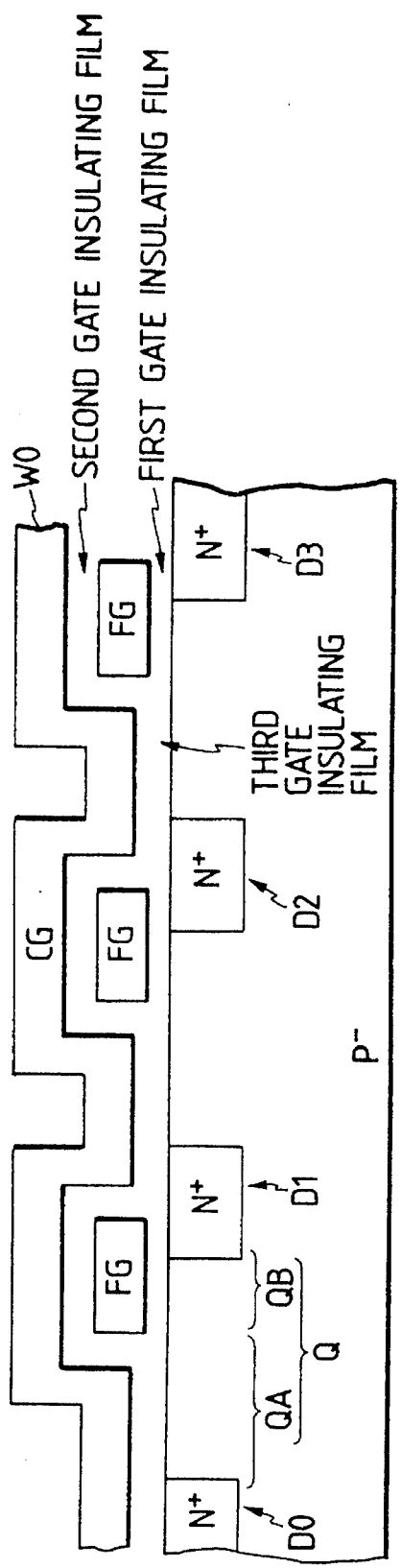
FIGS. 7A and 7B are sections showing partially schematic structures and taken along lines 7A—7A and 7B—7B of the layout of FIG. 6, respectively.
Figure 7B:
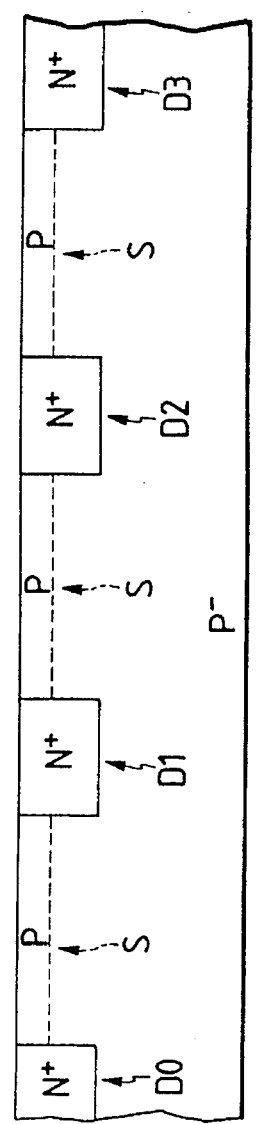

FIG. 7A is a section showing a schematic structure and taken in the direction of the arrows in line 7A—7A of FIG. 6, and FIG. 7B is a section showing a schematic structure and taken in the direction of the arrows in line 7B—7B of FIG. 6. In FIG. 7A presenting a section taken along the word lines, the data lines D0 to D3 are formed of the buried N⁺-type layer. The floating gates FG are formed to have their righthand ends overlapping the righthand N⁺-type layers of the paired righthand and lefthand data lines through the first gate insulating film forming the tunnel insulating film. These floating gates FG have their lefthand ends terminating in the intermediate portions of the aforementioned paired data lines. The first gate insulating film is exemplified by a tunnel insulating film as thick as about 8 nm.

Over the floating gates FG, there is formed through the second gate insulating film the control gate CG which is formed integrally with the word line W0. This control gate CG is formed formed on the substrate surface between the lefthand end of the floating gate FG and the lefthand data line through the third gate insulating film. The second gate insulating film and third gate insulating film are formed to have a thickness of about 20 nm like that of the gate insulating film of the ordinary MOSFET. In other words, the third gate insulating film is formed to have a larger thickness than that of the first gate insulating film.

FIG. 7B is a section showing a schematic structure of a portion in which no memory cell is formed between the two word lines. Although not shown in FIG. 2, the portion having no element, as shown in FIG. 7B, is formed with the P-type channel stopper region S to prevent any leakage current from flowing between the two adjacent memory cells.

Figure 8A:
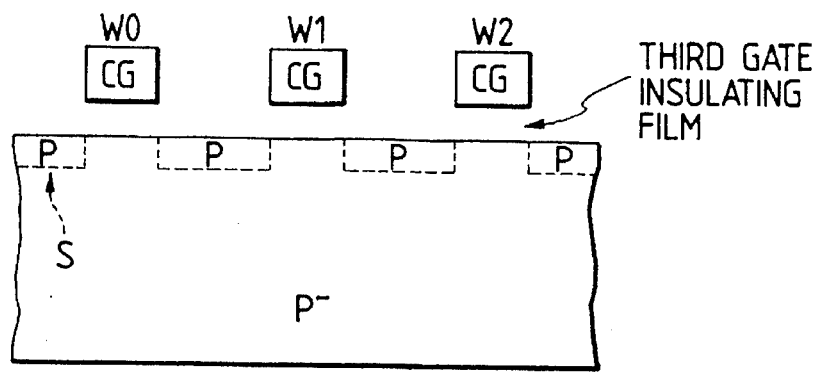
FIGS. 8A, 8B and 8C are sections showing partially schematic structures and taken along lines 8A—8A, B—8B and 8C—8C of the layout of FIG. 6, respectively.
Figure 8B:
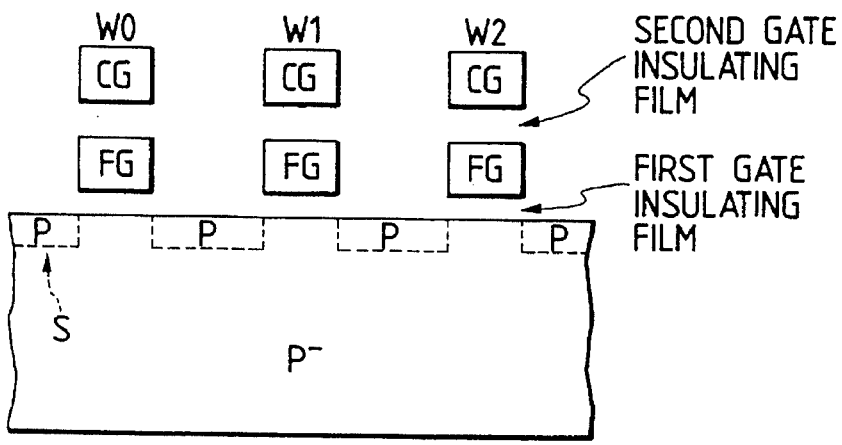

FIG. 8A is a section showing a schematic structure and taken in the direction of the arrows in line 8A—8A of FIG. 6; FIG. 8B is a section showing a schematic structure and taken in the direction of the arrows in line 8B—8B of FIG. 6; and FIG. 8C is a section showing a schematic structure and taken in the direction of the arrows in line 8C—8C of FIG. 6.

In FIG. 8A, presenting a section showing a schematic structure and taken along the adjacent data lines, there are shown the relations among the word lines W0 to W3 (or the control gates CG), the third gate insulating film, the P-type channel stopper regions S and the substrate $P^-$.

In FIG. 8B presenting a section showing a schematic section and taken along the floating gates arranged in the longitudinal direction, there are shown the relations among the word lines W0 to W3 (or the control gates CG), the second gate insulating film, the floating gates FG, the first gate insulating film, the P-type channel stoppers S and the substrate $P^-$.

Figure 8C:
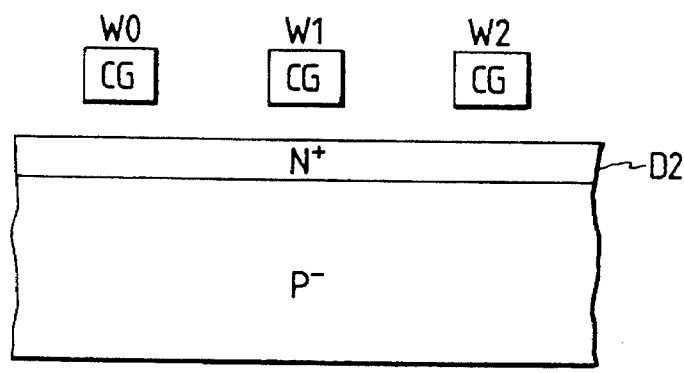

In FIG. 8C presenting a section showing a schematic structure and taken along the data lines, there are shown the relations among the word lines W0 to W3 (or the control gates CG), the buried $N^+$-type layer forming the data line D2, and the substrate $P^-$.

Figure 9:
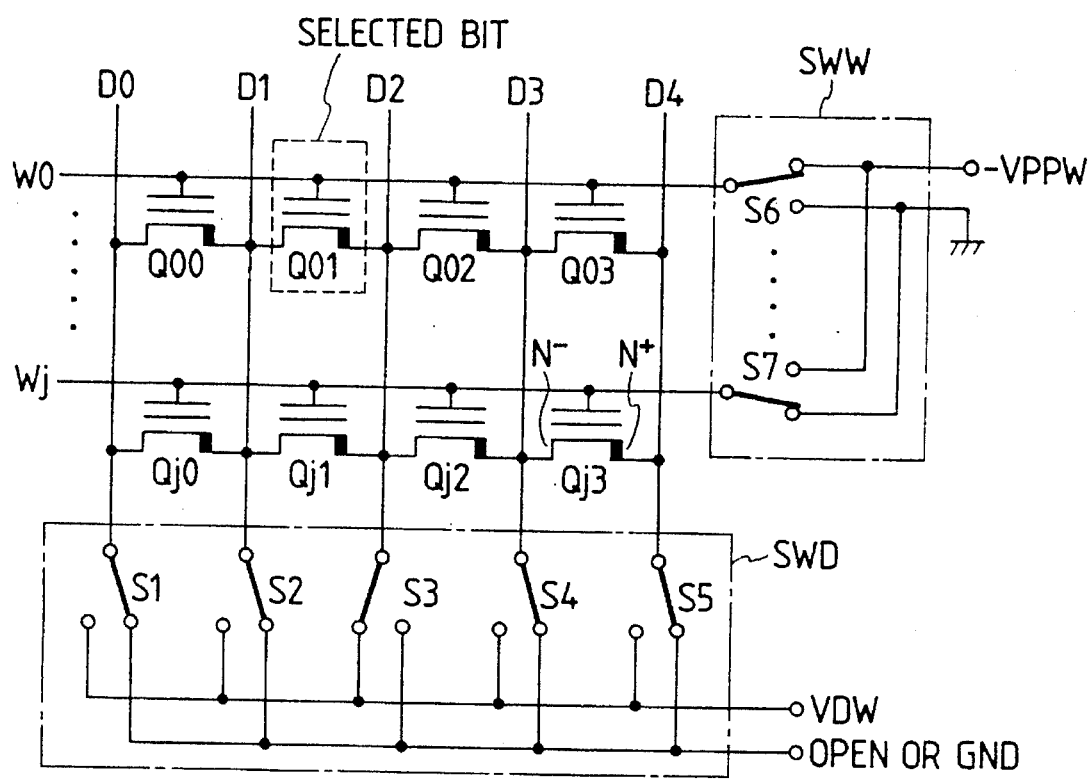
FIG. 9 is a circuit diagram for explaining one embodiment of the writing operation of the memory array corresponding to the embodiment of FIG. 1.

FIG. 9 is a circuit diagram for explaining an embodiment of the writing operation of the memory array corresponding to the embodiment of FIG. 1. In this embodiment, the writing operation will be termed to extract electrons from the floating gate FG of the memory to the source line by the F-N (i.e., Fowler-Nordheim) tunneling of electrons. In FIG. 9, the selectors of the memory array are shown in the mode of switches. Specifically, the word lines are selected by a word line selecting switch SWW, and the data lines and the source lines are selected by a data line selecting switch SWD.

In case the writing operation is carried out for the memory cell Q01 as the selected bit by selecting the word line W0 from the word lines W0 to Wj, as exemplified, and the data lines D1 and D2 from the data lines D1 to D4, as exemplified, the selected word line W0 is supplied with a negative high voltage such as –VPPW by a switch S6 of the word line switch SWW. The voltage –VPPW is set at –7 V, for example. The unselected word lines such as the word line Wj are supplied with the ground potential (at 0 V) of the circuit by a switch 7 and the like.

The data line D1 is supplied with the floating (OPEN) state or the ground potential GND of the circuit by a switch S2 of the data line switch SWD. On the other hand, the data line D2 is supplied with a write voltage VDW of about 5 V corresponding to the supply voltage VCC by a switch S3. The remaining data lines D0, D3 and D4 or the unselected ones are supplied like above with the floating state or the ground potential of the circuit by switches S1, S3 and S4.

In this state, the potential of the floating gate of the memory cell Q01 is determined by the capacitance ratio among a first capacitance C1 of the $P^-$-type semiconductor substrate/the first gate insulating film/the floating gate, a second capacitance C2 of the floating gate/the second gate insulating film/the control gate and a third capacitance C3 of the buried $N^+$-type layer/the first gate insulating film/the floating gate, the potential –VPPW (at –7 V) of the control gate, the potential VDW (at 5 V) of the potential of the data line D2 and the substrate potential of 0 V, so that it takes a potential VF lower than the aforementioned voltage VDW.

Then, the voltage of VDW–VF is applied to the first gate insulating film so that the F-N tunneling of electrons occurs to release the electrons in the floating gate into the buried $N^+$-type layer forming the data line D2. As a result, the memory cell Q01 having a threshold voltage as high as about 5 V in the erased state is dropped to about 1 V as a result of the release of electrons.

In the unselected memory cell Q02 sharing the aforementioned buried $N^+$-type layer, what overlaps the floating gate through the first gate insulating film is not the aforementioned $N^+$-type layer having a higher impurity concentration but the $N^-$-type layer having a lower impurity concentration. In this lightly doped $N^-$-type layer, a depletion layer or a P-type inversion layer is formed in the surface of the portion overlapping the floating gate. When such depletion layer is formed in the surface of the $N^-$-type layer, the voltage VDW–VF' to be applied between the $N^-$-type layer and the floating gate is partially used for forming the depletion layer so that the voltage to be applied to the first gate insulating film is accordingly reduced to inhibit the aforementioned F-N tunneling of electrons.

In other words, the aforementioned voltage VDW–VF' is applied by the depletion layer to the series circuit of a capacitance C4 of the floating gate/the first gate insulating film/the $N^-$-type layer and a capacitance C5 of the depletion layer. As a result, the voltage to be applied to the first gate insulating film is divided to lower levels by the aforementioned capacitances C4 and C5 so that the F-N tunneling of electrons will not occur, unlike the aforementioned selected bit. On the other hand, when the P-type inversion layer is formed in the surface of the $N^-$-type layer, the surface potential drops to the potential of 0 V (GND) of the $P^-$-type semiconductor substrate ($P^-$). As a result, what is applied to the first gate insulating film is the voltage VF' so that the F-N tunneling of electrons will not occur.

Incidentally, the surface of the $N^+$-type layer corresponding to the selected bit Q01 has a high impurity concentration so that the depletion layer is not formed in the portion overlapping the floating gate or could be substantially neglected, if formed. Moreover, since the data line D3 has a potential of 0 V or in the floating state, the potential of the floating gate of the unselected bit Q02 is slightly higher than the potential of the floating gate of the selected bit Q01 and is expressed by VF'.

In the memory cell Q00 or Q03 not sharing the data line D2 supplied with the aforementioned write voltage VDW but connected with the other unselected data line, the first gate insulating film is supplied with only the voltage such as the aforementioned value FG' so that no tunnel current will flow. Thus, the writing operation is carried out only in one Q01 of the memory cells connected with the selected word line W0 but not in the unselected memory cells Q00, Q02 and Q03 including the memory cell Q02 sharing the data line D2. The unselected word lines may be set not to 0 V or the ground potential of the circuit but to the write voltage VDW of 5 V. In the structure thus made, the potential difference between the buried data line D2 to be applied to the write voltage VDW and the unselected word line Wj can be reduced to prevent the electrons from being undesirably released from the floating gate as a result of data line disturbance.

Figure 10:
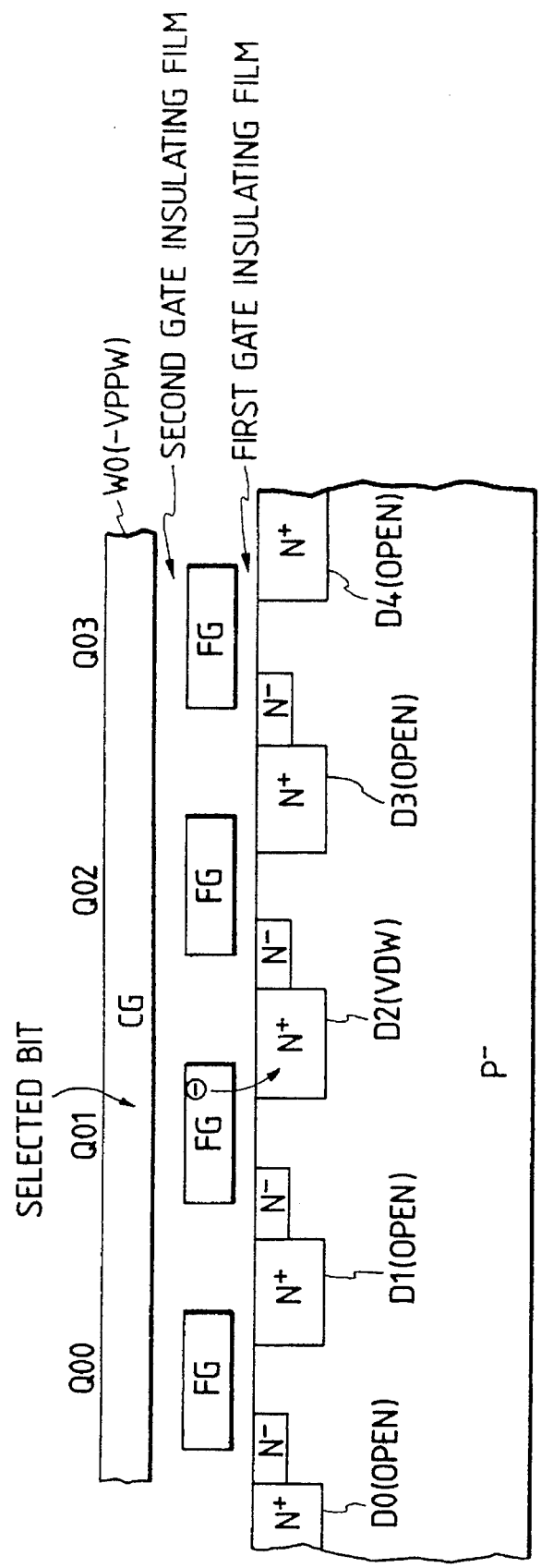
FIG. 10 is a section showing a schematic structure for explaining the writing operation corresponding to FIG. 9.

FIG. 10 is a section showing the schematic element structure in the word line direction for illustrating the aforementioned write mode. In the memory cell Q01, by establishing the aforementioned potential relations, the electrons of the floating gates FG are released into the buried $N^+$-type layer forming the data line D2, as indicated by solid arrows, by the tunneling current through the first gate insulating film.

Figure 11:
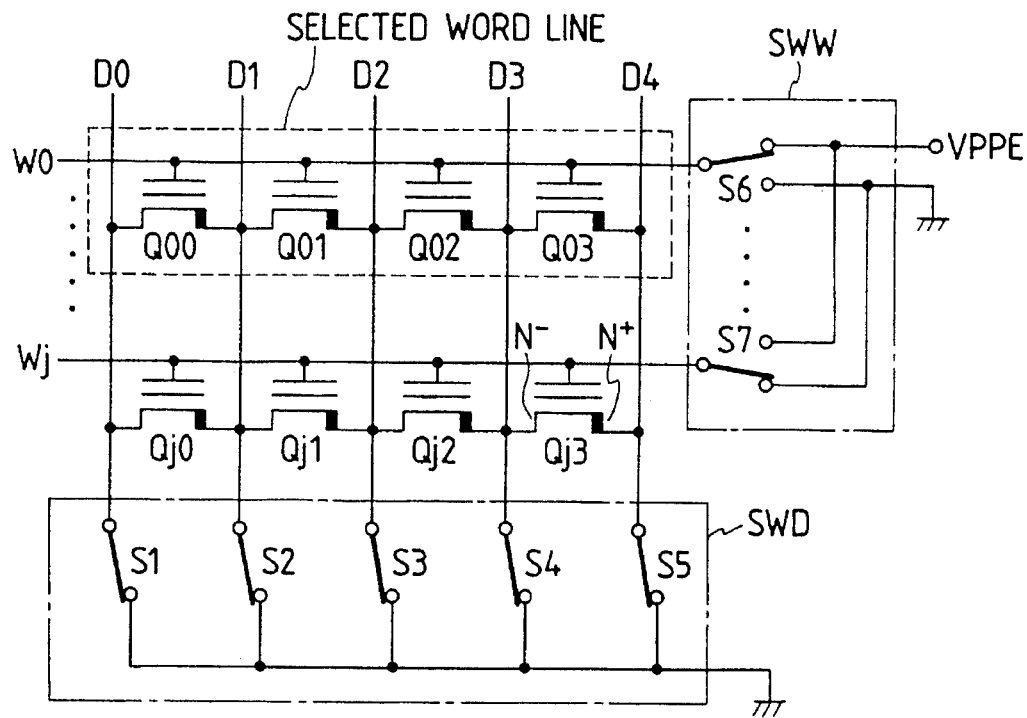
FIG. 11 is a circuit diagram for explaining one embodiment of the erasing operation of the memory array corresponding to the embodiment of FIG. 1.

FIG. 11 is a circuit diagram for explaining one embodiment of the erasing operation of the memory array corresponding to the foregoing embodiment of FIG. 1. In this embodiment, the erasing operation is termed to inject electrons into the floating gate FG of the memory cell by the F-N tunneling of electrons. In FIG. 11, the selectors of the memory array are shown in the shape of switches. Specifically, the word lines are selected by the word line selecting switch SWW, and the data lines and the source lines are selected by the data line selecting switch SWD.

In case the word line W0 is selected from the word lines W0 and Wj, as exemplified, to erase the memory cells connected therewith altogether, the selected word line W0 is supplied with a positive high voltage such as VPPE by the switch S6 of the word line switch SWW. This voltage VPPE is set to a voltage of 12 V, for example. The unselected word line such as the word line Wj is supplied with the ground potential of the circuit by the switch S7 or the like. All the data lines D0 to D4 are supplied with the ground potential of the circuit by the switches S1 to S5 of the data line switch SWD.

In this state, the potential VF of the floating gates FG of the memory cells Q00 to Q03 is set to such a relatively high potential VF as is determined by the capacitance ratio between the parallel capacitance (C1+C3) composed of the first capacitance C1 of the $P^-$-type semiconductor substrate/ the first gate insulating film/the floating gate and the third capacitance C3 of the buried $N^+$-type layer/the first gate insulating film/the floating gate FG and the second capacitance C2 of the floating gate/the second gate insulating film/the control gate, the potential VPPE (at 12 V) of the control gate, the potential of 0 V of the data lines D1 to D4, and the substrate potential of 0 V. That voltage VF is applied to the first gate insulating film so that the electrons are injected into the floating gates from the $N^+$-type layer and the surface inversion layer N of the substrate $P^-$ by the F-N tunneling of electrons through the first gate insulating film. As a result, the memory cells Q00 to Q03 are raised to have a threshold voltage as high as about 5 V.

At this time, the unselected word lines are supplied with the same ground potential as that of the data lines or the substrate and have none of the aforementioned tunneling current so that the memory cells Qj0 to Qj3 are held in their original store mode.

Since the erasing operation is carried out at the unit of a word lines, as described above, the stored data of the memory cells connected with a plurality of word lines or all the word lines may be erased altogether by setting them to the aforementioned erasing high voltage VPPE.

Figure 12:
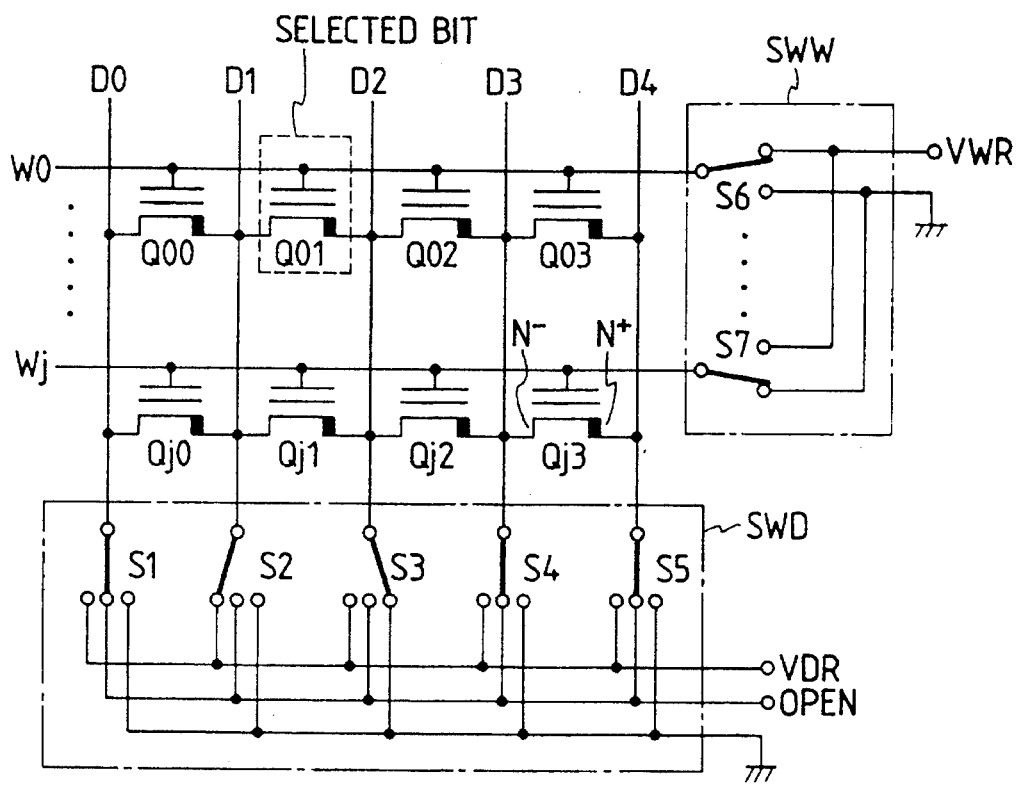
FIG. 12 is a circuit diagram for explaining one embodiment of the reading operation of the memory array corresponding to the embodiment of FIG. 1.

FIG. 12 is a circuit diagram for explaining one embodiment of the reading operation of the memory array corresponding to the aforementioned embodiment of FIG. 1. The selectors of the memory array are shown in the shape of switches in FIG. 12. Specifically, the word lines are selected by the word line selecting switch SWW, and the data lines and the source lines are selected by the data line selecting switch SWD.

In case the memory cell Q01 connected with the word line W0 of the word lines W0 and Wj, as exemplified, is to be read, the data line D1 at the side contacting with the buried $N^-$-type layer of the memory cell Q01 is supplied with a read voltage VDR by the switch S2 of the data line selecting switch SWD. This voltage VDR is set to a relatively low potential such as about 3 V. The potential of the data line D2 at the side contacting with the buried $N^+$-type layer of the memory cell Q01 is supplied with the ground potential of the circuit by the switch S3. The remaining unselected data lines D0, D3 and D4 are brought into the floating state (OPEN) by the switches S1, S4 and S5.

The selected word line W0 is supplied with a select voltage VWR by the switch S6 of the word line selecting switch SWW, and the unselected word line Wj is supplied with the ground potential of the circuit by the switch S7 or the like of the circuit.

If the memory cell Q01 is written in this state, it is turned ON because its threshold voltage is at a low level such as 1 V, so that the memory current flows from the data line D1 to the data line D2. If the memory cell Q01 is not subjected to the writing operation, no memory current will flow because of the high threshold voltage of 5 V. Whether or not this memory current exists is discriminated (determined) by a sense amplifier for feeding the select voltage VDR to the data line D1 and is outputted as an output signal at the low/high levels. The sense amplifier to be used can have a structure similar to that of the sense amplifier used in the EPROM or the like of the prior art.

In the memory cell Q00 sharing the selected data line D1 and the selected word line W0, the data line D0 is in the floating state so that no memory current will flow. Likewise, in the memory cell Q02 sharing the selected data line D2 and the selected word line, the data line D3 is in the floating state so that no memory current will flow. In the memory cell Q03 or the like in which the word line is selected whereas the two data lines are unselected, the two data lines are in the floating state so that no memory current will flow.

In this embodiment, the memory current is established by raising the data line D1 at the side of the $N^-$-type layer of the memory cell Q02 for the reading operation to a high potential to operate it as the drain and by using the $N^+$-type layer side as the source line. Thanks to this structure, a high electric field is not generated in the vicinity of the drain during the reading operation so that hot electrons do not develop. It is, therefore, possible to prevent an error that would undesirably lead to an equivalent erasing operation by injecting the hot electrons into the floating gates when in the reading operation. Thus, the read voltage VDR can be raised to establish a high read current so that the reading operation can be speeded up.

Incidentally, in the unselected memory cell Q00, the heavily doped $N^+$-type layer is in contact with the data line to be supplied with the aforementioned read voltage VDR, but the channel current will not flow because of the floating state of the data line D0; therefore, hot electrons are not produced and erroneous erasure is prevented from occurring.

In order to facilitate understanding of the invention, the word line selecting switch SWW and the data line selecting switch SWD are separated in the foregoing description of the writing operation, the erasing operation and the reading operation. As a matter of fact, however, these operations are carried out for one memory array. Thus, the switches S1 to S5 and S6 and S7 are given the functions to select the voltages corresponding to those three operation modes.

Figure 13:
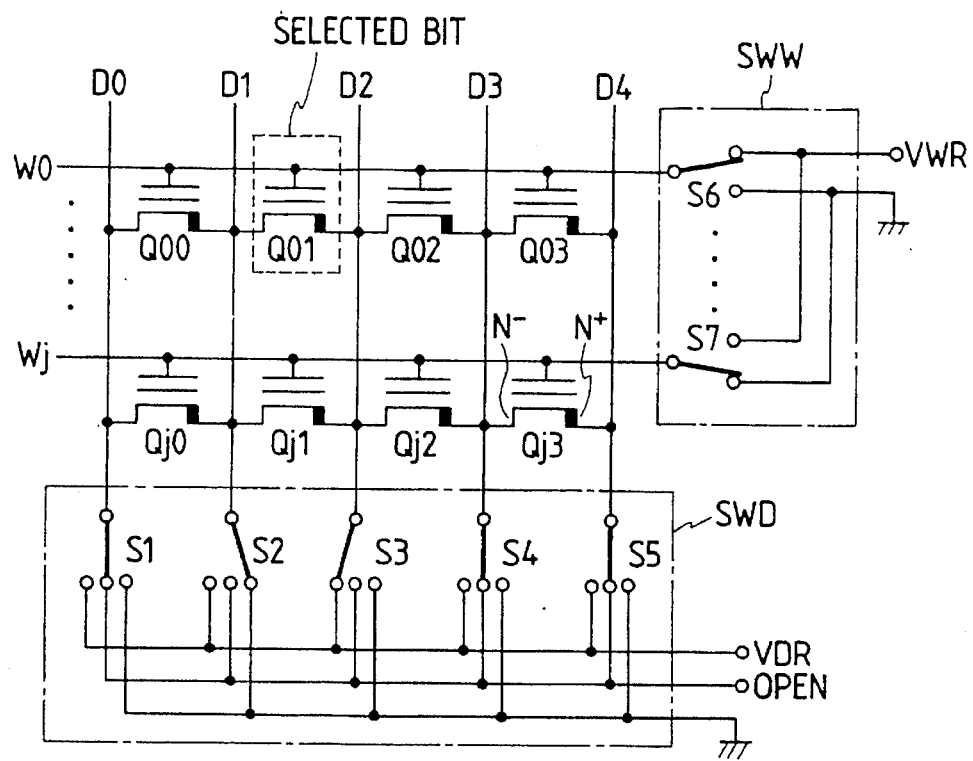
FIG. 13 is a circuit diagram for explaining another embodiment of the reading operation of the memory array corresponding to the embodiment of FIG. 1.

FIG. 13 is a circuit diagram for explaining another embodiment of the reading operation. In FIG. 13, too, the selectors for the memory array are shown in the shape of switches. Specifically, the word lines are selected by the word line selecting switch SWW, and the data lines and the source lines are selected by the data line selecting switch SWD.

In order to simplify the data line selecting switch, that is, to take consistency with the writing operation, the memory cell Q01 is selected in this embodiment by supplying the read voltage VDR to the data line D2 by the switch S3 and by supplying the ground potential of the circuit to the data line D1 by the switch S2. In this structure, the switches S2 and S3 can be controlled as in the writing operation of FIG. 9. Specifically, the write voltage VDW may be supplied for the writing operation by the switch S3 and may be changed into the read voltage VDR for the reading operation.

However, if the memory elements have structures identical to those of the foregoing embodiment of FIG. 3, the hot electrons are produced in the vicinity of the drains when in the reading operation, to cause a problem that the erasing operation is equivalently effected. If these hot electrons are to be eliminated, the read voltage VDR may be dropped to about 1 V. Then, the memory current is reduced to retard the reading speed accordingly. For a high-speed reading operation, therefore, the element structures of the memory cells are slightly modified, as follows.

Figure 14:
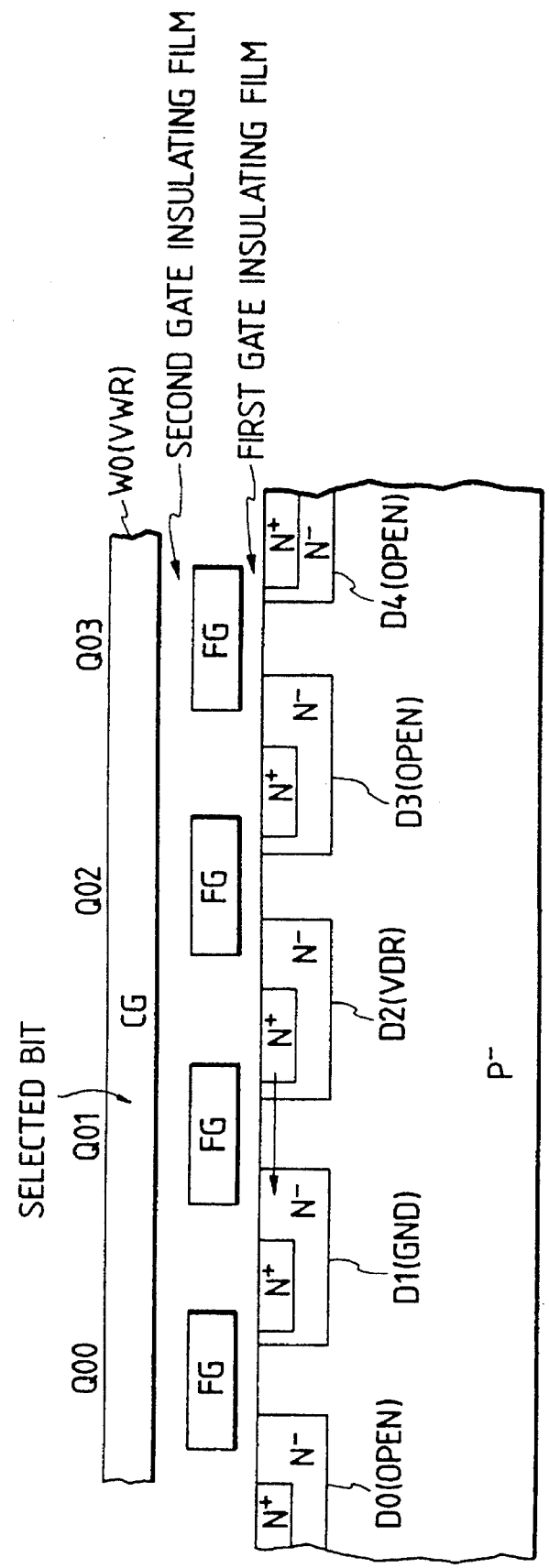
FIG. 14 is a section showing a schematic structure for explaining the reading operation corresponding to FIG. 13.

FIG. 14 is a section showing a schematic structure and taken in the word line direction. In this embodiment, the buried $N^+$-type layer having a high impurity concentration is formed in the buried $N^-$-type layer having a low impurity concentration. Here, the heavily doped buried $N^+$-type layer is formed to overlap the righthand side of the floating gate FG through the first gate insulating film. The lefthand side of the floating gate is formed to overlap only the lightly doped buried $N^-$-type layer through the first gate insulating film.

Thanks to the structure described above, when the memory current is established, as indicated by arrow in FIG. 14, in the reading operation by supplying the read voltage VDR to the data line D2 connected with the memory cell Q01 and the ground potential GND of the circuit to the data line D1, the high electric field does not act to establish no hot electron like before, since the lightly doped $N^-$-type layer exists between the heavily doped buried $N^+$-type layer supplied with the aforementioned read voltage VDR and the channel region. As a result, it is possible to prevent the erroneous erasure in the reading operation.

The writing operation is carried out like before since the heavily doped buried $N^+$-type layer and the floating gate FG overlap each other through the first gate insulating film. Moreover, the memory cell Q02 sharing the data line D2 is formed with the aforementioned lightly doped buried $N^-$-type layer so that the F-N tunneling of electrons does not occur either before. The erasing operation can be carried out like before.

Figure 15:
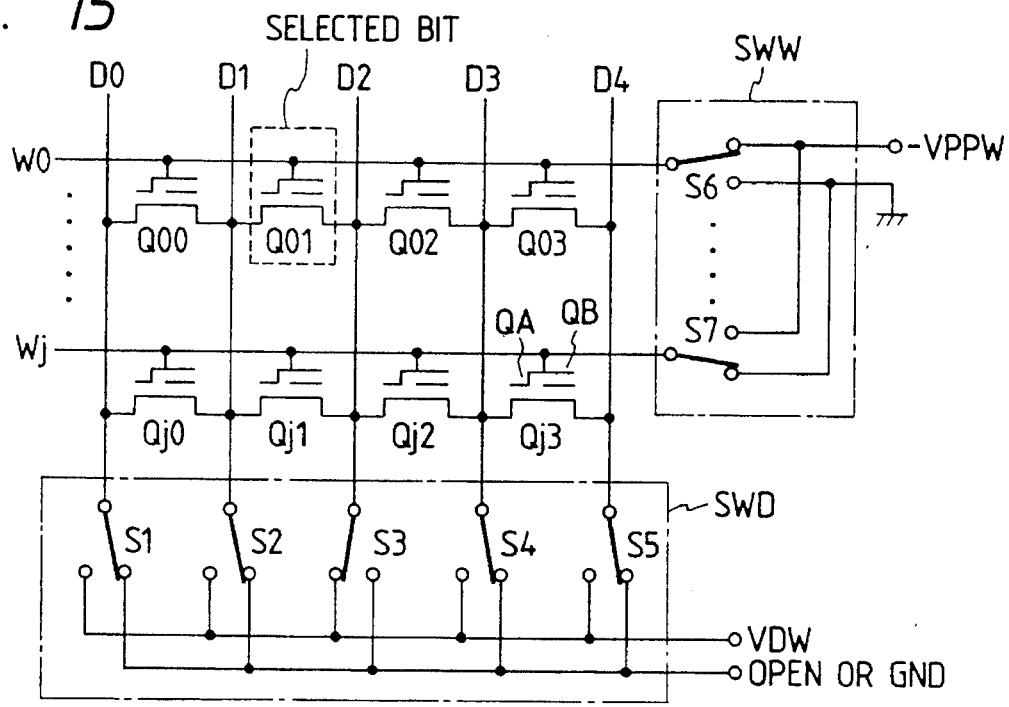
FIG. 15 is a circuit diagram for explaining one embodiment of the writing operation corresponding to the embodiment of FIG. 5.
Figure 16:
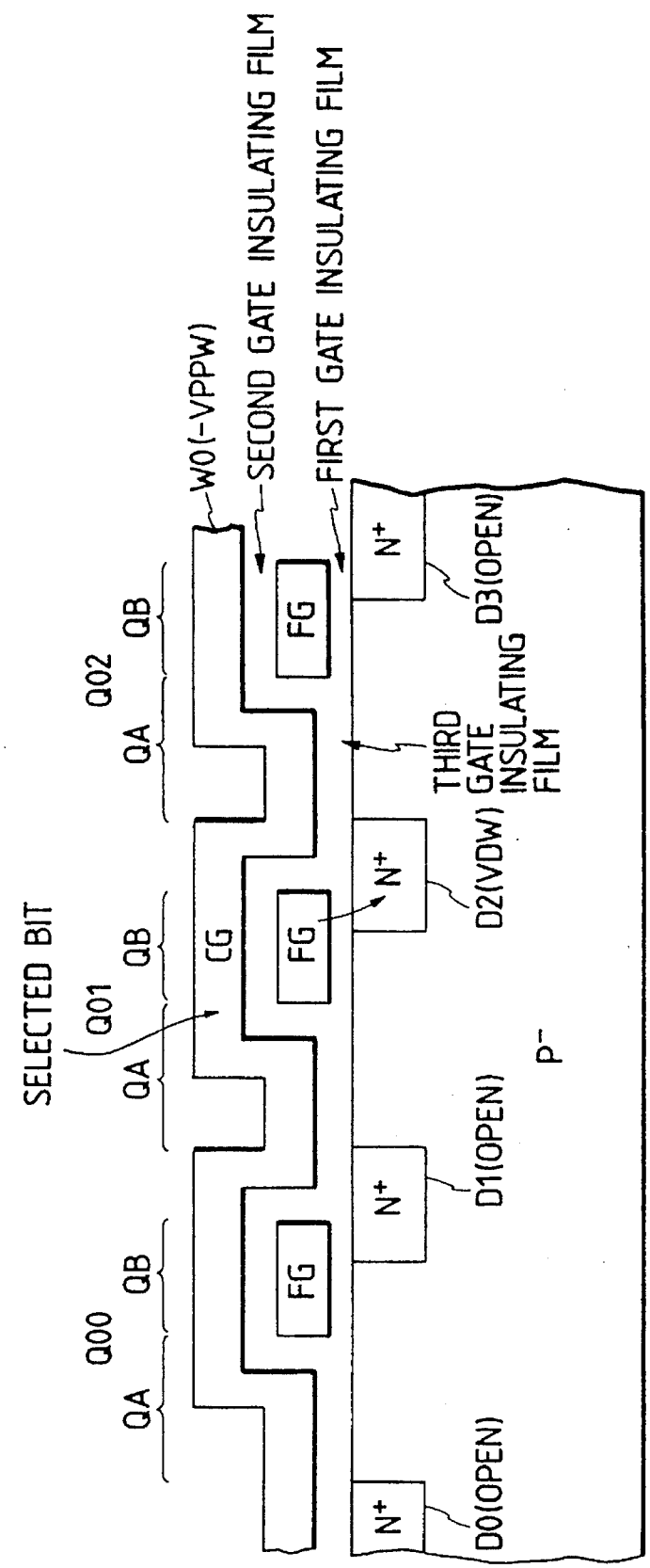
FIG. 16 is a section showing a schematic structure for explaining the writing operation corresponding to FIG. 15.

FIG. 15 is a circuit diagram for explaining one embodiment of the writing operation of the memory array corresponding to the aforementioned embodiment of FIG. 5, and FIG. 16 is a section showing a schematic structure of the same. In this embodiment, too, the writing operation is to extract the electrons from the floating gates FG of the memory cell to the source lines by the F-N tunneling of electrons. In FIG. 15, the selectors of the memory array are shown in the form of switches. Specifically, the word lines are selected by the word line selecting switch SWW, and the data lines and the source lines are selected by the data line selecting switch SWD.

In case the writing operation is to be carried out for the memory cell Q01 as the selected bit by selecting the word line W0 from the word lines W0 and Wj, as exemplified, and the data lines D1 and D2 from the data lines D0 to D4, as exemplified, the selected word line W0 is supplied like the foregoing embodiment of FIG. 9 with a negative high voltage such as −VPPW by the switch S6 of the word line switch SWW. This voltage −VPPE is set to a voltage such as −7 V. The unselected word line such as the word line Wj is supplied with the ground potential of the circuit by the switch S7 or the like.

Like the embodiment of FIG. 9, the data line D1 is supplied with the floating (OPEN) state or the circuit ground potential GND by the switch S2 of the data line switch SWD. On the contrary, the data line D2 is supplied with the write voltage VDW of about 5 V corresponding to the power source voltage VCC by the switch S3. The other data lines D0, D3, D4 and the like left unselected are supplied like above with the floating state or the circuit ground potential by the switches S1, S3 and S4.

In this state, the potential of the floating gate of the memory cell Q01 is determined to the potential VF lower than "the aforementioned voltage VDW by the capacitance ratio among the first capacitance C1 of the $P^-$-type semiconductor substrate/the first gate insulating film/the floating gate FG, the second capacitance C2 of the floating gate/the second gate insulating film/the control and the third capacitance C3 of the buried $N^+$-type layer/the first gate insulating film/the floating gate, the potential −VPPW (at −7 V) of the control gate, the potential VDW (at 5 V) of the data line D2, and the substrate potential of 0 V. Then, the voltage of VDW−VF is applied to the first gate insulating film so that the F-N tunneling of electrons occurs to release the electrons in the floating gates to the buried $N^+$-type layer forming the data line D2. As a result, the high threshold voltage of about 5 V of the memory cell Q01 in the erasing state is dropped to about 1 V by the aforementioned electron release. Even if a negative threshold voltage is given by the excessive writing operation, there arises no problem because the current is caused to flow only through the memory cell selected by the element QA.

In the unselected memory cell Q02 sharing the buried $N^+$-type layer, the element QA formed of the third gate insulating film is interposed between the element QB having the floating gate and the data line D1. The element QA has its gate electrode supplied with the negative voltage of −VPPW so that it is turned OFF. As a result, the element QB does not have its floating gate supplied with the write voltage VDW of the data lines D1 so that only the voltage of VF' is applied to the first gate insulating film to establish none of the F-N tunneling of currents.

Incidentally, the surface of the $N^+$-type layer corresponding to the selected bit Q01 has a high impurity concentration so that no depletion layer is formed in the portion overlapping the floating gate. This depletion layer could be substantially neglected even if established.

On the other hand, the potential of the floating gate of the unselected bit Q02 is slightly higher than the potential VF of the floating gate of the selected bit Q01 so that it is expressed by VF', because the data line D3 has a potential of 0 V or in the floating state.

In the memory cell Q00 or Q03 not sharing the data line D2 supplied with the aforementioned the write voltage VDW but connected with the other unselected data line, no tunnel current will flow because what is applied to the first gate insulating film is the aforementioned voltage VF'. Thus, the writing operation is carried out only in one Q01 of the memory cells connected with the selected word line W0 but not in the unselected memory cells Q00, Q02 and Q03 including the memory cell Q02 sharing the data line D2.

Figure 17:
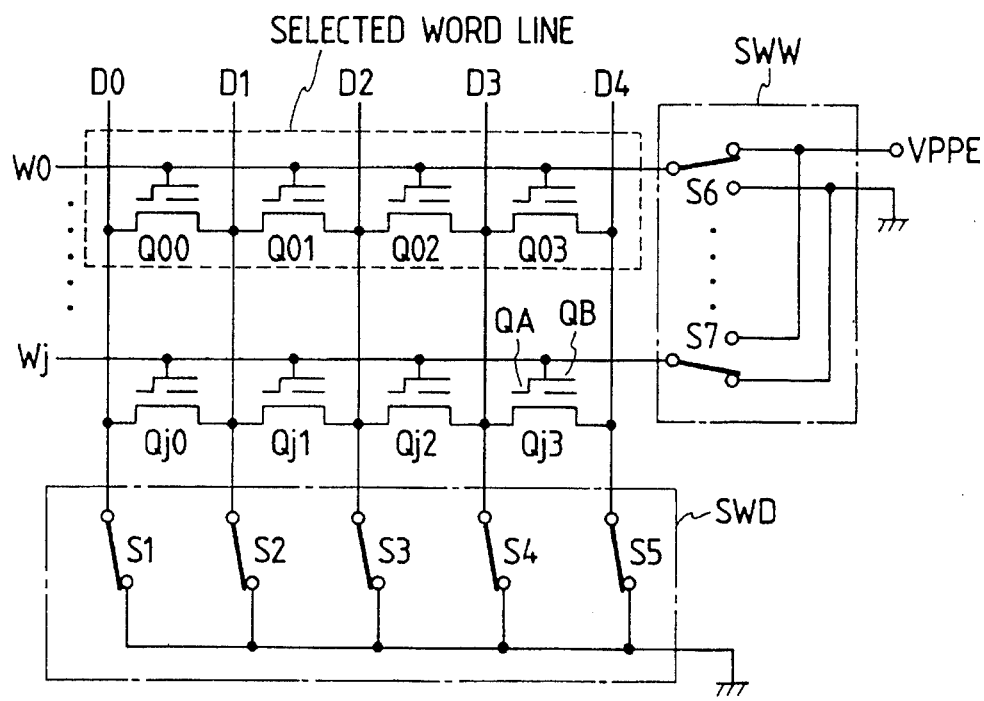
FIG. 17 is a circuit diagram for explaining one embodiment of the erasing operation of the memory array corresponding to the embodiment of FIG. 5.

FIG. 17 is a circuit diagram for explaining one embodiment of the erasing operation of the memory array corresponding to the foregoing embodiment of FIG. 5. In this embodiment, the erasing operation is to inject electrons into the floating gate FG of the memory cell by the F-N tunneling of electrons. In FIG. 17, the selectors of the memory array are shown in the shape of switches. Specifically, the word lines are selected by the word line selecting switch SWW, and the data lines and the source lines are selected by the data line selecting switch SWD.

In case the memory cells connected with the word line W0 are to be erased altogether by selecting it from the word lines W0 and Wj, as exemplified, the selected word line W0 is supplied with a positive high voltage such as VPPW by the switch S6 of the word line switch SWW. This voltage VPPW is set to a voltage such as 12 V. The unselected word line such as the word line Wj is supplied with the ground potential of the circuit by the switch S7 or the like. All the data lines D0 to D4 are supplied with the circuit ground potential by the switches S1 to S5 of the data line switch SWD.

In this state, the potential VF of the floating gates FG of the memory cells Q00 to Q03 is determined to a relatively high potential by the capacitance ratio between the parallel capacitance (C1+C3) composed the first capacitance C1 of the P$^-$-type semiconductor substrate/the first gate insulating film/the floating gate and the third capacitance C3 of the buried N$^+$-type layer/the first gate insulating film/the floating gate and the second capacitance C2 of the floating gate/the second gate insulating film/the control gate, the potential VPPE (at 12 V) of the control gate, the potential of 0 V of the data lines D1 to D4, and the substrate potential of 0 V. That voltage VF is applied to the first gate insulating film so that the electrons are injected from the N$^+$-type layer and the surface inversion layer N of the substrate N$^-$ into the floating gates by the F-N tunneling of electrons through the first gate insulating film. As a result, the memory cells Q00 to Q03 are given a high threshold voltage of about 5 V.

At this time, the unselected word lines are supplied with the same ground potential as that of the data lines or the substrate and have none of the aforementioned tunneling current so that the memory cells Qj0 to Qj3 are held in their original store mode.

Since the erasing operation is carried out at the unit of a word lines, as described above, the stored data of the memory cells connected with a plurality of word lines or all the word lines may be erased altogether by setting them to the aforementioned erasing high voltage VPPE.

Figure 18:
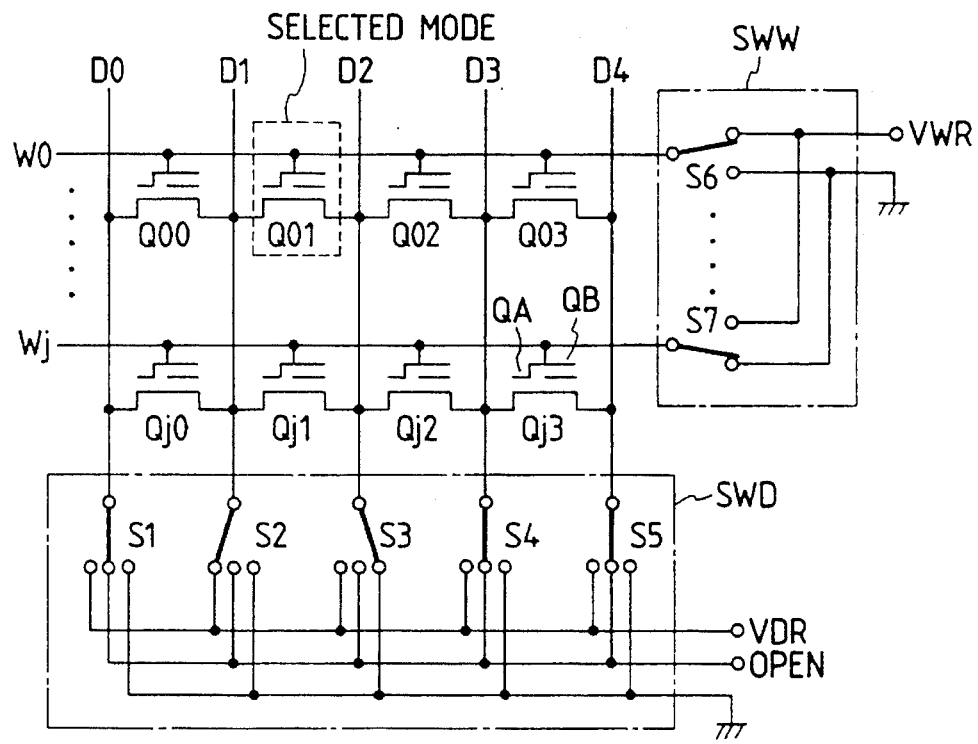
FIG. 18 is a circuit diagram for explaining one embodiment of the reading operation of the memory array corresponding to the embodiment of FIG. 5.

FIG. 18 is a circuit diagram for explaining one embodiment of the reading operation of the memory array corresponding to the aforementioned embodiment of FIG. 5. The selectors of the memory array are shown in the shape of switches in FIG. 12. Specifically, The word lines are selected by the word line selecting switch SWW, and the data lines and the source lines are selected by the data line selecting switch SWD.

In case the memory cell Q01 connected with the word line W0 of the word lines W0 and Wj, as exemplified, is to be read, the data line D1 connected with the switch element QA of the memory cell Q01 is supplied with a read voltage VDR by the switch S2 the data line selecting switch SWD. This voltage VDR is set to a relatively low potential such as about 3 V. The potential of the data line D2 connected with the memory element QB of the memory cell Q01 is supplied with the ground potential of the circuit by the switch S3. The remaining unselected data lines D0, D3 and D4 are brought into the floating state (OPEN) by the switches S1, S4 and S5.

The selected word line W0 is supplied with a select voltage VWR by the switch S6 of the word line selecting switch SWW such as about 5 V, and the unselected word line Wj is supplied with the ground potential of the circuit by the switch S7 or the like of the circuit.

If the memory element QB of the memory cell Q01 is written in this state, it is turned ON because its threshold voltage is at a low level such as 1 V. Since the switch QA is also turned ON by the selected level of the word line W0, the memory current flows from the data line D1 to the data line D2. If the memory cell Q01 is not subjected to the writing operation, no memory current will flow because the memory element QB has a high threshold voltage of 5 V although the switch element QA is ON. Whether or not this memory current exists is discriminated by a sense amplifier for feeding the select voltage VDR to the data line D1 and is outputted as an output signal the low/high levels. The sense amplifier to be used can have a structure similar to that of the sense amplifier used in the EPROM or the like of the prior art.

In the memory cell Q00 sharing the selected data line D1 and the selected word line W0, the data line D0 is in the floating state so that no memory current will flow independently of the stored state. Likewise, in the memory cell Q02 sharing the selected data line D2 and the selected word line, the data line D3 is in the floating state so that no memory current will flow independently of the stored state. In the memory cell Q03 or the like in which the word line is selected whereas the two data lines are unselected, the two data lines are in the floating state, and the switch element QA is OFF so that no memory current will flow.

In this embodiment, the memory current is established by supplying the read voltage VDR to the data line D1 connected with the switch element QA of the memory cell Q02 for the reading operation and by using the data line of the N$^+$-type layer connected with the memory element QB as the source line. Thanks to this structure, no high electric field is generated in the vicinity of the drain of the memory element QB during the reading operation so that no hot electron is established. It is, therefore, possible to prevent an error that the erasing operation is equivalent carried out by injecting the hot electrons into the floating gates when in the reading operation. Thus, the read voltage VDR can be raised to a relatively high level to establish a high read current so that the reading operation can be speeded up.

Incidentally, in the unselected memory cell Q00, the data line to be supplied with the aforementioned read voltage VDR is equipped with the memory element QB having the heavily doped N$^+$-type layer, but the channel current will not flow because of the floating state of the data line D0; therefore, hot electrons are not produced and erroneous erasure is prevented from occurring.

In order to facilitate understanding of the invention, the word line selecting switch SWW and the data line selecting switch SWD are separated in the foregoing description of the writing operation, the erasing operation and the reading operation. As a matter of fact, however, these operations are carried out for one memory array. Thus, the switches S1 to S5 and S6 and S7 are given the functions to select the voltages corresponding to those three operation modes.

Figure 19:
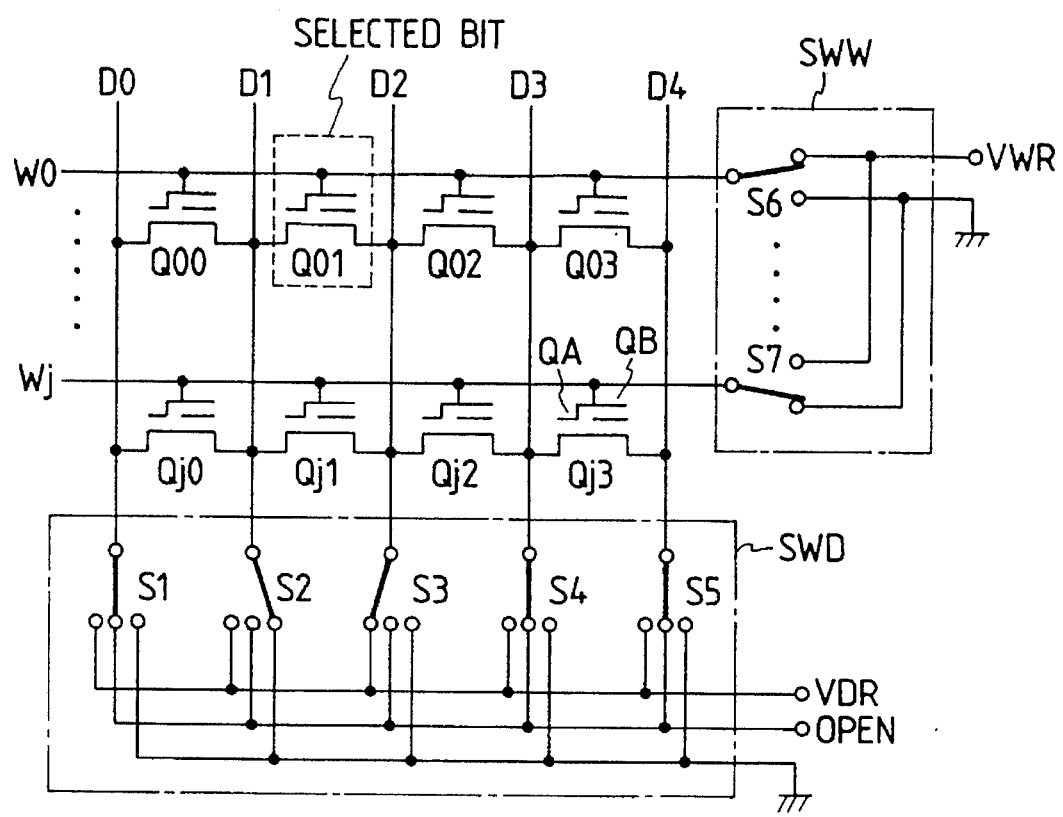
FIG. 19 is a circuit diagram for explaining another embodiment of the reading operation of the memory array corresponding to the embodiment of FIG. 5.

FIG. 19 is a circuit diagram for explaining another embodiment of the reading operation. In FIG. 19, too, the selectors for the memory array are shown in the shape of switches. Specifically, the word lines are selected by the word line selecting switch SWW, and the data lines and the source lines are selected by the data line selecting switch SWD.

In order to simplify the data line selecting switch, that is, to take consistency with the writing operation, the memory cell Q01 is selected in this embodiment by supplying the read voltage VDR to the data line D2 by the switch S3 and by supplying the ground potential of the circuit to the data line D1 by the switch S2. In this structure, the switches S2 and S3 can be controlled as in the writing operation of FIG. 9. Specifically, the write voltage VDW may be supplied for the writing operation by the switch S3 and may be changed into the read voltage VDR for the reading operation.

However, if the memory elements have structures identical to those of the foregoing embodiment of FIG. 7, the hot electrons are produced in the vicinity of the drains the memory element QB when in the reading operation, to cause a problem that the erasing operation is equivalently effected. If these hot electrons are to be eliminated, the read voltage VDR may be dropped to about 1 V. Then, the memory current is reduced to retard the reading speed accordingly. For a high-speed reading operation, therefore, the element structures of the memory cells are slightly modified, as follows.

Figure 20:
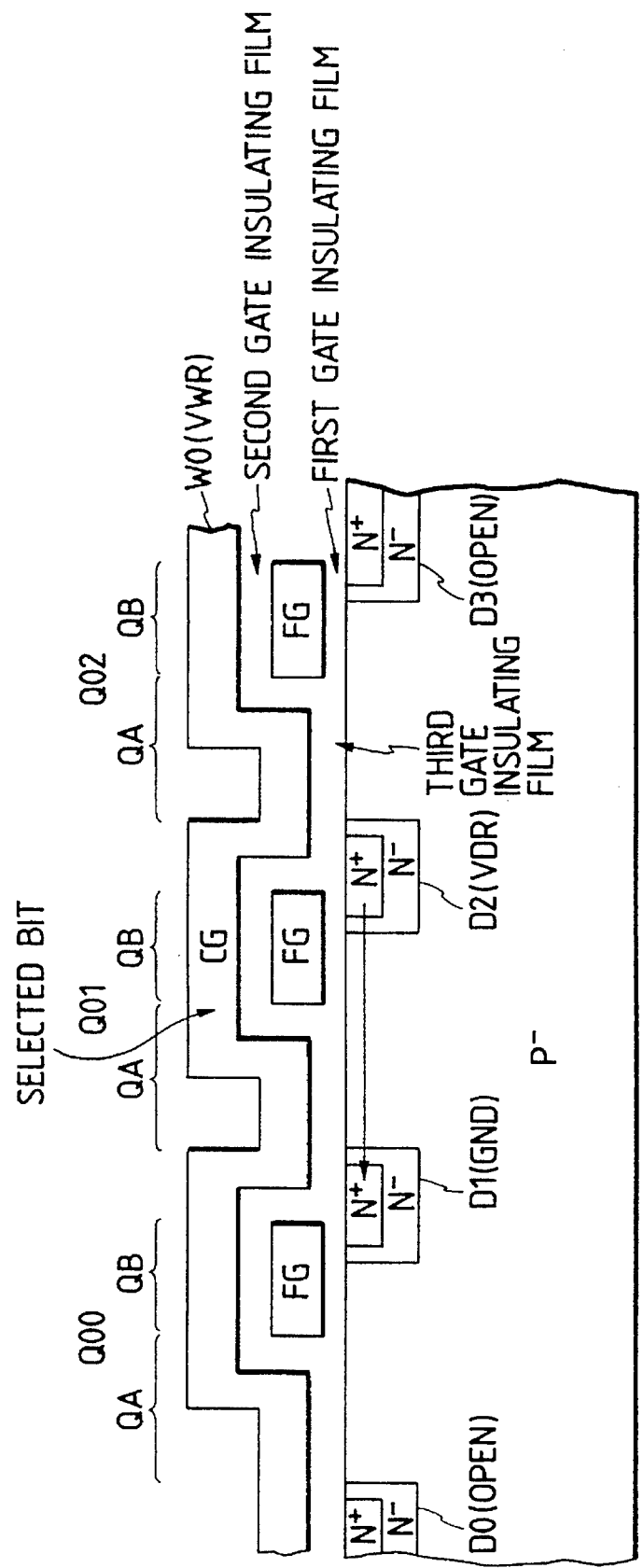
FIG. 20 is a section showing a schematic structure for explaining the reading operation corresponding to FIG. 19.

FIG. 20 is a section showing a schematic structure and taken in the word line direction. In this embodiment, the buried $N^+$-type layer having a high impurity concentration is formed in the buried $N^-$-type layer having a low impurity concentration. Here, the heavily doped burled $N^+$-type layer is formed to overlap the righthand side of the floating gate FG through the first gate insulating film.

Thanks to the structure described above, when the memory current is established, as indicated by arrow in FIG. 20, in the reading operation by supplying the read voltage VDR to the data line D2 connected with the memory cell Q01 and the ground potential GND of the circuit to the data line D1, the high electric field does not act to establish no hot electron like before, since the lightly doped $N^-$-type layer exists between the heavily doped buried $N^+$-type layer supplied with the aforementioned read voltage VDR and the channel region. As a result, it is possible to prevent the erroneous erasure in the reading operation.

The writing operation is carried out like before since the heavily doped buried $N^+$-type layer and the floating gate FG overlap each other through the first gate insulating film. Moreover, the memory cell Q02 sharing the data line D2 is formed with the aforementioned lightly doped buried $N^-$-type layer so that the F-N tunneling of electrons does not occur either before. The erasing operation can be carried out like before.

Figure 21:
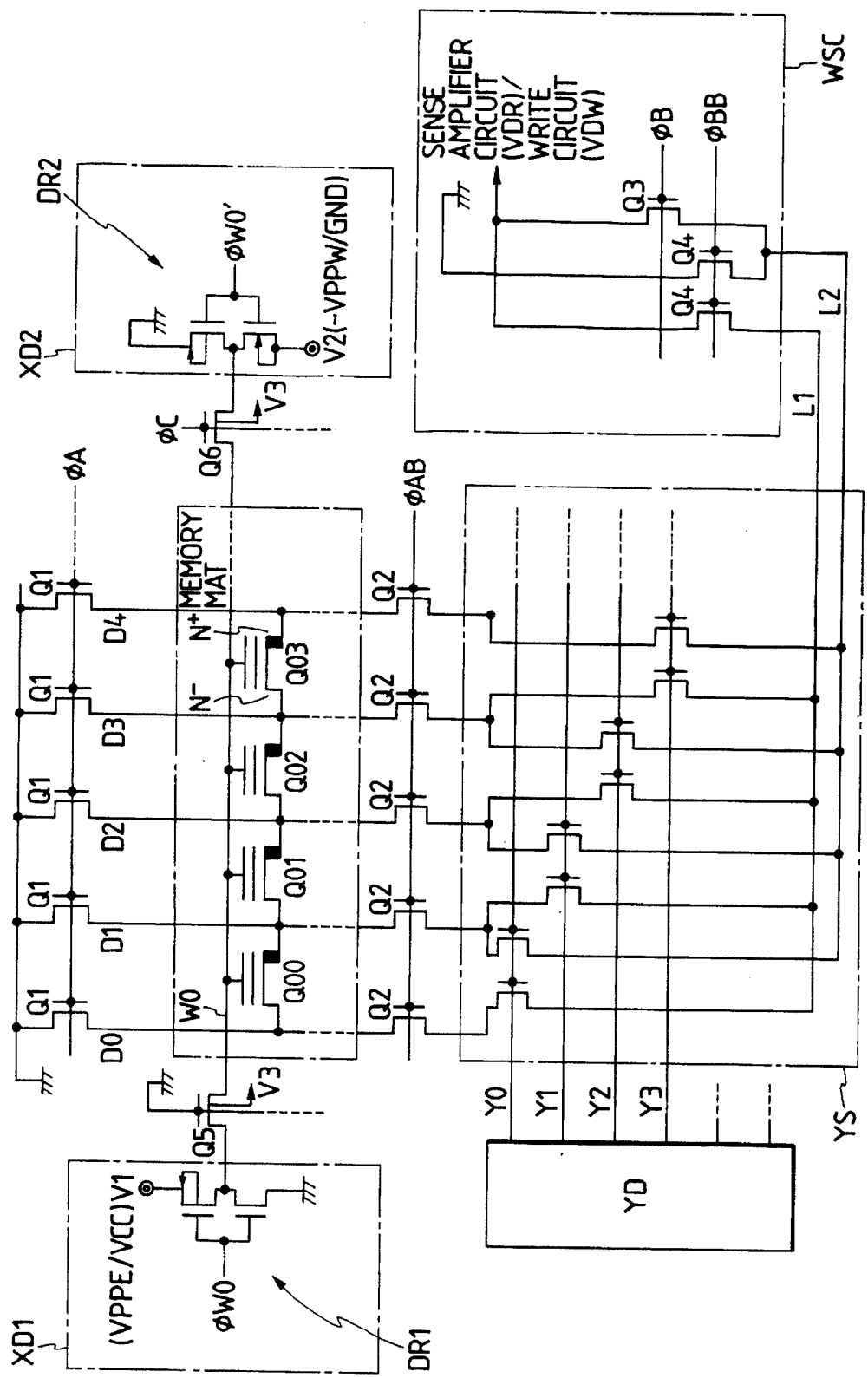
FIG. 21 is a specific circuit diagram showing one embodiment of the memory array portion and the nonvolatile memory device according to the present invention and a selector therefor.

FIG. 21 is a schematic circuit diagram showing one embodiment of the memory array portion and its selectors of the nonvolatile memory device according to the present invention. In FIG. 21, the memory array or memory mat corresponds to the aforementioned embodiment of FIG. 5, but similar selectors can also be used in the aforementioned embodiment of FIG. 5.

The terminals of the buried data lines D0 to D4 forming the memory mat are supplied with the ground potential of the circuit through switch MOSFETs Q1. These switch MOSFETs Q1 are switched by a timing pulse φA. The other terminals of the buried data lines D0 to D4 are connected with a Y-select YS through switch MOSFETs Q2. These switch MOSFETs Q2 are switched by a timing pulse φAB. This timing pulse φAB is a signal having its phase inverted from that of the timing pulse φA. Specifically, the letter "B" of the timing pulse AB means the "bar" signal (which has its low level at an active level).

The Y-select YS is equipped with one pair of switch MOSFETs for each of the data lines excepting the end one D0 so that it is supplied with select signals Y0 to Y3 produced by a Y-decoder YD. In FIG. 21, there are representatively shown the five data lines D0 to D4, as arranged from the lefthand end.

The reason why the Y-select YS is equipped with the paired switch MOSFETs is to cause the data lines D1 to D4 excepting the two end ones to be common used as the data lines and the source lines between the memory cells adjacent to each other in the word line direction. In other words, the Y-select YS connects one data line selectively with lines L1 and L2 by the paired switches.

When the select signal Y0 is produced by the Y-decoder YD, the data line D0 is connected with the line L1, and the data line D1 is connected with the line L2. When the select signal Y1 is then produced by the Y-decoder YD, the data line D1 is connected with the line L1, and the data line D2 is connected with the line L2. Thus, the data line D1 is connected with the line L2, when the signal Y0 is selected, and is switched to the line L1 when the signal Y1 is selected.

These lines L1 and L2 are connected with the ground potential of the circuit, a sense amplifier and a write circuit by a wiring switching circuit WSC. This wiring switch circuit WSC connects the line L2 with the sense amplifier or the write circuit in response to a MOSFET Q3 to be switched by a timing pulse φB, and connects the line L2 with the circuit ground potential and the line L1 with the sense amplifier or the write circuit in response to a MOSFET Q4 to be switched by a timing pulse φBB. This timing pulse φBB is the inverted signal of the timing pulse φB.

The switch MOSFETs Q1 and Q2, the Y-select YS and the wiring switching circuit WSC described above constitute the aforementioned data line selecting switch SWD. When in the writing operation, the timing pulse φAB takes the high level to connect the data lines D0 to D4 and the like with the Y-select YS. Then, the timing pulse φB takes the high level to turn ON the switch MOSFET Q3 of the wiring switching circuit WSC thereby to connect the line L2 with the write circuit activated at this time. When the write circuit has write data at a logic level of 1, for example, to discharge the floating gates of the memory cells, the write voltage VDW is outputted.

The word line W0, as exemplified, is connected at its lefthand end with an erase/read X-decoder XD1 through a P-channel type switch MOSFET QS. The X-decoder XD1 is equipped with a word driver DRZ for supplying the word line W0 with the erase voltage VPPE and the read voltage VCC (or VWR). The word driver DR1 includes a CMOS inverter for receiving an input signal φW0 so that it is switched to the high voltage VPPE, when an operating voltage V1 to be supplied to the source of the P-channel type MISFET is in the erase mode, and to the low voltage VCC when the same is in the read mode.

The aforementioned word line is connected at its right-hand end with an X-decoder XD2 through a P-channel type switch MOSFET Q6. The X-decoder XD2 is equipped with a word driver DR2 for supplying the word line W0 with the writing voltage –VPPE and the ground potential. The word driver DR2 includes a CMOS inverter for receiving an input signal φW0' so that it is switched to the high voltage –VPPW when an operating voltage to be supplied to the source of the N-channel type MOSFET is in the write mode.

The aforementioned P-channel type switch MOSFET Q5 is steadily supplied at its gate with the ground potential of the circuit. On the contrary, the P-channel MOSFET Q6 is supplied at its gate with a timing pulse φC. These switch MOSFETs Q5 and Q6 are formed in the well region and fed with a bias voltage V3. The X-decoder XD1 and XD2 described above constitute the aforementioned word line selecting switch SWW.

When the select signal Y1 is produced by the Y-decoder, the data lines D1 and D2 are selected. If the word line W0 is selected at this time, the memory cell Q01 is written. Then, the data line D1 is connected with the line L1 so that it is brought into the floating state (OPEN) in response to the OFF state of the switch MOSFET Q4 of the wiring switching circuit WSC, and the data line D2 is connected with the line L2 and fed with the aforementioned write voltage VDW. As a result, the data line D2 is fed with the write voltage VDW, and the data line D1 is placed in the floating state.

In the write mode described above, the word driver DR2 of the writing X-decoder XD2 is activated to output the voltage −VPPW. At this time, the timing pulse φC takes a negative voltage corresponding to −VPPW to turn ON the switch MOSFET Q6 so that the word line W0 takes a negative voltage such as −VPPW. The bias voltage V3 of the well formed with the MOSFETs Q5 and Q6 is set at the ground potential of the circuit. In response to this negative voltage of the word lines W0, the switch MOSFET Q5 at the erasing/reading X-decoder XD1 is turned OFF. As a result, the voltage similar to that of FIG. 9 is applied to the selected memory cell Q01 so that the writing operation is carried out.

In the erase mode, the timing pulse φA is set to the high level whereas the timing pulse φAB is set to the low level. As a result, the switch MOSFET Q1 is turned ON whereas the switch MOSFET Q2 is turned OFF, so that the individual data lines D0 to D4 and the line are fed with the ground potential of the circuit independently of the Y-select YS. In this erase mode, the word driver DR1 of the erasing X-decoder XD1 is activated to output the voltage VPPE. At this time, the timing pulse φC is set to the high level to turn OFF the switch MOSFET Q6 so that the switch MOSFET Q5 is relatively turned ON to establish the positive high voltage such as VPPE on the word line W0. As a result, the memory cells Q00 to Q03 are erased all at once because a voltage similar to that of FIG. 11 is applied thereto.

In the read mode, the timing pulse φA is set to the low level whereas the timing pulse φAB is set to the high level.

As a result, the switch MOSFET Q1 is turned OFF whereas the switch MOSFET Q2 is turned ON so that the data lines have their potentials set by the Y-select and the wiring switching circuit WSC.

When the select signal Y1 is produced by the Y-decoder YD, that is, when the select signal Y1 is set to the high level, the data lines D1 and D2 are selected. If the word line W0 is selected at this time, the memory cell Q01 is read. The data line D1 is connected with the line L1 and further with the sense amplifier in response to the ON state of the switch MOSFET Q4 of the wiring switching circuit WSC so that it is supplied with read voltage VDR from the sense amplifier. On the other hand, the data line D2 is connected with the line L2 so that it is fed with the ground potential of the circuit in response to the ON state of the switch MOSFET Q4 of the wiring switching circuit. As a result, the data line D1 is fed with the read voltage VDR, and the data line D2 is fed with the ground potential of the circuit.

In the read mode described above, the word driver DR1 of the reading X-decoder XD1 is activated to output the voltage VCC (VDR). Since the switch MOSFET Q6 is held in the OFF state at this time by the high level of the timing pulse φC, the switch MOSFET Q5 is relatively turned ON to set the word line W0 to the read voltage. As a result, the reading operation is carried out because a voltage similar to that of FIG. 12 is applied to the selected memory cell Q01.

TABLE 1

|  | Write Mode | | Erase Mode | | Read Mode | |
| --- | --- | --- | --- | --- | --- | --- |
|  | Sel. | Unsel. | Sel. | Unsel. | Sel. | Unsel. |
| V1(DR1) | VCC(5V) | ← | VPPE | ← | VCC(5V) | ← |
| V2(DR2) | −VPPW | ← | GND(0V) | ← | ← | ← |
| V3 | GND(0V) | ← | VPPE | ← | VCC(5V) | ← |
| φC | −VPPW | ← | VPPE | ← | VCC(5V) | ← |
| φW | — | — | GND(0V) | VPPE | GND(0V) | VCC(5V) |
| φW' | GND(0V) | −VPPW | — | — | — | — |
| W0 | −VPPW | GND(0V) | VPPE | GND(0V) | VCC(5V) | GND(0V) |

Sel.: Selected; and Unsel.: Unselected

Table 1 enumerate both the voltages V1 to V3 of the word driver of the word line selecting method and the voltages of the timing pulse φC, φW and φW' corresponding to the individual modes, individually in the write mode, the erase mode and the read mode.

Table 2, as follows, the potentials of the select signals Y0 to Y3 of the Y-decoder YD and the data lines D0 to D3 in the data line selecting method individually in the write mode, the erase mode and the read mode. In Table 2, letters OPN indicating the potential of the data lines are an abbreviation from the "OPEN" meaning the floating state.

TABLE 2

|  | Write Mode φA = L φB = L | | | | Erase Mode φA = H φB— | | Read Mode φA = L φB = L | | |
| --- | --- | --- | --- | --- | --- | --- | --- | --- | --- |
| Y0 | H | L | L | L | — | H | L | L | L |
| Y1 | L | H | L | L | — | L | H | L | L |
| Y2 | L | L | H | L | — | L | L | H | L |
| Y3 | L | L | L | H | — | L | L | L | H |
| D0 | OPN | OPN | OPN | OPN | GND | VDR | OPN | OPN | OPN |
| D1 | VDW | OPN | OPN | OPN | ↑ | GND | VDR | OPN | OPN |

TABLE 2-continued

| | Write Mode φA=L φB=L | | | | Erase Mode φA=H φB— | | Read Mode φA=L φB=L | | |
|---|---|---|---|---|---|---|---|---|---|
| D2 | OPN | VDW | OPN | OPN | ↑ | OPN | GND | VDR | OPN |
| D3 | OPN | OPN | VDW | OPN | ↑ | OPN | OPN | GND | VDR |
| D4 | OPN | OPN | OPN | VDW | ↑ | OPN | OPN | OPN | GND |

FIGS. 22A and 22B are circuit diagrams showing one embodiment of the internal voltage generators. FIG. 22A shows a writing negative voltage generator, and FIG. 22B shows an erasing high voltage generator.

The writing negative voltage generator is constructed, as shown in FIG. 22A, to include: MOSFETs in the diode mode connected in cascade to establish a current flow from the ground potential side of the circuit; and capacitors C1 to Cn connected with the nodes of the individual diodes. The capacitors C1 and C2 and the like adjacent to each other are supplied with timing pulses φW1 and φW2 having have phased inverted from each other. These timing pulses φW1 and φW2 are desired to be such non-overlapping complementary timing pulses as have their active levels non-overlapped for efficient charge-pumping actions.

Although not shown, the final stage is equipped with a relatively high parasitic capacitance in a line or element for storing the write voltage −VPPW fed thereto. Moreover, in order to prevent the negative write voltage −VPPW from being increased more than necessary due to the fluctuation of the power source voltage, there is provided a Zener diode ZD1 to stabilize the write voltage −VPPW. This write voltage −VPPW may be used in the potential V3 of the well formed with the aforementioned switch MOSFETs QB and Q6.

The erasing voltage generator is constructed, as shown in FIG. 22B, to include: MOSFETs in the diode mode connected in cascade to establish a current from the power source voltage side; and capacitors C1 to Cm connected with the nodes of the individual diodes. The capacitors C1 and C2 and the like adjacent to each other are supplied with timing pulses φE1 and φE2 having have phased inverted from each other. These timing pulses φE1 and φE2 are desired to be such non-overlapping complementary timing pulses as have their active levels non-overlapped for efficient charge-pumping actions.

Although not shown, the final stage is equipped with a relatively high parasitic capacitance in a line or element for storing the erase voltage VPPE fed thereto. Moreover, in order to prevent the negative erase voltage VPPE from being increased more than necessary due to the fluctuation of the power source voltage, there is provided a Zener diode ZD2.

Figure 23:
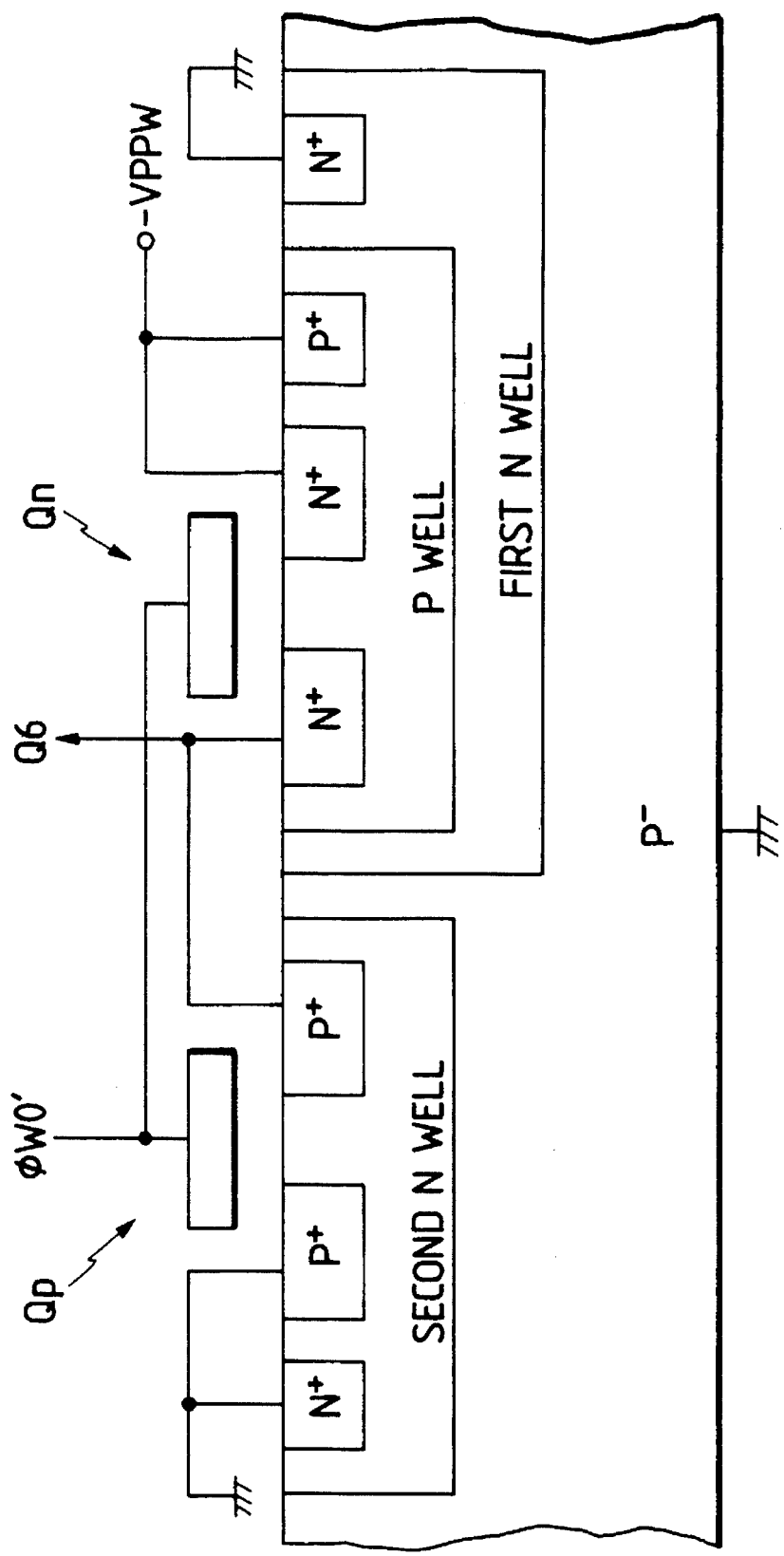
FIG. 23 is a section showing a schematic structure of one embodiment of a word driver DR2 of FIG. 21.

FIG. 23 is a section showing a schematic structure of one embodiment of the aforementioned word driver DR2. Since, in this embodiment, an N-channel type MOSFET Qn for outputting the write voltage at the negative high level −VPPW cannot be formed directly in the P⁻ type substrate, a N-well is formed at first and is fed with the bias voltage at the ground potential of the circuit to form a P-well therein. By this dual well structure, the negative voltage −VPPW can be outputted.

Figure 24:
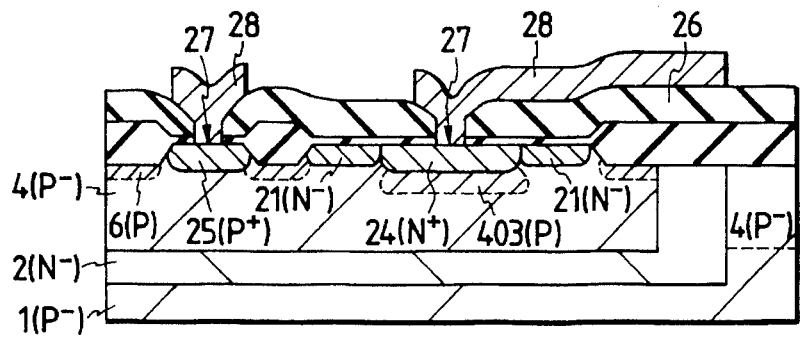
FIG. 24 is a section showing an element structure of one embodiment of a Zener diode of FIG. 22.

FIG. 24 is a section showing an element structure of one embodiment of the aforementioned Zener diodes. A P⁻-type substrate 1 is formed with an N⁻-type first well region 2. This first well region 2 is formed with a P⁻-type well region 4. This well region 4 is formed therein with an N⁺-type region 24, below which is formed a P-type semiconductor region 403 to form a junction plane in the semiconductor substrate, thus constructing the Zener diode. The semiconductor region 403 is formed by introducing boron by the ion implantation technique with an acceleration energy of 100 to 200 KeV. The doping amount is determined by the Zener voltage. The semiconductor region 24 having a high impurity concentration is surrounded by an N⁻type semiconductor region 21 having a low impurity concentration. The P-type well region 4 is formed with a P⁺-type region 25 for the ohmic contact and equipped with a wiring line 28.

Figure 25:
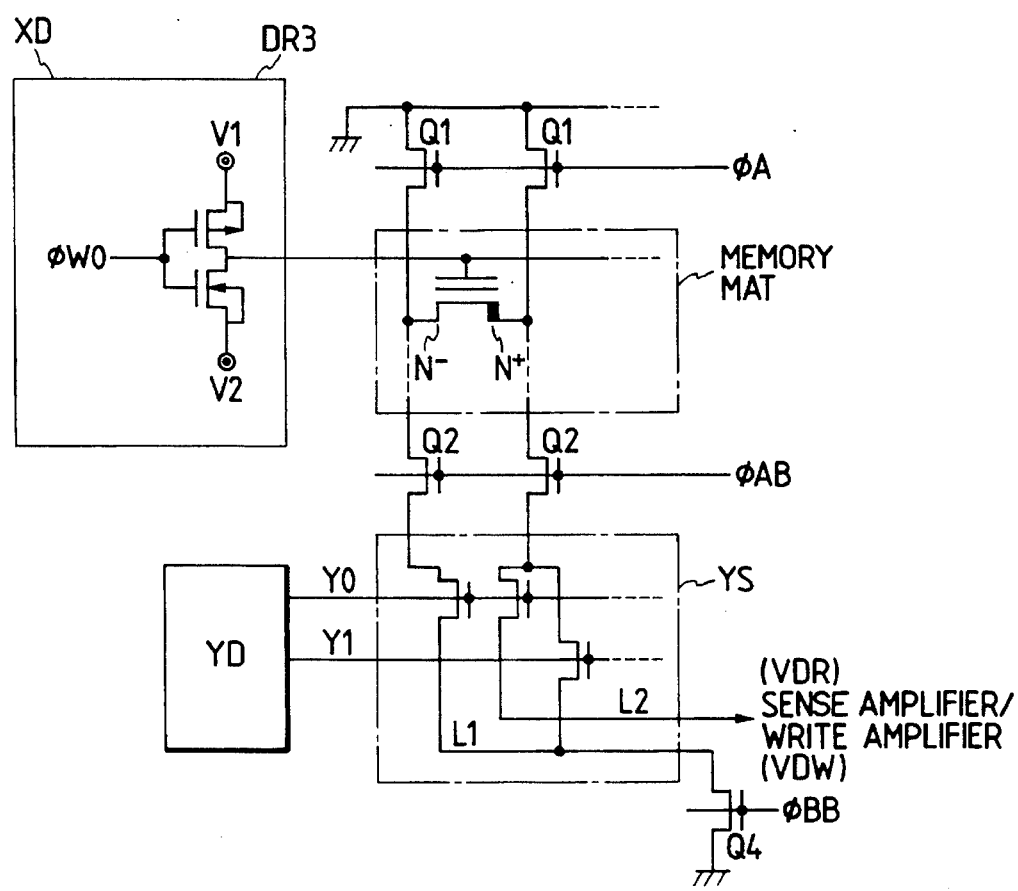
FIG. 25 is a schematic circuit diagram showing another embodiment of the memory array portion of the nonvolatile memory device according to the present invention and the selector therefor.

FIG. 25 is a specific circuit diagram showing another embodiment of the memory array portion and its selector of the nonvolatile memory device according to the present invention. In FIG. 25, the memory array portion or memory mat corresponds to those of the foregoing embodiments of FIGS. 13 and 14, but a similar selector can also be used in the foregoing embodiments of FIGS. 19 and 20.

The word line selecting switch is constructed of one X-decoder XD. This X-decoder XD includes a CMOS inverter for outputting the voltages V1 and V2 selectively in response to the input signal φW0. On the other hand, the aforementioned wiring switching circuit is omitted from the data line selecting switch because the write voltage VDW and the read voltage VDR can be supplied from the same data line side in the memory cells. Thus, the line L1 is see to the ground potential of the circuit or the floating state through the switch MOSFET Q4, and the line L2 is connected with the sense amplifier or the write amplifier.

In the writing operation, the word driver has its voltage V1 set to the level GND and its voltage V2 set to the level −VPPW (−7 V). In the erasing operation, the voltage V1 is set to the level VPPE (12 V), and the voltage V2 is set to the level GND. In the reading operation, the voltage V1 is set to the level VCC (5 V), and the voltage V2 is see to the level GND. By switching the voltages V1 and V2 in these ways, it is possible to generate the word line selecting/unselecting voltages, as enumerated in Table 1.

Figure 26:
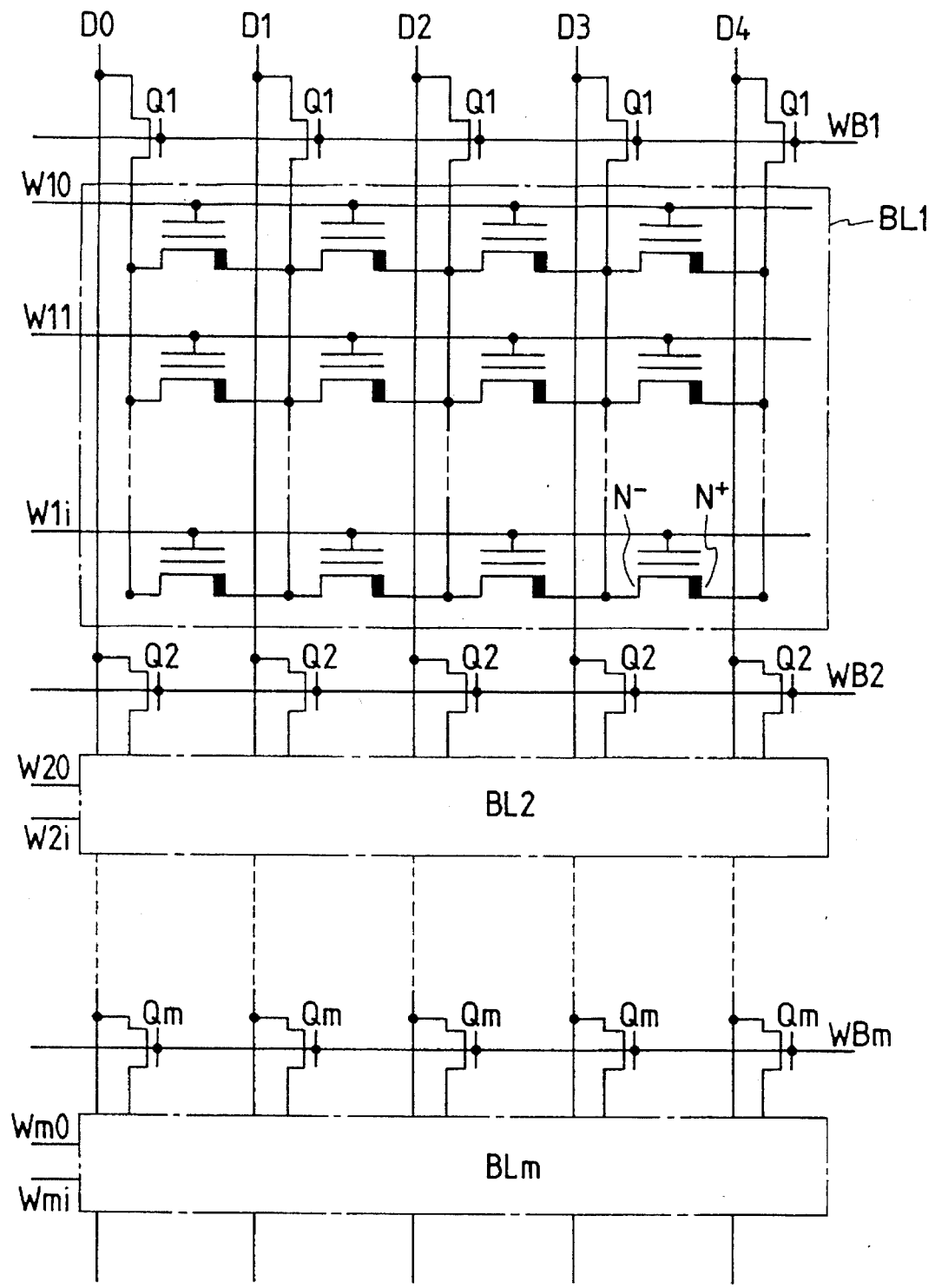
FIG. 26 is a circuit diagram showing another embodiment of the memory mat portion of the nonvolatile memory device according to the present invention.

FIG. 26 is a circuit diagram showing another embodiment of the memory array portion in the nonvolatile memory device according to the present invention. In this embodiment, the memory mat is constructed of divided blocks. Specifically, the data lines D0 to D4, as exemplified, are equipped with block selecting switch MOSFETs Q1 to Qm, through which are provided blocks BL1 to BLm.

Memory cells like the aforementioned ones are connected with block data lines individually for the blocks BL1 to BLm. In this structure, the block data lines of the blocks BL1 to BLm connected with the memory cells are the buried data lines. On the contrary, the data lines D0 to D4 shared among the switch MOSFETs Q1 to Qm are main data lines which are formed of a metal wiring layer of aluminum or the like having a low resistance.

In the writing operation, the switch MOSFET corresponding to the selected block is turned ON for the writing operation like before. In this structure, the block data lines in the unselected memory block are brought into the floating state so that they are kept away from the stress due to the writing operation. In the reading operation, the block data lines can be shortened, and the number of memory cells connected can be reduced so that the parasitic capacitance can be reduced. As a result, the capacitance load in the reading operation can be lightened to effect a high-speed reading operation.

In the aforementioned block division, the block data lines may be equipped at their two ends with the switch MOSFETs Q1 or the like. Then, the data line resistance at the block selecting time can be remarkably reduced to reduce the dispersion of the write voltages for the connected positions of the memory cells in the write mode thereby to stabilize the writing operation. In the writing operation, the resistance values of the data lines can be reduced to effect a high-speed reading operation.

Figure 27:
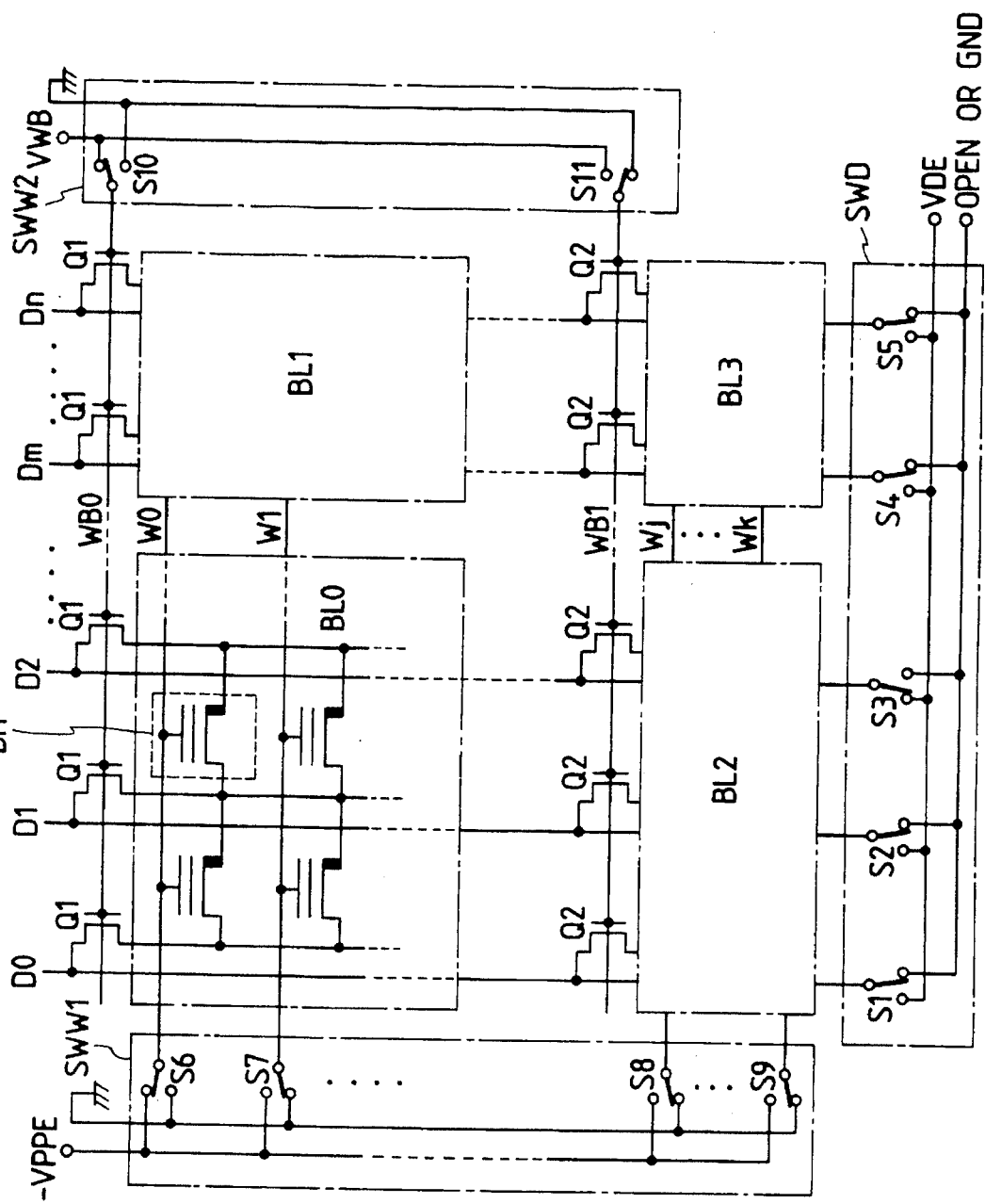
FIG. 27 is a circuit diagram showing one embodiment of the writing operation of block division in the nonvolatile memory device according to the present invention.

FIG. 27 is a circuit diagram showing one embodiment of the writing operation of the block division in the nonvolatile memory device according to the present invention. In this embodiment, the block division is carried out not only in the data line direction but also in the data line direction. Specifically, as shown, the memory mat is halved in the word line direction and further in the data line direction, thus forming the four blocks BL0 to BL3.

If a block selecting switch SWW2 is provided to turn ON the switch MOSFET Q1, the upper two blocks BL0 and BL1 are selected. The word line W0, for example, is selected by a word line selecting switch SWW1. When the memory cells of the data lines D1 and D2 of the block BL0 are selected by the data line selecting switch SWD, the data line D2 is supplied with the write voltage VDW by the switch S3. At this time, all the data lines corresponding to the blocks BL1 and BL3 are set to the floating state (OPEN) or the ground potential (GND). As a result, the memory cells of the block BL0 are written.

Figure 28:
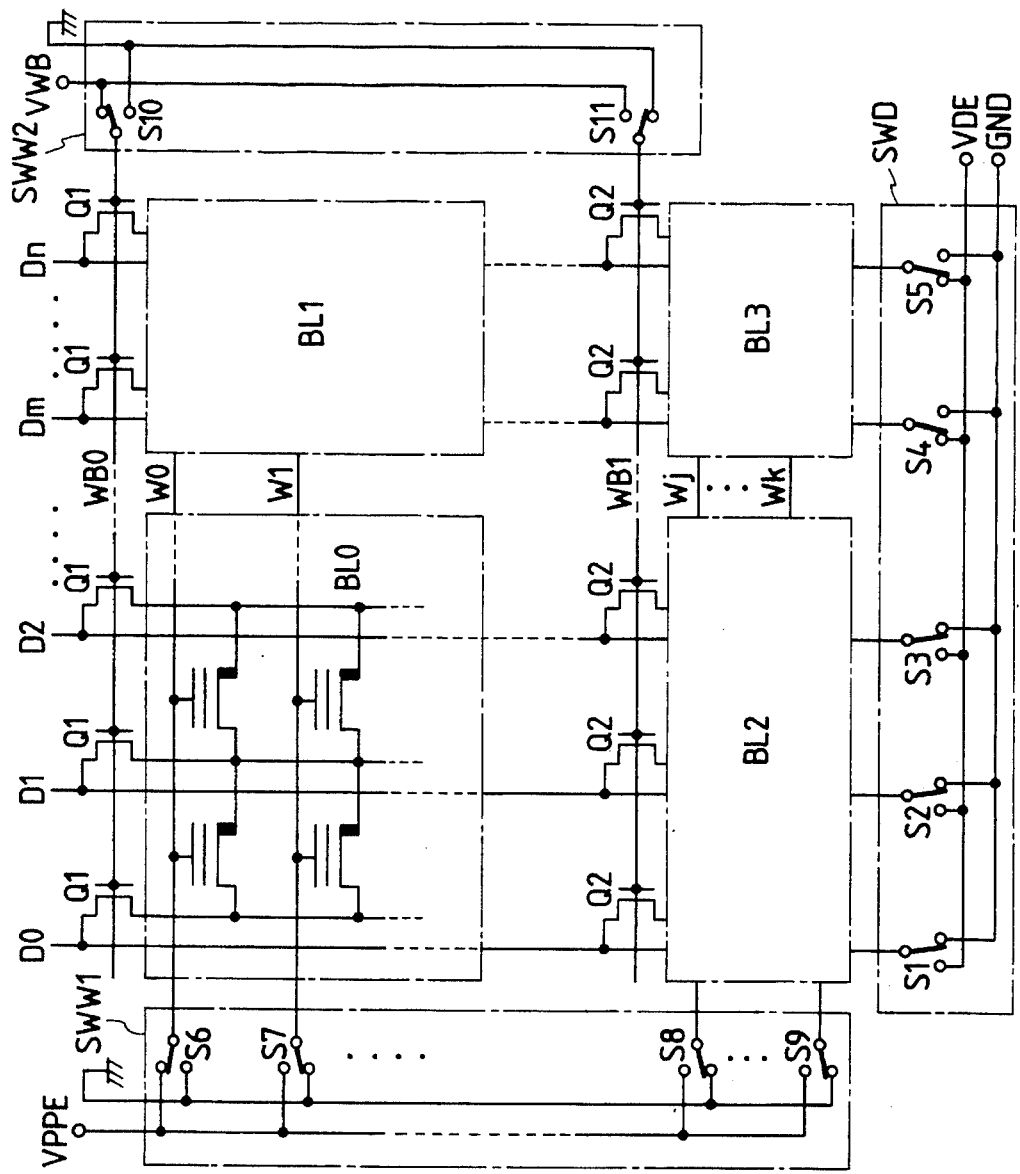
FIG. 28 is a circuit diagram showing one embodiment of the erasing operation of block division in the nonvolatile memory device according to the present invention.

FIG. 28 is a circuit diagram showing one embodiment of the erasing operation of the block division in the nonvolatile memory device according to the present invention. When the switch MOSFET Q1 is turned ON by the block selecting switch SWW2, the upper two block blocks BL0 and BL1 are selected. The word line W0, for example, is selected by the word line selecting switch SWW1. In the case in which the memory cells of the block BL0 are erased and the memory cells of the block BL1 are not erased, the data lines corresponding to the block BL0 are supplied with the ground potential whereas the data lines corresponding to the block BL1 are supplied with the voltage VDE by the data line selecting switch SWD. The voltage VDE is set to the level VCC such as 5 V. As a result, the selected block BL0 is erased by applying the high voltage such as 12 V, but the unselected block BL1 is not erased because it is supplied with only a voltage of (VPPE–VDE) (12 V–5 V).

Figure 29:
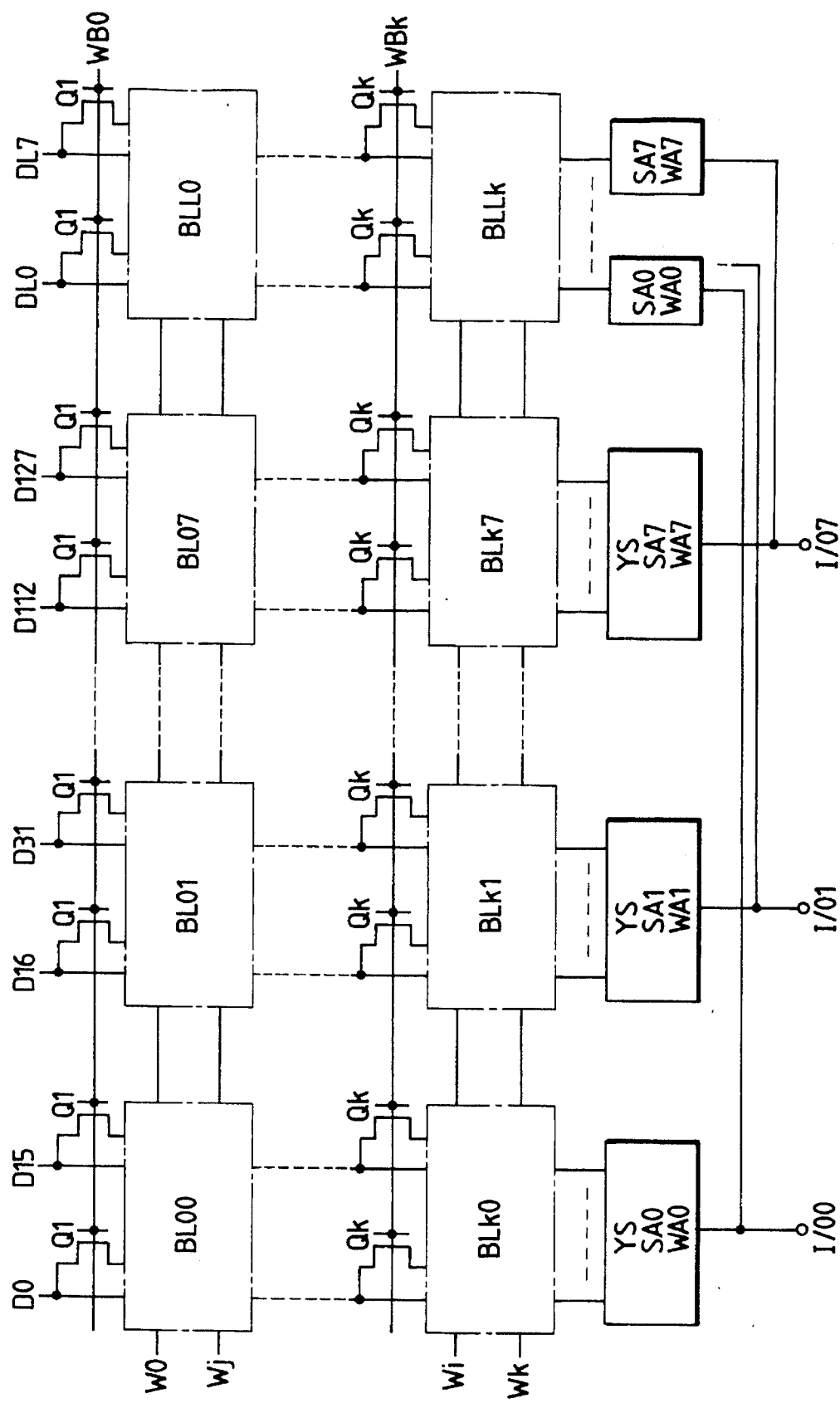
FIG. 29 is a circuit diagram showing another embodiment of the erasing operation of block division in the nonvolatile memory device according to the present invention.

FIG. 29 is a block diagram showing another embodiment of the block division in the nonvolatile memory device according to the present invention. In this embodiment, the block is composed of large blocks and small blocks. The large blocks are divided into (k+1) blocks BL00 to BLk0 in the data line direction by assigning a plurality of data lines D0 to D15 to one input/output terminal I/O0. The remaining input/output terminals I/O0 to I/O7 are likewise equipped with similar large blocks BL01 to BL07 through BLk1 to BLk7.

The small blocks are divided in the data line direction for the data lines of 8 bits DL0 to DL7. In the small blocks BLL0 to BLLk thus divided, the eight data lines DL0 to DL7 are selected to correspond to the input/output terminals I/O0 to I/O7. In the large block, one data line is selected from the sixteen data lines by the Y-select. In the small block, on the other hand, the Y-select is omitted because the data lines DL0 to DL7 correspond to the input/output terminals I/O0 to I/O7.

In the block structure of this embodiment, the small blocks can be used as the data memories which have to be written at the unit of byte (8 bits). Specifically, the following method can be adopted. The data processing accompanied by the writing operation is carried out by performing sequential accesses with the small blocks so that the final data are prepared. At this time, the final data are stored in a predetermined area of the large block.

Figure 30:
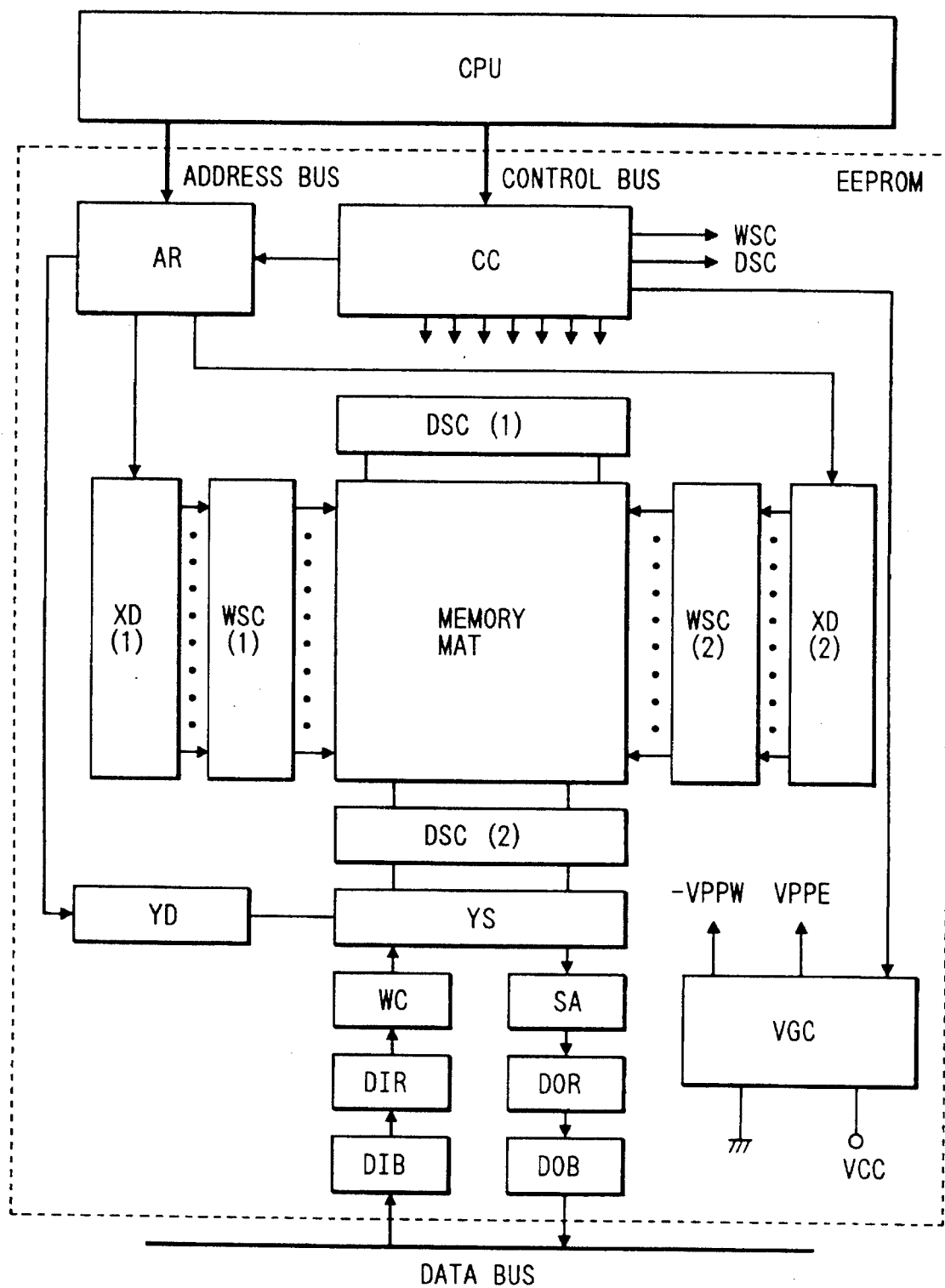
FIG. 30 is a block diagram showing the entirety of one embodiment of the nonvolatile memory device according to the present invention.

FIG. 30 is a block diagram showing the entirety of one embodiment of the nonvolatile memory device according to the present invention. In FIG. 30, there is also shown a microcomputer CPU for the memory accessing of the nonvolatile memory device.

The nonvolatile memory device of this embodiment is designated at EEPROM in a broad sense because it can be electrically erased and written. An address signal inputted through an address bus is fetched by an address latch AR. Likewise, a control signal inputted through a control bus is fetched by a control circuit CC. In the writing operation, the write data are supplied to a data bus.

The selector of the memory mat corresponds to the foregoing embodiment of FIG. 21. Specifically, the word line selecting circuit WSC is divided into an erasing/reading X-decoder XD(1) and a writing X-decoder XD(2). Word line selectors WSC(1) and WSC(2) correspond to the switch circuits such as the aforementioned switch MOSFETs Q5 and Q6. The X-decoders XD(1) and XD(2) are supplied with the X-address signals from the address latch AR to decode the supplied X-address signals so that a select signal of one word line is produced.

In the control circuit, the select signal of the word line switching circuit WSC is produced according to the operation mode. When in the write mode, the word line switching circuit WSC(2) is selected so that the word line is selected by the X-decoder XD(2). When in the erase mode and in the read mode, the word line switching circuit WSC(1) is selected so that the word line is selected by the X-decoder XD(1).

A data line switching circuit DSC also corresponds to that of the foregoing embodiment of FIG. 21. A data line switching circuit DSC(1) is composed of the MOSFET Q1 and the like for feeding the erasing ground potential to the data lines. A data line switching circuit DSC(2) is composed of a switch circuit such as the aforementioned MOSFET Q2 for connecting the data lines of the memory mat with the Y-select. In the control circuit, the select signal of the data line switching circuit DSC is produced according to the operation mode. When in the erase mode, the data line switching circuit DSC(1) is selected to feed the ground potential of the circuit to the data lines of the memory mat.

The control circuit produces the select signal of the data line switching circuit DSC(2), when in the write mode and in the read mode, to connect the data lines of the memory mat with the Y-select YS. This Y-select YS selects the data lines in response to the select signal of the Y-decoder YD for decoding the Y-line address signal fetched by the address latch When in the write mode, The write circuit is activated to transmit the write data inputted through the data bus to a data input buffer DIB, a data input latch DIR and a write circuit WC. This write circuit WC outputs the write voltage VDW corresponding To the write data so that the selected bit is written by the word line selecting operation.

When in the read mode, a sense amplifier SA is activated to feed the read voltage VDR and the ground potential GND to the selected paired data lines through the Y-select YS and the data line switching circuit DSC(2) so that the memory current is sensed. The output of the sense amplifier SA corresponding whether or not the memory current is sensed is fed to the data bus through a data output latch DOR and a data output buffer DOB.

A write/erase voltage generating circuit VGC produces the voltages −VPPW and VPPE necessary for the writing operation and the erasing operation by using the power source voltage VCC and a periodic pulse signal. Since the write voltage −VPPE or the erase voltage VPPE is produced by such internal circuit, the writing/erasing operations can be carried out for the nonvolatile memory device only by one power source such as VCC. As a result, the nonvolatile memory device of this embodiment can carry out not only the writing operation by the proprietary program writer as in the EPROM of the prior are but also the writing/erasing operations in the state in which it is packaged on the microcomputer system.

For these memory accesses, the address buffer is given an address latching function. The data input buffer is given a latching function. As a result, the microcomputer CPU can access the peripheral devices separately of the EEPROM in response to the address signal and the write data when the writing operation or the erasing operation is carried out in the EEPROM. The end of the writing operation or the erasing operation can be sequentially confirmed through the control bus by the polling or the like before a next memory access is entered.

Figure 31:
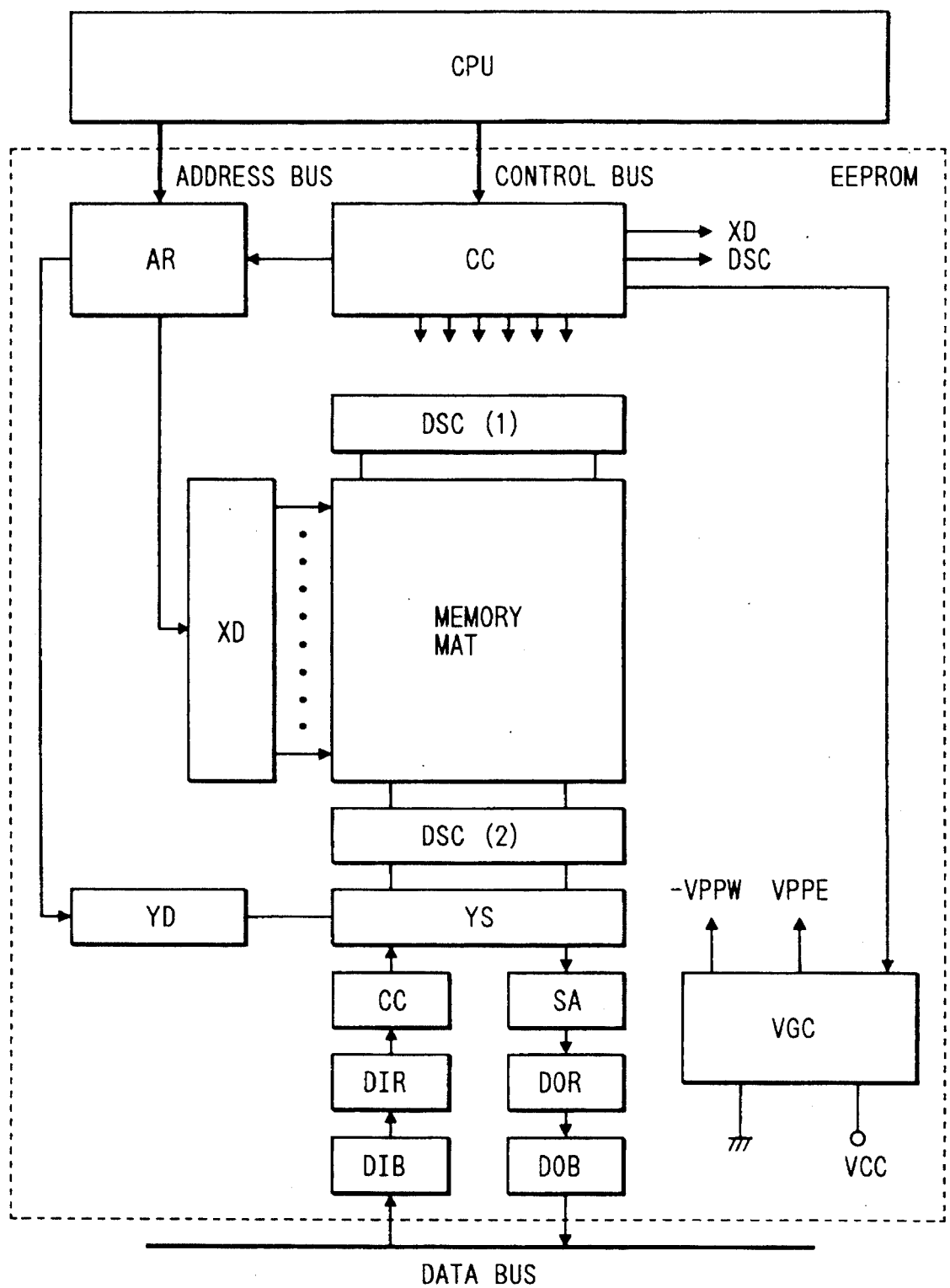
FIG. 31 is a block diagram showing the entirety of another embodiment of the nonvolatile memory device according to the present invention.

FIG. 31 is a block diagram showing the entirety of another embodiment of the nonvolatile memory device according to the present invention. In FIG. 31, there is also shown a microcomputer CPU for the memory accessing of the nonvolatile memory device. The selector of the memory mat of this embodiment corresponds to that of the foregoing embodiment of FIG. 25. In short, the word line selecting circuit WSC is constructed to include one X-decoder XD. The remaining structure is similar to that of the foregoing embodiment of FIG. 30, and its description will be omitted.

Figure 32:
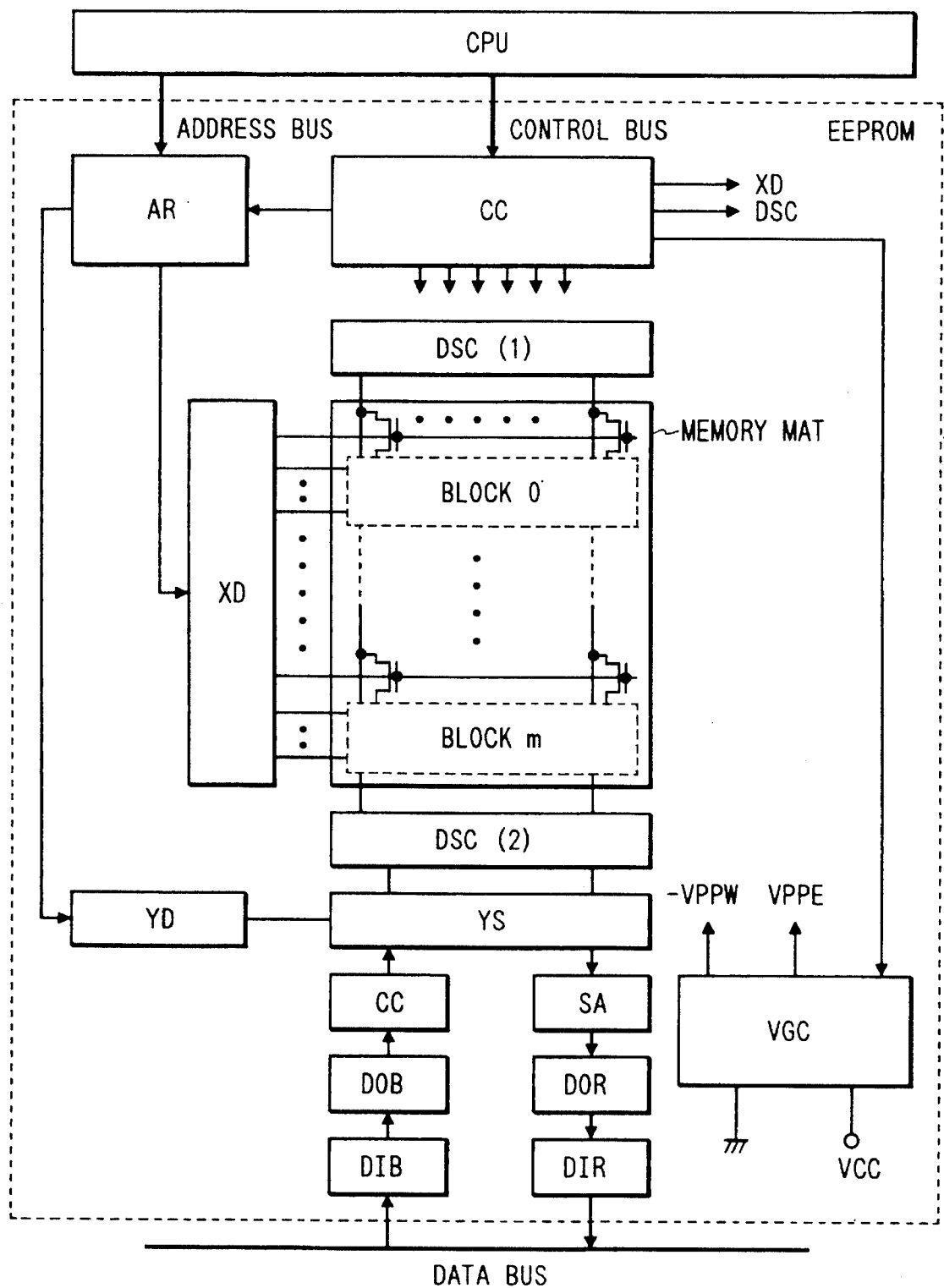
FIG. 32 is a block diagram showing the entirety of still another embodiment of the nonvolatile memory device according to the present invention.

FIG. 32 is a block diagram showing the entirety of still another embodiment of the nonvolatile memory device according to the present invention. In FIG. 32, there is also shown a microcomputer CPU for the memory accessing of the nonvolatile memory device. The memory mat of this embodiment is divided into blocks as in the foregoing embodiment of FIG. 26. The selector of this memory mat is similar to that of the foregoing embodiment of FIG. 31, and its description will be omitted.

Figure 33:
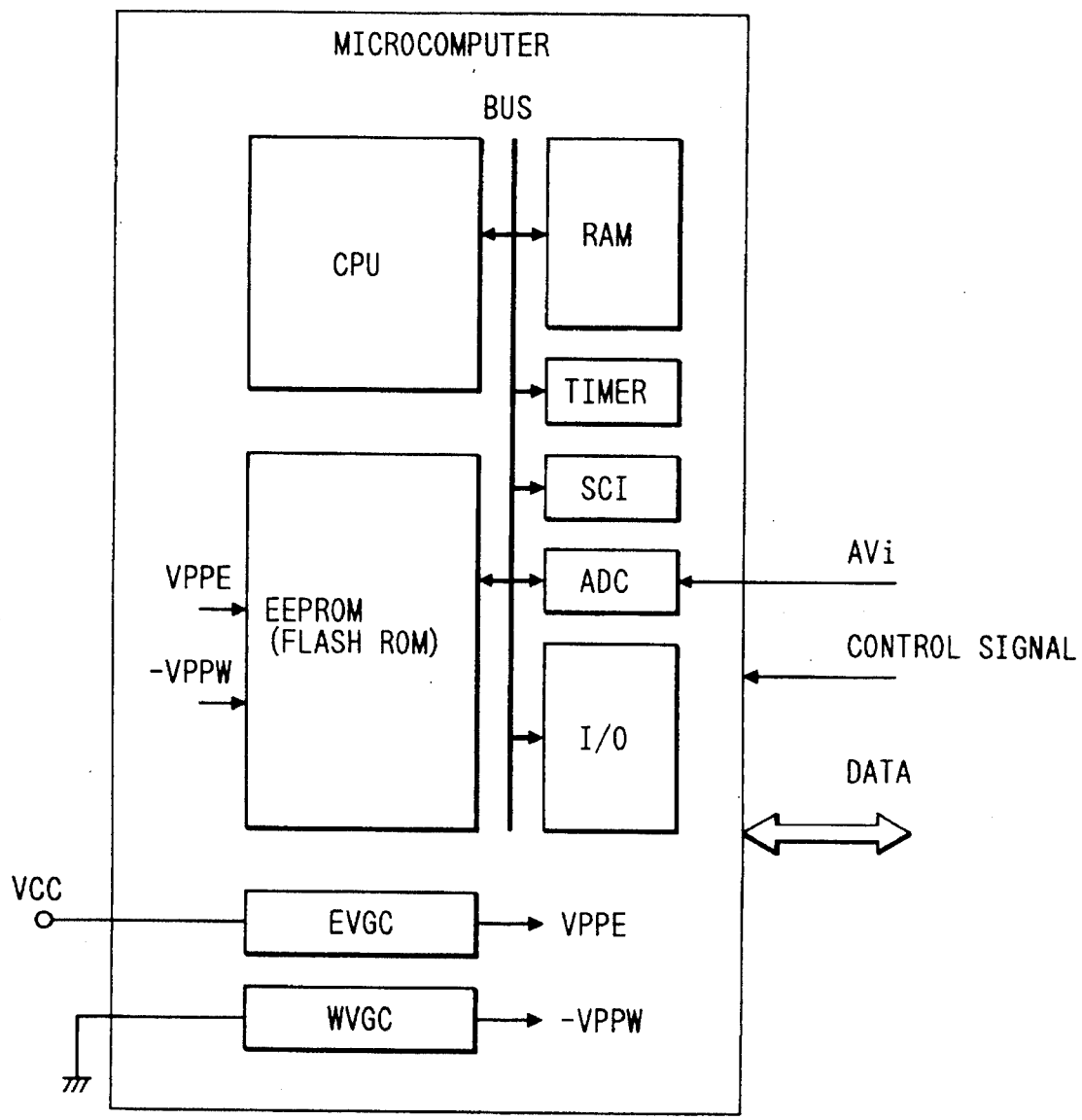
FIG. 33 is a block diagram showing one embodiment of a one-chip microcomputer having a nonvolatile memory device packaged therein according to the present invention.

FIG. 33 is a block diagram showing one embodiment of a one-chip microcomputer having a nonvolatile memory device packaged therein according to the present invention. In this embodiment, there are additionally provided as the memory circuit the aforementioned nonvolatile memory device EEPROM and the RAM (i.e., Random Access Memory).

The EEPROM is stored with a program for data processing of the microprocessor CPU. This program can be electrically rewritten so that it can be corrected and modified by debugging. The program can be added according to the extension of the system. As the peripheral circuits, there are provided a timer circuit TIMER, a serial communication interface SCI, an analog/digital converter ADC and an input/output circuit I/O. Reference letters EVGC designate an erase voltage generating circuit, and letters WVGC designate a write voltage generating circuit.

By taking this system structure, the EEPROM can find its suitable application to an IC card because it can be rewritten on the system and is nonvolatile. Specifically, the IC card can make the necessary memory data nonvolatile without being energized by any battery.

FIGS. 34 to 36 are sections showing the structure of one embodiment for explaining a process for fabricating a nonvolatile memory device according to the present invention. In FIGS. 34 to 36, there are shown sequentially from the lefthand side a nonvolatile memory (i.e., a flash memory), a writing/erasing N-channel type MOSFET (HNMOS) having a high breakdown voltage, a P-channel type MOSFET (HPMOS), an ordinary N-channel type MOSFET (NMOS) and a P-channel MOSFET (PMOS).

As shown in FIG. 34A, the individual semiconductor regions of first $N^-$-type well 2, second $N^-$-type well 3 and $P^-$-type well 4 are formed on a $P^-$-type semiconductor substrate 1 by the well-known technique of fabricating the MOS integrated circuit.

As shown in FIG. 34B, ①: a thick field insulating film 5 and a P-channel stopper 6 are formed the latter below the former at substantially the same step of the well-known technique.

②: There is established a sacrificially oxidized film (of 20 to 23 nm), through which is injected an impurity (of boron) for controlling the threshold voltages of the flash memory and the MOSFET having the high breakdown voltage by the ion implantation.

③: The sacrificially oxidized film is removed to form a clean gate insulating film 7 for the gate insulating film of the MOSFET having the high breakdown voltage. The gate insulating film 7 is given a thickness of 30 to 40 nm by the thermal oxidizing method at 800° to 900° C.

In FIG. 34C, ①: the gate insulating film 7 on the flash memory forming region is removed by using a photoresist as the mask.

②: After the photoresist has been removed, a sacrificial oxidation (of 10 to 15 nm) is performed to clear the contamination of the semiconductor substrate surface exposed at the removing step ①.

③: There is formed a clean first gate insulating film 8 for the tunnel oxide film of the flash memory. This first gate insulating film 8 is given a thickness of about 8 nm by the thermal oxidation at 800° to 850° C.

In FIG. 34D, ①: there is deposited a first conductor layer 9 for the floating gate of the flash memory and the gate electrode having the high breakdown voltage. This first conductor layer 9 is formed of a polycrystalline silicon film prepared to have a thickness of 200 to 300 nm at a temperature of 600° to 650° C. During or after the deposition, phosphor is injected to give a low resistance (of 60 to 120 $\Omega/\Box$). In case the phosphor is injected after the deposition, a thermal diffusion is performed at 850° to 900° C.

②: An insulating film 10 is deposited. This insulating film 10 is a passivation film for injecting an impurity or forming a side wall, as will be described hereinafter, and is formed of the $SiO_2$ or $Si_3N_4$ prepared by the CVD method or their laminated film.

③: The insulating film 10 and the first conductor layer 9 are simultaneously patterned by using a photoresist as the mask to form the floating gate of The flash memory and the gate electrode of the high-breakdown voltage MOSFET. At this time. The first conductor layer 9 and the insulating film 10 for forming the ordinary MOSFET are left.

④: The first gate insulating film 8 is removed from the area of the flash memory forming region, which is not covered with the first conductor layer 9 and the insulating film 10.

⑤: An insulating film 11 is deposited. This insulating film 11 is a passivation film for introducing an impurity and is made of the $SiO_2$ of 10 to 20 nm, which is formed by the CVD method.

⑥: A heat treatment is carried out in an oxidizing atmosphere to form thermally oxidized films at the end portions of the floating gate thereby to eliminate the damage received at the patterning time and to reinforce the end portions. This step may be executed before the aforementioned step ⑤.

⑦: There is formed an $N^-$-type semiconductor region 12 having a high impurity concentration for the first region of the buried data line of the flash memory. This $N^+$-type semiconductor substrate 12 is formed by injecting an impurity only into one end portion (i.e., the lefthand side of the drawing) of the floating gate by using the photoresist as the mask. This injection is performed with arsenic and/or phosphor in a concentration of $1\times10^{15}$ to $5\times10^{15}$ $cm^{-2}$ by the ion implantation of an acceleration energy of 50 to 80 KeV.

⑧: The $N^+$-type semiconductor region 12 is extended by the heat treatment of 900° to 950° C.

⑨: There is formed an $N^-$-type semiconductor region 13 having a low impurity concentration for the second region of the buried data line of the flash memory and the source and drain of the high-breakdown voltage MOSFET. This $N^-$-type semiconductor region 13 is doped with phosphor in a concentration of about $1\times10^{13}$ $cm^{-2}$ by the ion implantation of an acceleration energy of 50 to 80 KeV. For this implantation, the impurity may be injected all over the surface without using any photoresist, although not especially limitative thereto. In this case, the impurity is injected into the high-breakdown voltage P-channel MOSFET region. Then, there is formed a $P^-$-type semiconductor region 14 having a low impurity concentration for the source and drain of the high-breakdown voltage P-channel MOSFET. The $P^-$-type semiconductor region 14 is doped with boron in an concentration of $1\times10^{13}$ to $3\times10^{13}$ $cm^{-2}$ by the ion implantation of an acceleration energy of 10 to 20 KeV. Here, in case the aforementioned $N^-$-type semiconductor region 13 is formed all over the surface, the impurity concentration is determined to compensate it.

Figure 35A:
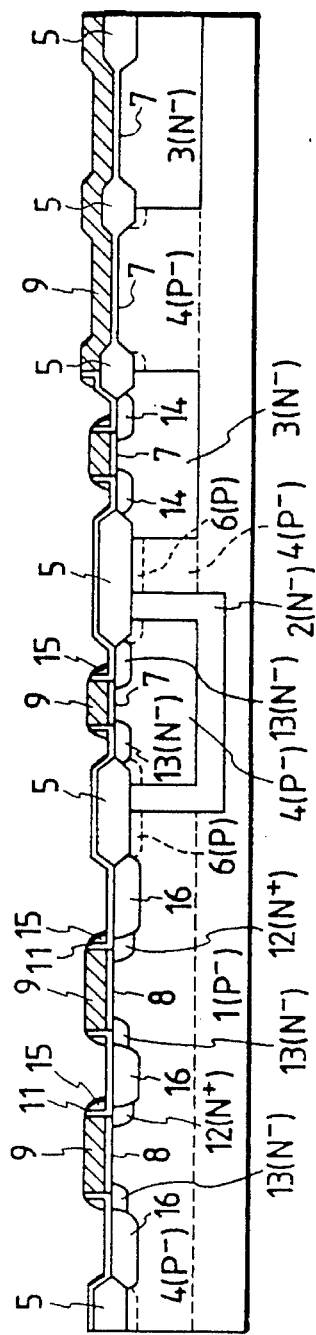
FIGS. 35A to 35C are sections showing another portion of the structure of the embodiment for explaining a process for fabricating a nonvolatile memory device according to the present invention.

In FIG. 35A, ①: after the $SiO_2$ or $Si_3N_4$ has been formed by the CVD method, side wall spacers 15 are formed by the anisotropic etching method. At this time, the etching may be carried out while leaving the insulating film 10 partially.

②: The buried data line portion of the flash memory is formed with an $N^+$-type semiconductor region 16 having a high impurity concentration. This $N^+$-type semiconductor region 16 acts to reduce the parasitic resistance of the buried data lines and is formed by injecting arsenic in about $1\times10^{15}$ to $5\times10^{15}$ $cm^{-2}$ with an acceleration energy of 50 to 80 KeV by the ion implantation method using a photoresist as the mask.

Figure 35B:
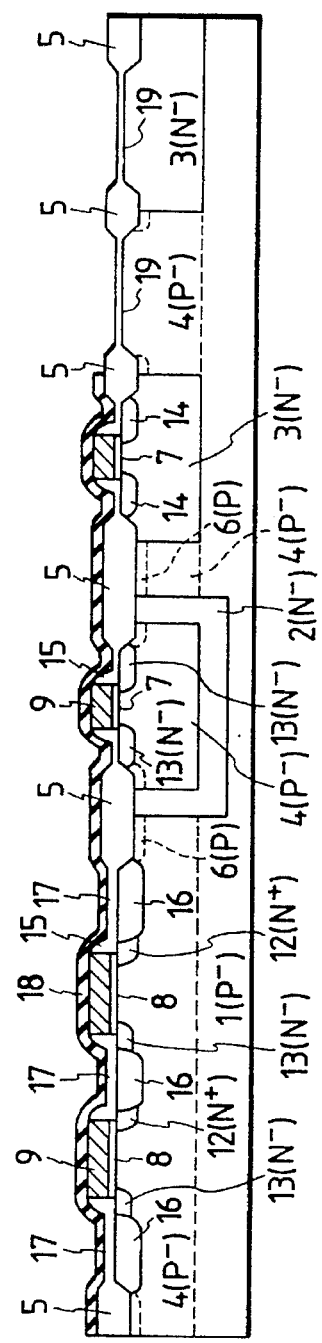

In FIG. 35B, ①: there is formed a second gate insulating film 18 for the flash memory. In case the insulating film 10 is left over the floating gate, the second gate insulating film 18 is not formed before the insulating film 10 is removed. The second gate insulating film 18 is formed of either two layers of $SiO_2$ and $Si_3N_4$ or four layers of $SiO_2$—$Si_3N_4$—$SiO_2$—$Si_3N_4$. The two-layered film is composed of the thermally oxidized film (of 10 nm) which is formed at a temperature of 900° to 950° C. from the first conductor layer 9 for the floating ate, and the $Si_3N_4$ film (of 20 nm) which is formed over the former by the CVD method. The four-layered film is composed of the thermally oxidized film (of 3 to 6 nm) which is formed at a temperature of 900° to 950° C. from the $Si_3N_4$ film over the two-layered film, and the $Si_3N_4$ film (of 10 to 15 nm) which is formed over the former by the CVD method. At this time, at the time of forming the thermally oxidized film for the first conductor layer, the thermally oxidized film of 50 to 70 nm is formed on the surface of the $N^+$-type semiconductor region 16 having the high impurity concentration.

②: The second gate insulating film of the region for forming the ordinary MOSFET and the first conductor layer 9 are removed by using a photoresist as the mask.

③: The gate insulating film 7 is removed by using the uppermost $Si_3N_4$ of the second gate insulating film 18 as the mask.

④: A sacrificially oxidized film (of 10 to 15 nm) is formed in the region for forming the ordinal MOSFET by using the aforementioned $Si_3N_4$ as the mask, and an impurity (of boron) for controlling the threshold voltage of the ordinary MOSFET is injected by the ion implantation through that sacrificially oxidized film.

Figure 35C:
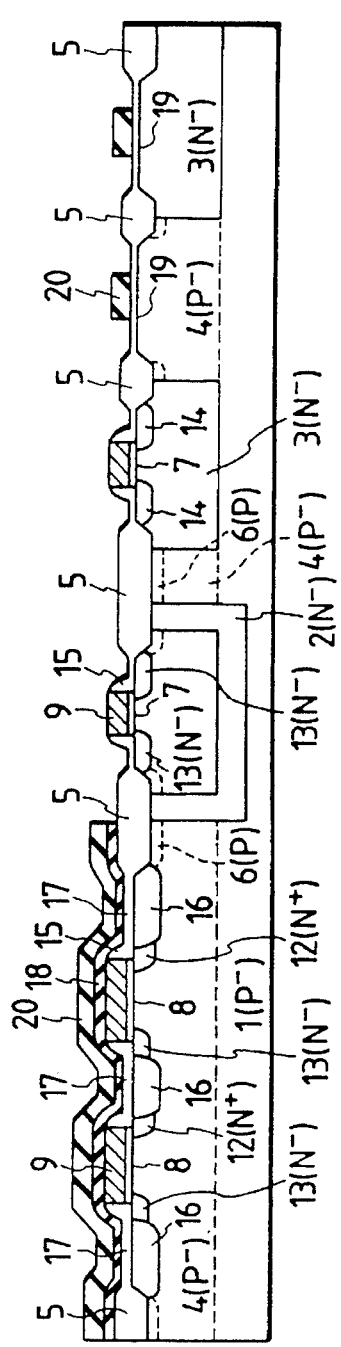

In FIG. 35C, ①: there is formed a second conductor layer 20 for the control gate of the flash memory and the gate electrode of the ordinary MOSFET. The second conductor layer 20 is composed of three layers of a polycrystalline silicon film, a silicide film and an insulating film, and the polycrystalline silicon film is formed like the first conductor layer. The silicide film is made of the $WSi_2$ film (of 150 to 200 nm) which is formed by the CVD method or the sputtering method. The insulating film is made of the $SiO_2$ film which is formed by the CVD method.

②: The second conductor layer 20, the second gate insulating film 18 and the first conductor layer 9 of the flash memory portion are patterned by using a photoresist as the mask to form the control gate (or the word lines).

③: Between the buried data lines between the elements which are not formed with the floating gates shown in FIG. 3 and the like, there is formed a P-type channel stopper layer (although not shown in FIG. 35C). This channel stopper layer is formed by implanting ions of boron in a concentration of about $1\times10^{13}$ $cm^{-2}$ with the acceleration energy of 10 to 20 KeV.

④: The gate electrode 20 of the ordinary MOSFET is patterned by using a photoresist as the mask.

Figure 36A:
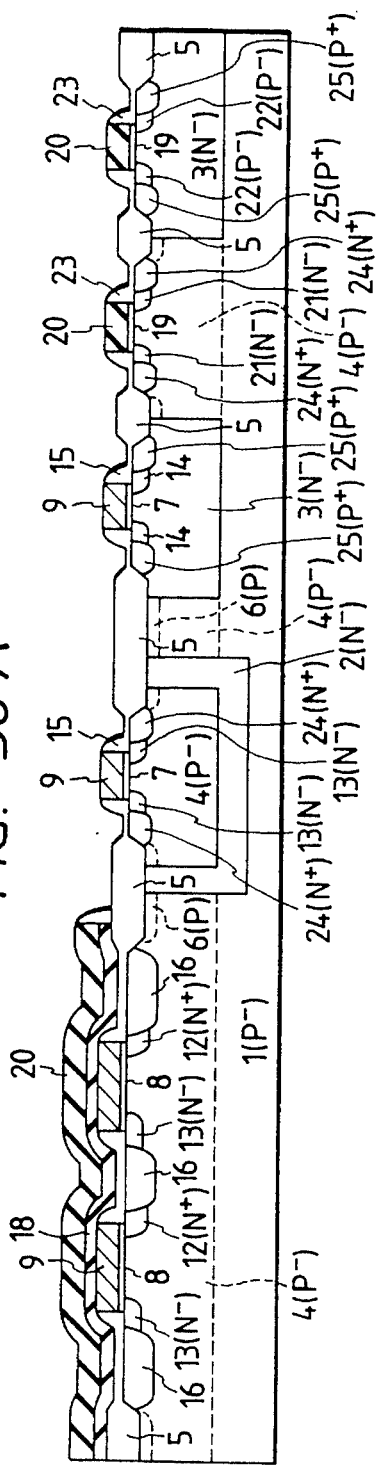
FIGS. 36A and 36B are sections showing the remaining portion of the structure of the embodiment for explaining a process for fabricating a nonvolatile memory device according to the present invention.

In FIG. 36A, ①: there are formed an $N^-$-type semiconductor region 21 and a $P^-$-type semiconductor region 22 having low impurity concentrations for forming the source and drain of the ordinary MOSFET. The $N^-$-type semiconductor region 21 is formed by injecting phosphor in a concentration of $1\times10^{13}$ to $3\times10^{13}$ $cm^{-2}$ by the ion implantation method of an acceleration energy of 50 to 80 KeV. The $P^-$-type semiconductor region 22 is formed by injecting boron in a concentration of $1\times10^{13}$ to $3\times10^{13}$ $cm^{-2}$ by the ion implantation method of an acceleration energy of 10 to 20 KeV.

②: A side wall 23 is formed as in FIG. 35A.

③: There are formed an $N^-$-type semiconductor region 24 and a $P^-$-type semiconductor region 25 having high impurity concentrations for forming the source and drain of the high-breakdown voltage MOSFET and the ordinary MOS- FET. The N⁺-type semiconductor region 24 is formed by injecting arsenic in a concentration of $1 \times 10^{15}$ to $5 \times 10^{15}$ cm$^{-2}$ by the ion implantation of an acceleration energy of 50 to 80 KeV. The P⁺-type semiconductor region 25 is formed by injecting boron in a concentration of $1 \times 10^{15}$ to $5 \times 10^{15}$ cm$^{-2}$ by the ion implantation of an acceleration energy of 10 to 20 KeV.

Figure 36B:
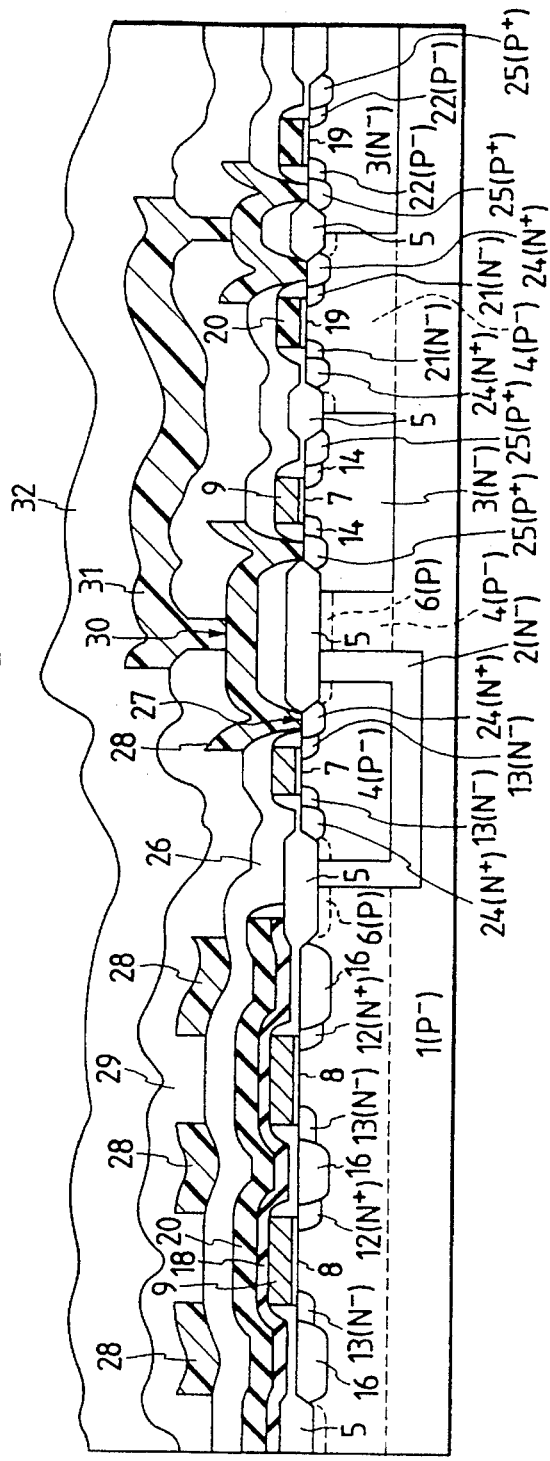

In FIG. 36B, ①: an insulating film 26 is formed. This insulating film 26 is composed of either a single-layered film of SiO₂, PSG or BPSG, or a laminated film of them, which is prepared by the CVD method.

②: A through hole 27 is formed.

③: A first wiring layer 28 is formed. This first wiring layer 28 is composed of either a silicide film of MoSi₂, WSi₂ or TiSi₂, or a laminated film having an Al layer sandwiched between TiW and TiN films. The first wiring layer 28 is connected at a predetermined spacing (of eight memory cells, for example) with the buried data lines. Thus, the data lines have their substantial parasitic resistance reduced.

④: An insulating film 29 is formed. This insulating film 29 is composed of a laminated film having a spin-on-gram film sandwiched between the SiO₂ films which are prepared by the plasma CVD method.

⑤: A through hole 30 is formed.

⑥: A second wiring layer 31 is formed like the first wiring layer 28.

⑦: A final passivation film 32 is formed. This final passivation film 32 is composed of either a SiN₄ film prepared by the plasma CVD method or a laminated film having a PSG or SiO₂ film below the former.

Figure 37A:
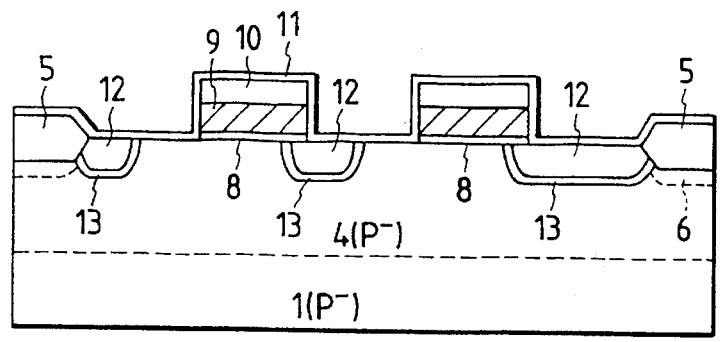
FIGS. 37A to 37C are sections showing a portion of the structure of another embodiment for explaining a process for fabricating a nonvolatile memory device according to the present invention.

FIG. 37 presents sections showing the structure of another embodiment for explaining a process for fabricating a nonvolatile memory device according to the present invention. In FIG. 37A, the N⁻-type semiconductor region 13 having the low impurity concentration is at the same time of the step ⑦ of FIG. 34D, to provide the so-called "dual structure".

Figure 37B:
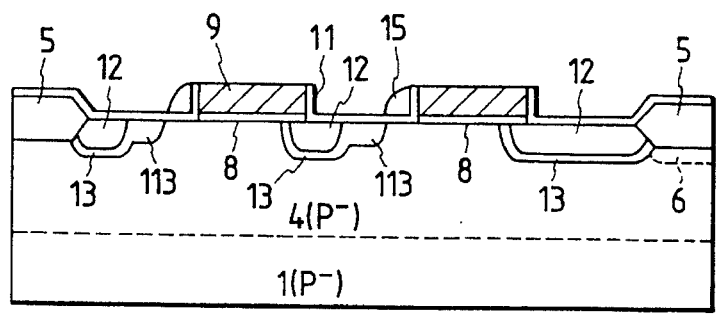

In FIG. 37B, ①: the side wall spacer 15 at the end portion of the floating gate to contact with the N⁺-type semiconductor region 16 is removed after the step ① of FIG. 35A.

②: An N⁻-type semiconductor region 113 having a low impurity concentration is formed by a method similar to that of the step ⑨ of FIG. 34D.

Figure 37C:
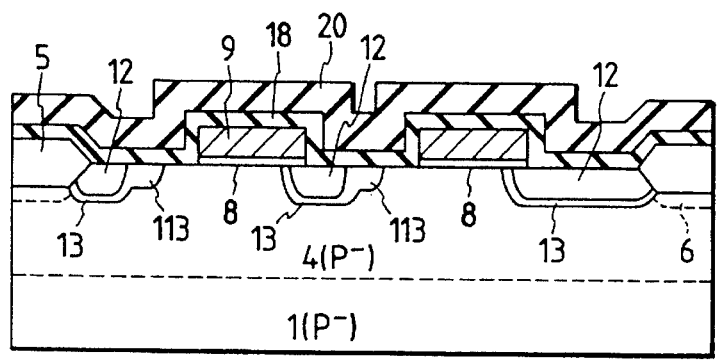

In FIG. 37C, the second gate insulating film 18 and the second conductor layer 20 are formed by methods similar those of FIG. 35B and the like.

Figure 38:
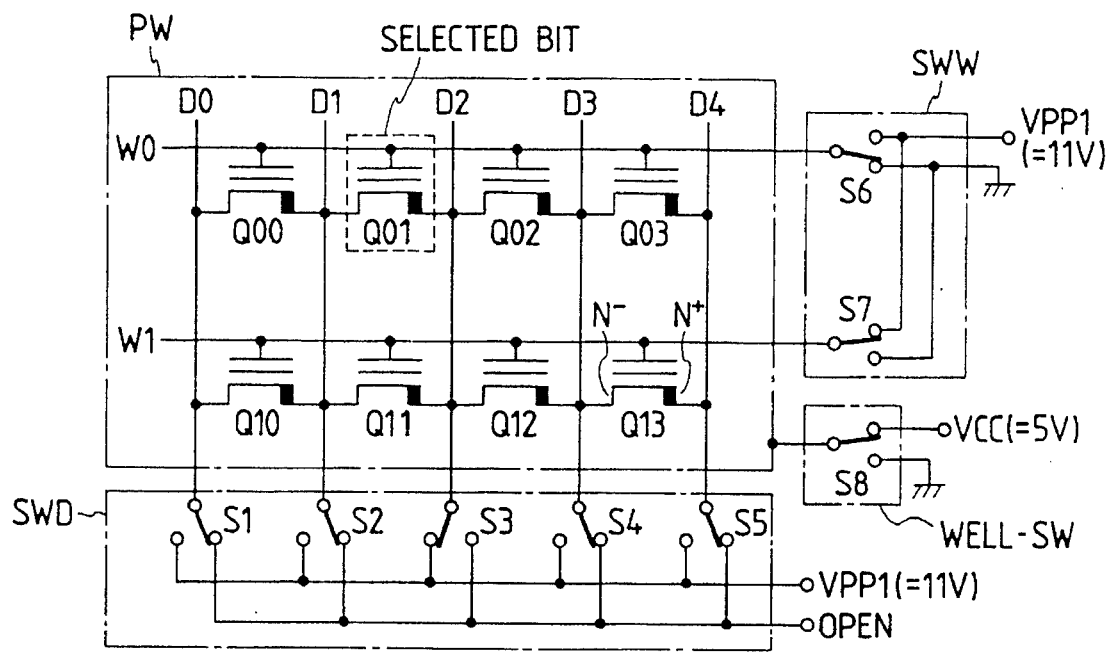
FIG. 38 is a circuit diagram for explaining another embodiment of the writing operation of the memory array corresponding to the embodiment of FIG. 1.

FIG. 38 is a circuit diagram for explaining another embodiment of the writing operation of the memory array corresponding to the foregoing embodiment of FIG. 1. In this embodiment, the writing operation is carried out with a positive voltage only. In this embodiment, too, the writing operation is termed like before to extract the electrons from the floating gates FG of the memory cells to the source lines by the F-N tunneling of electrons, but a positive voltage VPP1 is used in place of the negative voltage –VPPW.

In case the writing operation is carried out for the selected bit of the memory cell Q01 by selecting the word lines W0 from the word lines W0 and W1, as exemplified, and the data lines D1 and D2 from the data lines D0 to D4, as exemplified, the selected word lines W0 is supplied with the ground potential of the circuit such as 0 V by the switch S6 of the word line switch SWW. The unselected word line such as the word lines W1 is supplied with the voltage VPP1 by the switch S7 or the like. This voltage VPP1 is set to a potential as high as about 11 V.

The data lines D1 is fed with the floating (OPEN) state or the circuit ground potential GND by the switch S2 of the data line switch SWD. On the other hand, the data lines D2 is supplied with the aforementioned high voltage VPP1 by the switch 3. The unselected data lines D0, D3, D4 and the like are fed like before with the floating state or the circuit ground potential by the switches S1, S3, S4 and the like.

In this embodiment, the electrons are released from the floating gates of the memory cells of the selected bits to the data line D2 by making the potentials of the unselected word lines or the selected data lines higher than that of the selected word line. In accordance with these operations, the memory mat is formed in the P-type well PW, as indicated by single-dotted lines in FIG. 38, and is fed with a bias voltage such as the power source voltage VCC by the well switch WELL-SW.

In this state, the selected memory cell Q1 is supplied with a large voltage between the word line (or the control gate) and the buried data line D1 so that the electrons tunnel from the floating gate to the buried data line D2. The unselected memory cells have no electron tunneling because what is applied to their first gate insulating films is the substrate potential of 5 V or (11 V–5 V) at most.

Figure 39:
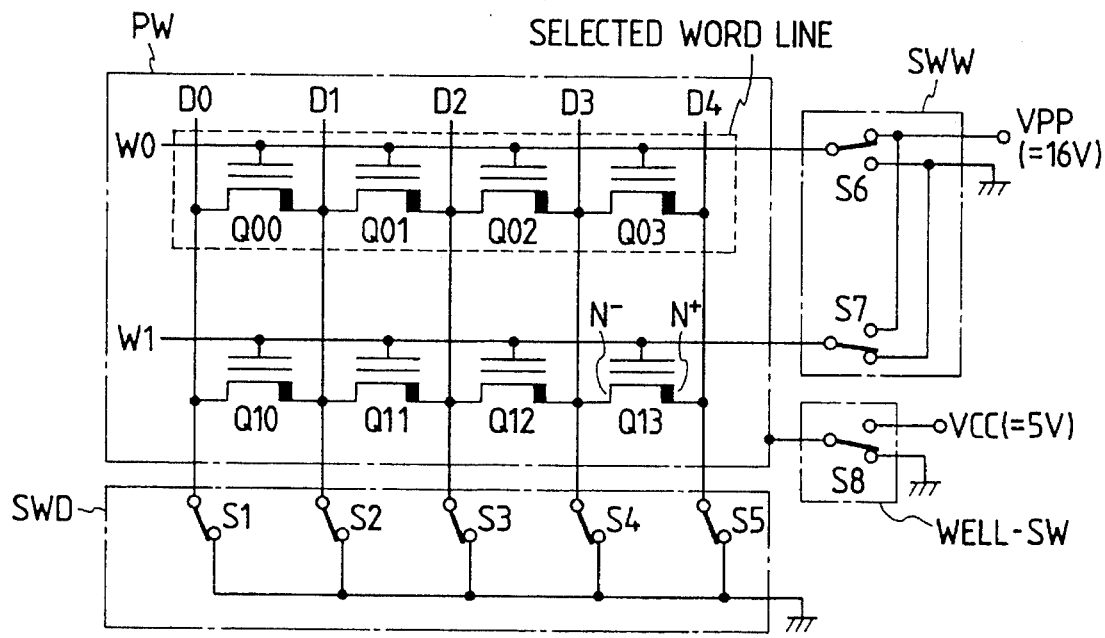
FIG. 39 is a circuit diagram for explaining another embodiment of the erasing operation of the memory array corresponding to the embodiment of FIG. 1.

FIG. 39 is a circuit diagram for explaining another embodiment of the erasing operation of the memory array corresponding to the foregoing embodiment of FIG. 1. In this embodiment, the erasing operation is carried out by a positive voltage only. In this embodiment, too, the erasing operation is termed to inject electrons into the floating gates FG of the memory cells by the F-N tunneling of electrons, but a positive voltage VPP such as 16 V is used in place of the high voltage VPPE of 12 V.

In the case in which word line W1 is selected from the word lines W0 to W1, as exemplified, so that all the memory cells connected therewith may be erased altogether, the selected word line W0 is supplied with a positive high voltage such as VPP by the switch S6 of the word line switch SWW. This voltage VPP is set to a level such as 16 V. The unselected word line such as W1 is fed with the ground potential of the circuit by the switch S7 or the like. All the data lines D0 to D4 are fed with the circuit ground potential by the switches S1 to S5 of the data line switch SWD. The well PW is fed with a bias voltage such as the circuit ground potential by a well switch WELL-SW.

In this state, the F-N tunneling of electrons is established in the first gate insulating film so that electrons are injected into the floating gates from the N⁺-type layer and the surface inversion layer N of the substrate P. As a result, the memory cells Q00 to Q03 are given a high threshold voltage of about 5 V. At this time, the unselected word lines are not fed with the same ground potential as that of the data lines or substrate so that the aforementioned tunneling of electrons is not established to leave the memory cells Qj0 to Qj3 in the initial storing states.

The erasing operation described above is carried out at the unit of word line, and the stored data of the memory cells connected with a plurality of or all the word lines may be erased altogether by setting those word lines to the erasing high VPPE.

Figure 40:
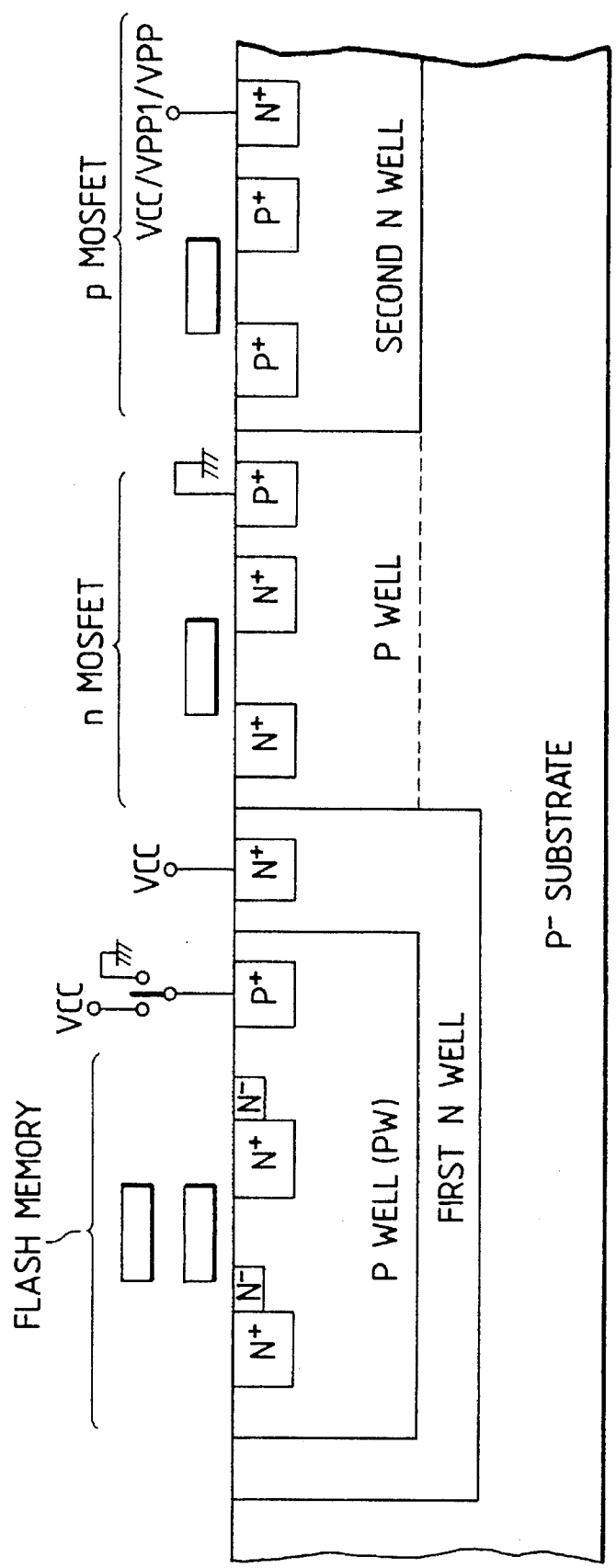
FIG. 40 is a section showing a schematic structure of one embodiment of the nonvolatile memory device for the writing operation and the erasing operation by positive voltages, as shown in FIGS. 38 and 39.

FIG. 40 is a section showing a schematic section of one embodiment of the nonvolatile memory device for the aforementioned writing operation and erasing operation with a positive voltage. The first N-well is formed with a P-well to be formed with the aforementioned memory cells, so that the potential of the P-well having the flash memory (EEPROM) may be switched between the writing operation and the erasing operation. In short, the memory mat portion is formed in the dual well.

In this embodiment, the writing and erasing operations are carried out by using the positive voltage only so that the X-decoder can be simplified to reduce the decoder size. Accordingly, the positive/negative voltages need not be switched to eliminate the negative bias in the X-decoder. The boosters can be commonly exemplified by one booster to simplify the circuit and reduce the power consumption. Specifically, the voltage VPP (of 16 V) may be generated by the booster and dropped to produce the voltage VPP1. This voltage dropping circuit can be exemplified by a level shifter using the threshold voltage of a MOSFET.

Figure 41:
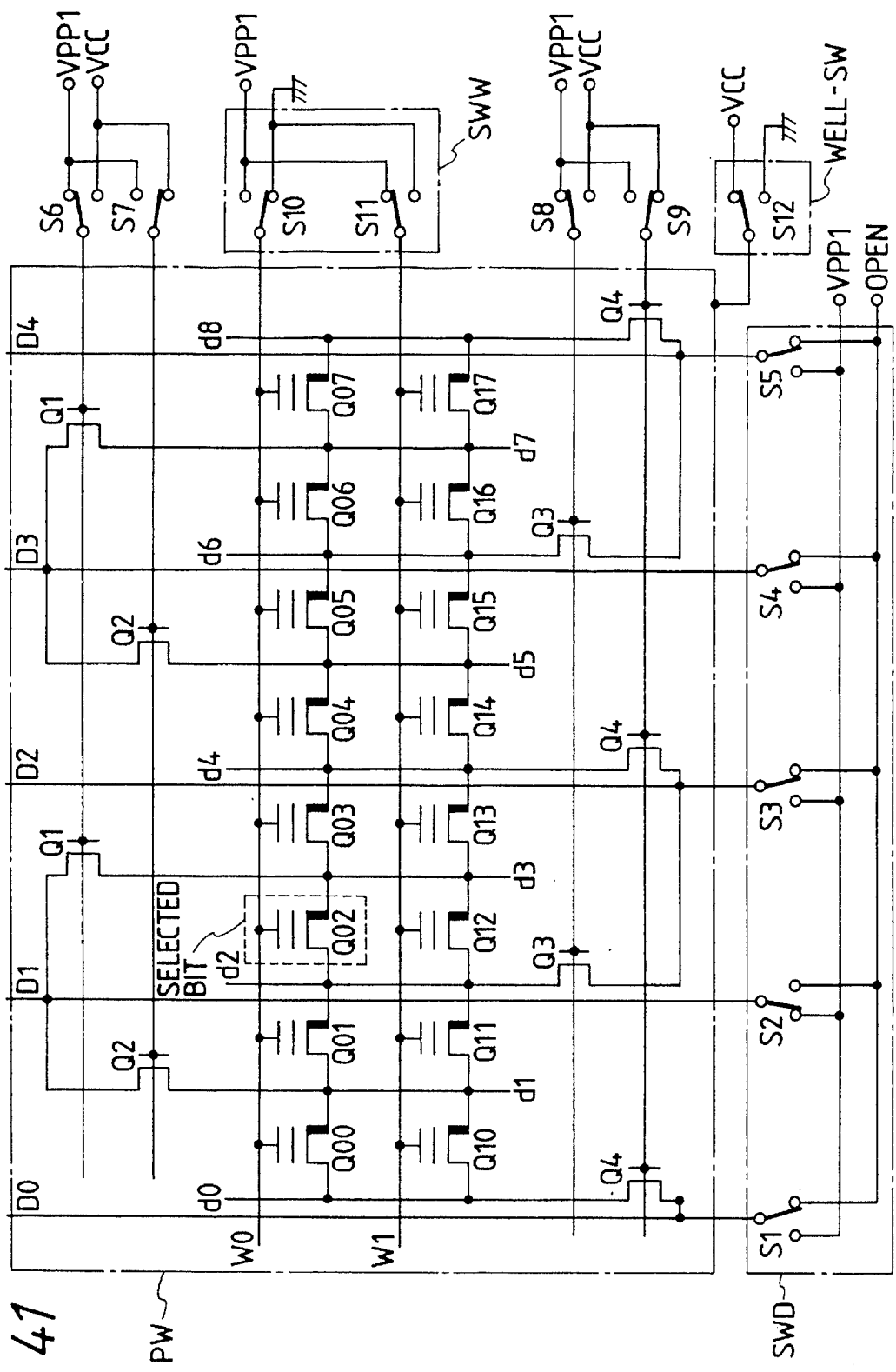
FIG. 41 is a circuit diagram showing another embodiment of the memory array portion of the nonvolatile memory device according to the present invention.

FIG. 41 is a circuit diagram showing another embodiment of the memory array portion of the nonvolatile memory device, according to the present invention, which is subjected to the write operation. In this embodiment, every two buried data lines excepting the main data line D0 at the end are connected with the main data lines D0 to D4 made of aluminum.

Specifically, the odd data lines D1 and D3 of the main data lines D1 to D4 are equipped thereover with the switches Q1 and Q2 to form odd buried data lines d1 and d3, and d5 and d7. The even data lines D2 and D4 of the main data lines D1 to D4 are equipped therebelow with the switches Q3 and Q4 to form even buried data lines d2 and d4, and d6 and d8. The end data line D0 is deemed as the even one and is formed therebelow the switch Q4 to form a buried data line d0.

In the structure described above, each of the main data lines D0 to D4 of aluminum or the like is formed for every two bits (i.e., two buried data lines) As a result, the size in the word line direction is not restricted by the pitch of the main data lines formed of the aluminum layer so that the memory cell size can be reduced.

Switches are provided for selecting the aforementioned buried data lines. The switch MOSFETs Q1 and Q3 corresponding the selected buried data lines have their gates supplied with the high voltage VPP1 by the switches S6 and S8, and the switch MOSFETs Q2 and Q4 corresponding to the unselected buried data lines have their gates fed with the power supply voltage VCC by the switches S7 and S9. In the writing operation, the P-well PW formed with the memory mat is fed with the power source voltage VCC so that the switches Q2 and Q4 of the unselected buried data lines are turned OFF. From now on, the selecting/unselecting voltages are supplied by the word line selecting switch and the data line selecting switch so that the writing operation is carried out as in FIG. 38.

Figure 42:
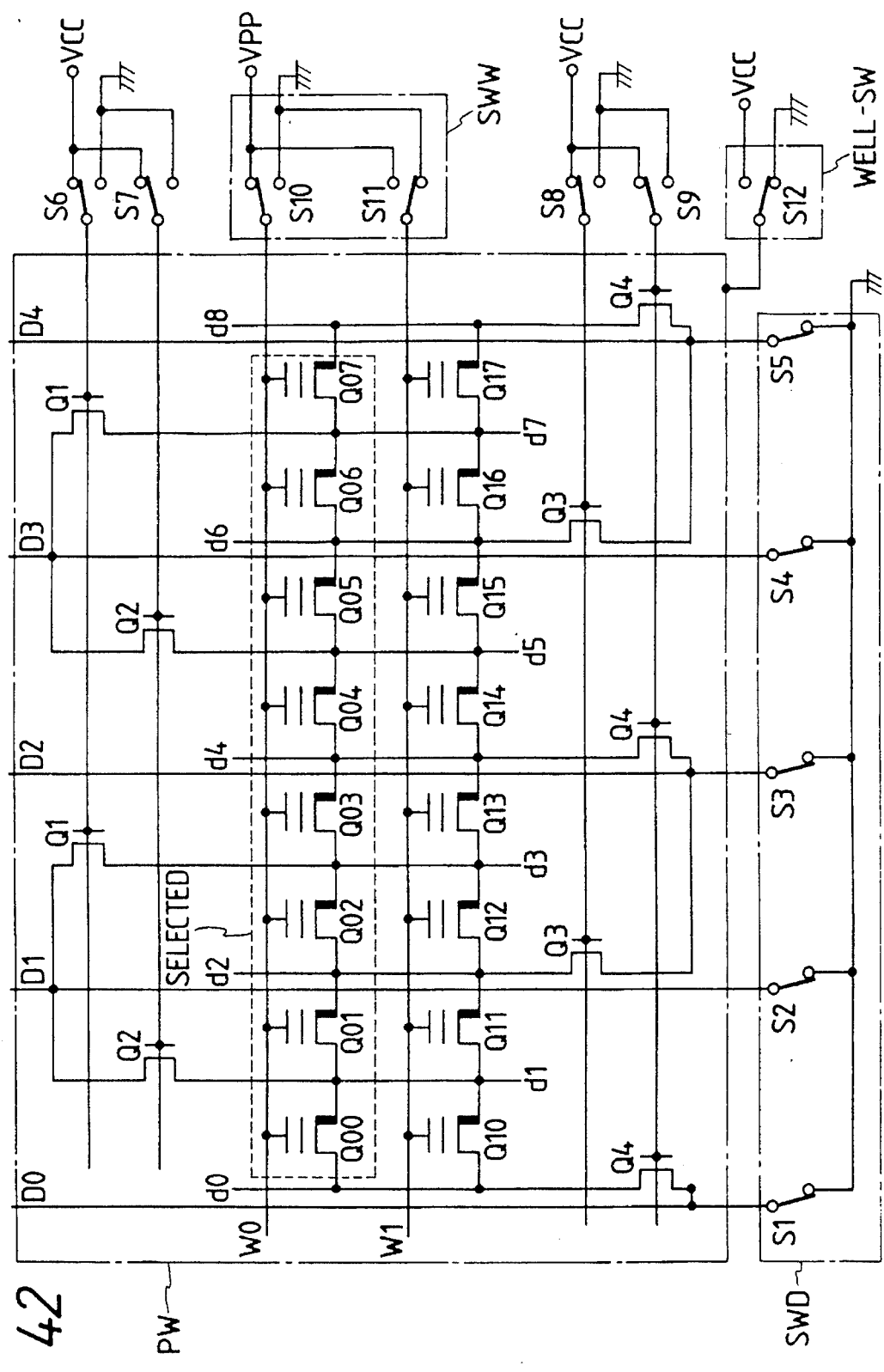
FIG. 42 is a circuit diagram showing one embodiment, in which the erasing operation is carried out by positive voltages for the memory array comprised of main data lines and buried data lines of FIG. 41.

FIG. 42 is a circuit diagram showing one embodiment in case the memory array having the aforementioned main data lines and buried data lines is subjected to the erasing operation by a positive voltage. In this embodiment, the data lines are composed of main data lines and buried data lines. Specifically, in the erasing operation, the switch MOSFETs Q1 to Q4 for selecting the buried data lines have their gates supplied with the power source voltage VCC so that they are turned ON altogether. At this time, the P-well PW is fed with the ground potential of the circuit by a switch S12. From now on, the selecting/unselecting voltages like before are supplied to effect the erasing operation as in FIG. 39 by the word line selecting switch and the data line selecting switch.

Figure 43:
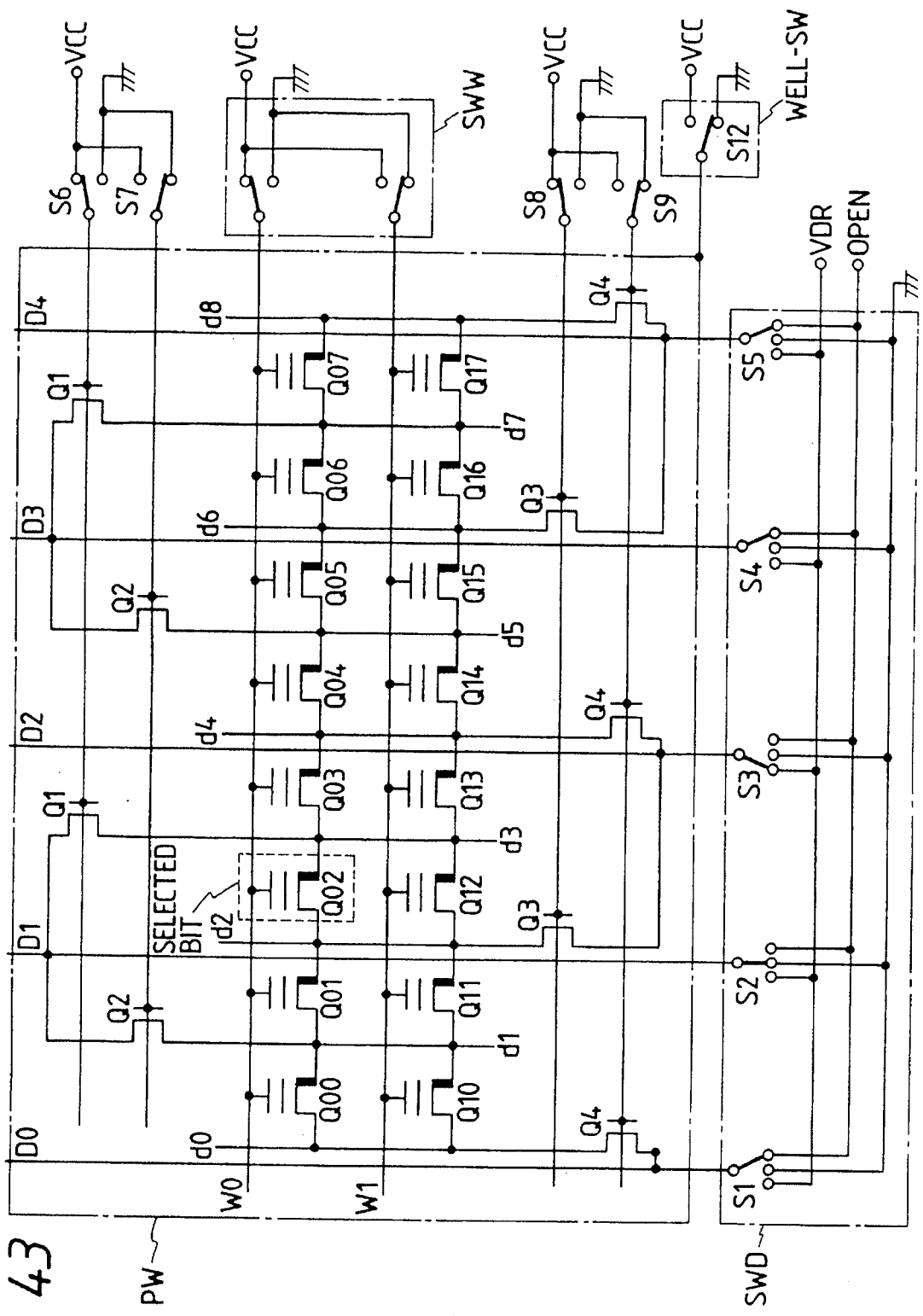
FIG. 43 is a circuit diagram showing one embodiment, in which the reading operation is carried out for the memory array comprised of main data lines and buried data lines of FIG. 41.

FIG. 43 is a circuit diagram showing one embodiment in case the memory array having the aforementioned main data lines and buried data lines is subjected to the reading operation. In this embodiment, the switch MOSFETs Q1 and Q3 are selected as in the writing operation by the buried data line selecting switch. However, the selecting level is at VCC, and the unselecting level is at 0 V. At this time, the P-well PW to be formed with the memory array portion is fed unlike the aforementioned writing operation with the ground potential of the circuit by the switch S12. From now on, the selecting/unselecting voltages like before are supplied to read the memory cells by the word line selecting switch and the data line selecting switch.

Figure 44:
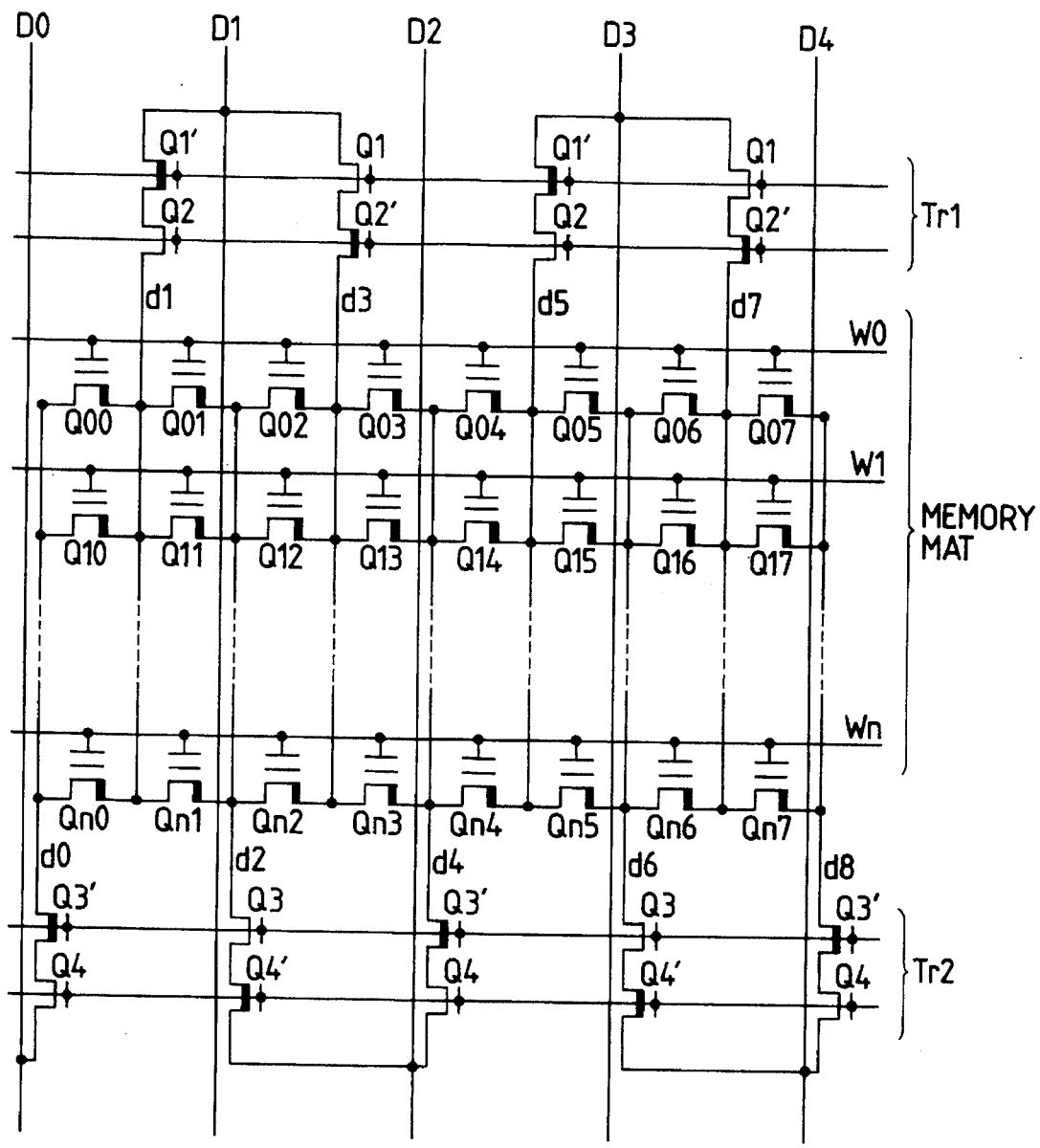
FIG. 44 is a circuit diagram showing another embodiment of the memory array portion comprised of the main data lines and the buried data lines.
Figure 45:
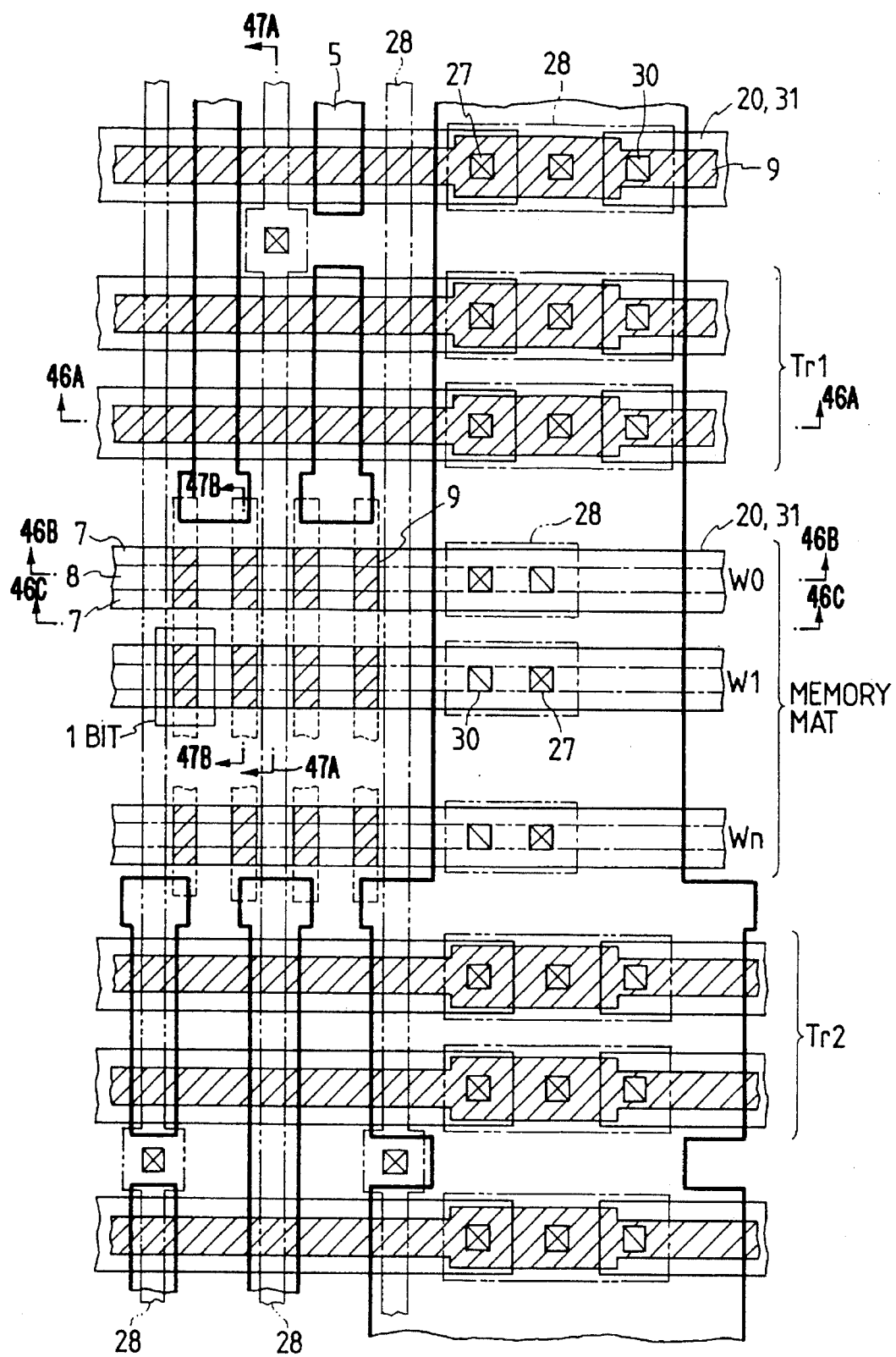
FIG. 45 is a layout diagram showing one embodiment of the memory array portion of FIG. 44.
Figure 46A:
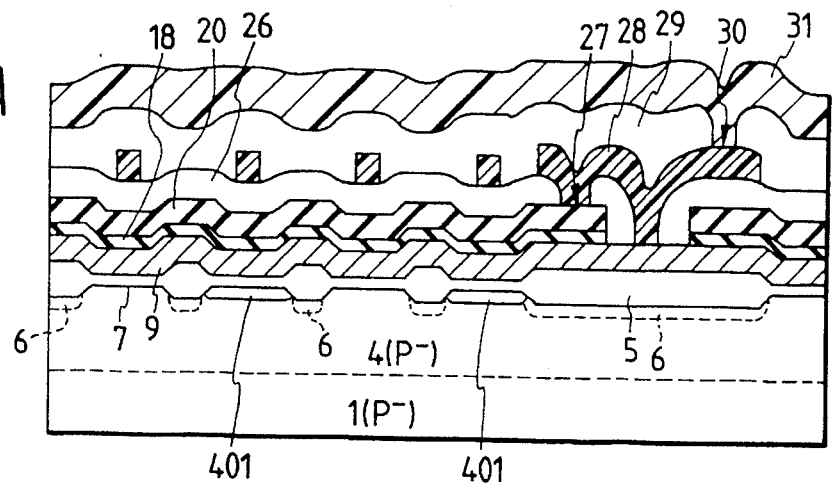
FIGS. 46A to 46C are sections showing the structures of portions of FIG. 45.
Figure 46B:
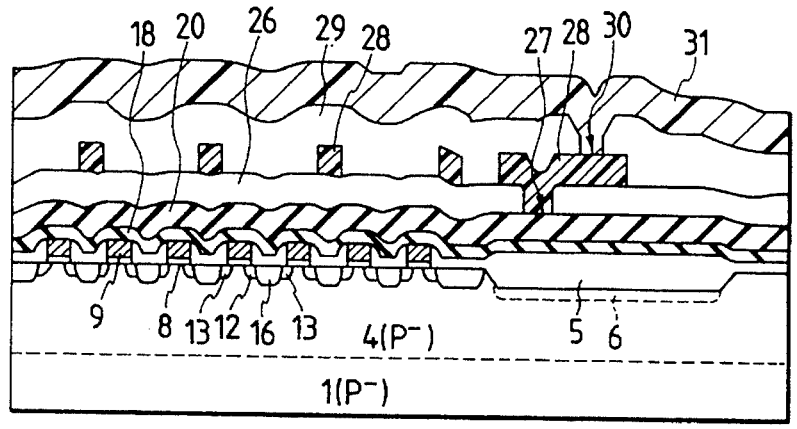
Figure 46C:
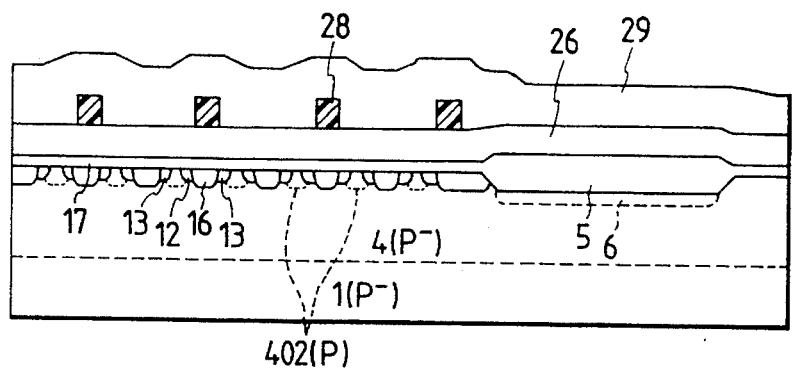

FIG. 44 is a circuit diagram showing another embodiment of the aforementioned memory array portion composed of the main data lines and the buried data lines. FIG. 45 is a top plan layout diagram corresponding to FIG. 44, and FIGS. 46A to 46C and FIGS. 47A and 47B are sections showing the structure and taken along lines 46A—46A, 46B—46B, 46C—46C, 47A—47A and 47B—47B of the aforementioned layout of FIG. 45, respectively.

In this embodiment, switch units (or transfers) Tr1 and Tr2 are constructed to include series circuits of enhancement MOSFETs Q1, Q2, Q3 and Q4 and depletion type MOSFETs Q1', Q2', Q3' and Q4' so as to select one buried data line. This switch structure is similar to the column switch in the cascade type mask ROM of the prior art. Thanks to this switch structure, the layout of the switch unit can be facilitated.

The transfer MOSFETs of the switch units (or transfers) Tr1 and Tr2 for selecting the buried data lines are constructed to include the gate insulating film 7 and the first conductor layer 9 like the high-breakdown voltage MOSFETs. The diffusion layer of the source and drain is formed like the memory cell of the $N^-$-type semiconductor region 13 having the low impurity concentration and the $N^+$-type semiconductor region 16 having the high impurity concentration. The second conductor layer 20 is formed to cover the first conductor layer 9, and these first and second conductor layers 9 and 20 are shunted by the second wiring layer 31 (second aluminum wiring layer). This shunting is performed at a predetermined interval in the region of the field insulating film 5. Every other transfer MOSFETs have their channels formed with N-type semiconductor regions 401 so that they act as the conduction layers independent of the potentials of the depletion type MOSFETs or the gate electrodes.

In the memory portion, the floating gates of the first conductor layer 9 are formed at a spacing below the second conductor layer 20 of the word lines, the N-type semiconductor regions 12, 13 and 16 for the buried data lines are formed between the individual floating gates. The N-type semiconductor regions 12, 13 and 16 are connected through the transfer MOSFETs with the first wiring layer (first aluminum wiring layer) for the data lines.

The word lines are shunted like the transfer MOSFETs by the second wiring layer 31. In the regions between the word lines, the P-type semiconductor regions 402 are formed between the N-type semiconductor regions 12, 13 and 16 to effect the electric isolations (as the punch-through stoppers). The floating gates (i.e., the first conductor 9) have their lower portions composed of the thin gate insulating film 8 for establishing the electron tunneling and the gate insulating film 7 as thick as the high-breakdown voltage MOSFETs so that the floating gates may be given a higher potential by the capacitance coupling effected.

Figure 47A:
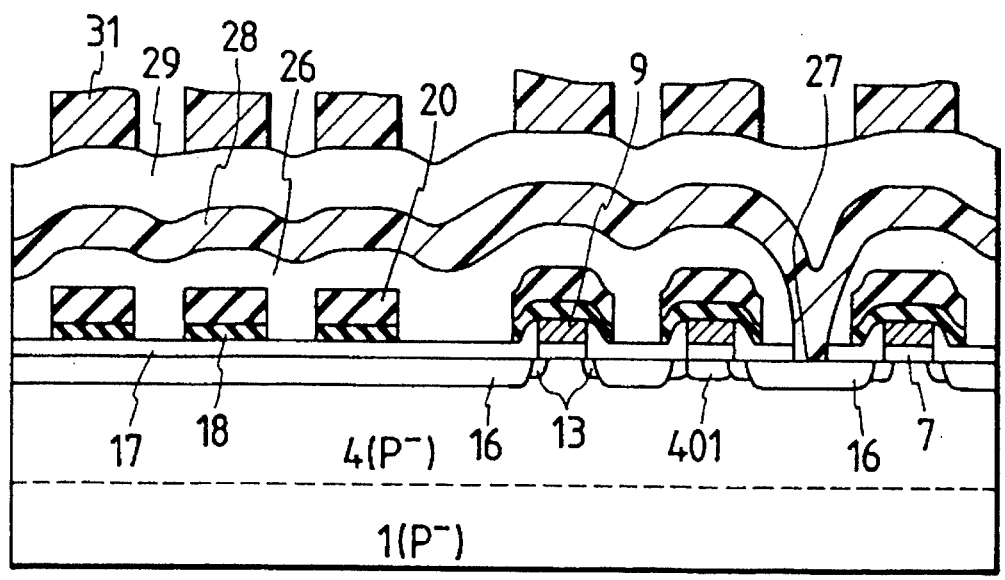
FIGS. 47A and 47B are sections showing the structures of the other portions of FIG. 45.
Figure 47B:
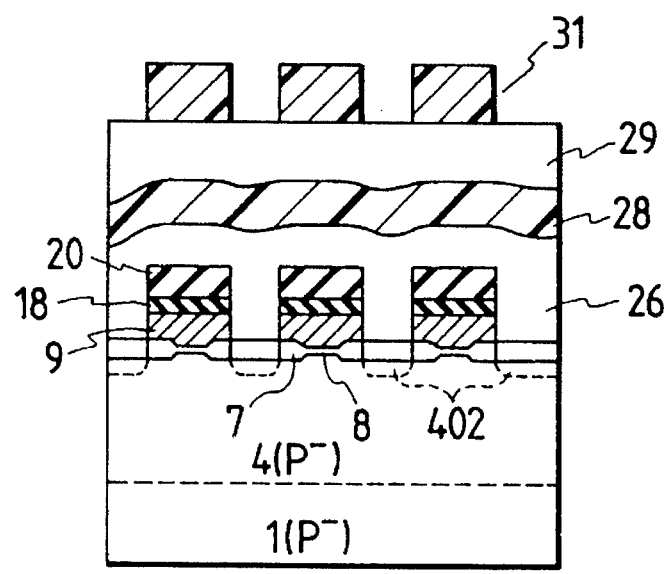

As shown in FIG. 47B, the chin gate insulating film 8 and the thick gate insulating film 7 to be formed below the floating gates for the electron tunneling can be formed in the following manner. On the insulating film of about 20 nm formed on the surface of the semiconductor substrate by the thermal oxidation method, there is formed a silicon nitride method having a thickness of about 50 nm by the CVD method. Next, the silicon nitride film other than the tunneling region is removed by using a photoresist as the mask. The gate insulating film 7 as thick as about 50 to 80 nm is formed by the thermal oxidation method using the aforementioned silicon nitride film as the mask.

After the silicon nitride film has been removed, the thermally oxidized film is removed to form a sacrificially oxidized film (of 10 to 20 nm). After this sacrificially oxidized film has been removed, the gate insulating film 8 having a thickness of about 8 to 10 nm is formed for the tunneling electron insulating film. At this time, the gate insulating film 7 is given a thickness of 30 to 50 nm. At the time of forming the gate insulating film 8, the substrate is not exposed by using the photoresist as the mask so that the gate insulating film 8 formed can have an excellent film quality. In this structure, moreover, a channel is also formed at the reading time below the thick gate insulating film 7. As a result, the memory current is accordingly increased to provide an advantage in the reading operations at a low voltage or at a high speed.

Figure 54:
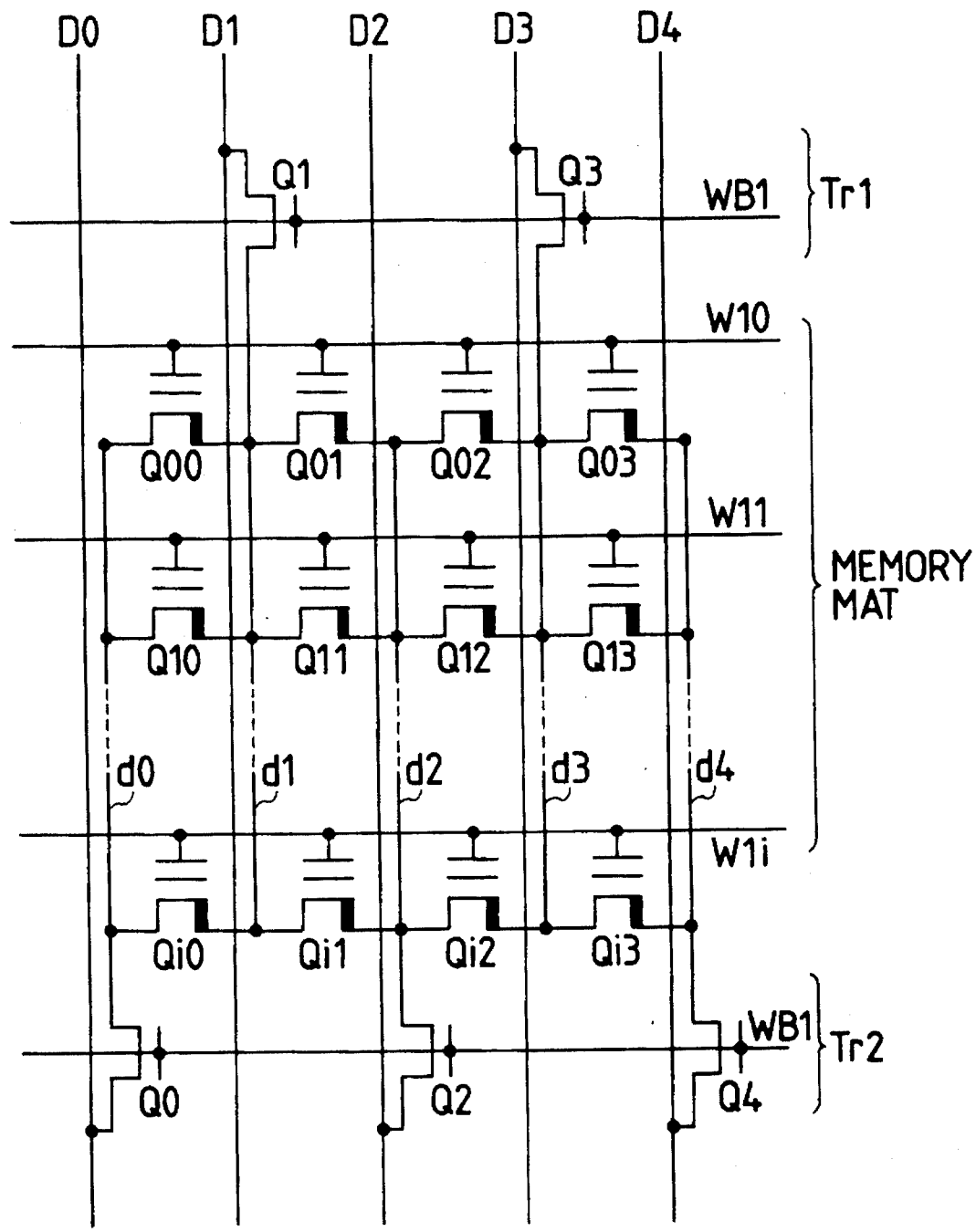
FIG. 54 is a circuit diagram showing still another embodiment of the memory array portion in the nonvolatile memory device according to the present invention.

FIG. 54 is a circuit diagram showing still another embodiment of the memory mat portion in the nonvolatile memory device according to the present invention. In this embodiment, too, the memory mat is formed by dividing the blocks as in FIG. 26. The data lines D0 to D4, as exemplified, are equipped with block selecting switches MOSFETs Q1 to Q4 above and below the memory mat (or block).

Of the data lines D0 to D4, as representatively exemplified, the data lines D1 and D3 bearing the odd numbers are equipped with the switches MOSFETs Q1 and Q3 above the memory mat, as are connected with the block data lines d1 and d3 in the memory mat. On the other hand, the data lines D0, D2 and D4 bearing the even numbers are equipped with the switches Q0, Q2 and Q4 below the memory mat, as are connected with the data lines d0, d2 and d4 in the memory mat.

The block data lines d0 to d4 provided in the memory mat, as exemplified as above, are connected with the memory cells like before. In this structure, the block data lines d0 to d4, as connected with the memory cells, are buried. On the other hand, the data lined D0 to D4, as commonly provided through the aforementioned switch MOSFETs Q1 to Q4, are the main data lines which are made of a metal wiring layer of low resistance of aluminum or the like.

The writing operation is carried out like before by turning ON the switch MOSFETs Q1 to Q4 corresponding to the selected blocks. In the unselected memory block, according to this structure, the block data lines are in the floating state like before so that no stress due to the writing operation is applied.

In the reading operation, the substantial length of the block data lines becomes constant independently of the connected position with the memory cells. Specifically, the block data line d1 at the side of the higher impurity concentration with respect to the memory cell Q00 is connected with the main data line D1 through the switch MOSFET Q1 disposed near itself. The block data line d0 at the side of the lower impurity concentration with respect to the memory cell Q00 is connected at its upper end portion with the main data line D0 through the MOSFET Q0 disposed at the other end.

On the other hand, the intermediate memory cell Qj0 is connected with the main data line D1 through the upper half of the block data line d1 and the switch MOSFET Q1 and with the main data line D0 through the lower half of the block data line d0 and the switch MOSFET Q0. Moreover, the lowermost memory cell Q10 is connected with the main data line D0 through the switch MOSFET Q0 disposed in its vicinity, with the block data line d1 at its lower end portion and with the main data line D1 through the switch MOSFET Q1 at its upper end.

Thus, in one memory cell, one block data line is connected independently of the position of connection. Thus, the parasitic resistance and capacitance of the block data line for selecting the memory cells can be substantially equalized to stabilize the sensing operation. In case the switch MOSFET is disposed above the block, as shown in FIG. 26, the effective length of the block data line can be reduced to zero in the memory cell at the upper end but is twice as long as that of the block data length in the memory cell an the lower end.

In the block division described above, the data line resistances for the block selection can be equalized so that the writing voltage in the write mode can be less dispersed for the memory cell connection positions, to stabilize the writing operation. Moreover, the reading operation can be carried out at a high speed even at a low voltage.

Figure 55:
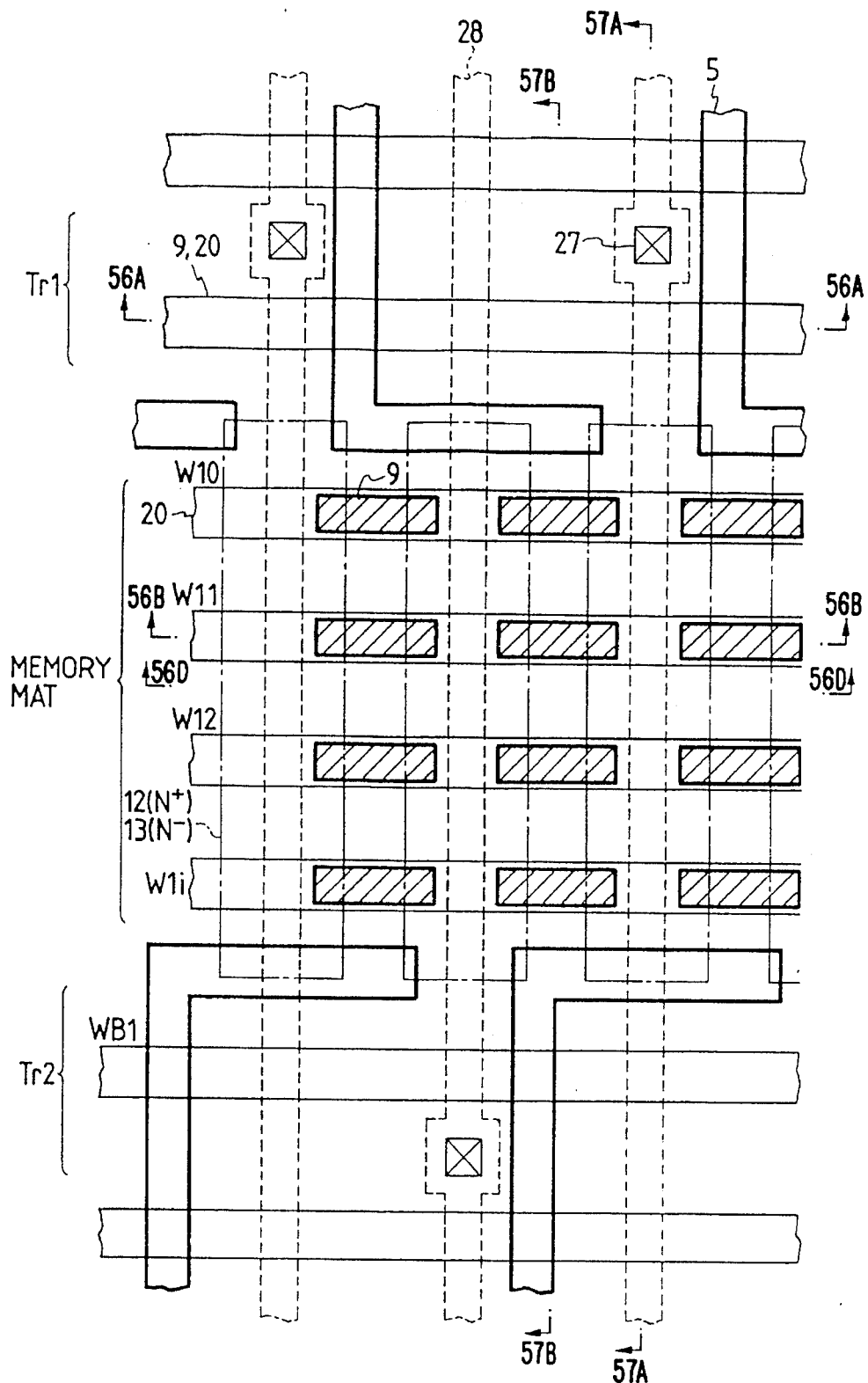
FIG. 55 is a layout diagram showing one embodiment of the memory array portion corresponding to the embodiment of FIG. 54.

FIG. 55 is a layout diagram showing one embodiment of the memory mat corresponding to the embodiment of FIG. 54. As shown, word lines W10 to W1j are arranged to extend transversely. In parallel with these word lines, there are extended above and below the memory mat the block selecting lines WB1 for the upper transfer Tr1 forming the switch MOSFETs Q1 and Q3 and the lower transfer Tr2 forming the switch MOSFETs Q2 and Q4.

In the vertical direction, there is formed the diffusion layer forming the block data lines. Over this diffusion layer, there are arranged the main data lines 28 made of aluminum or the like. Every other main data lines are formed at their upper and lower portions with the contact holes 27. These contact holes 27 are shared between the remaining memory blocks arranged above and below them. In other words, the two switch MOSFETs for selecting two adjacent blocks are commonly connected with the main word lines through one of the contact holes.

On the diffusion layer having the source and drain one of which is given the high impurity concentration whereas the other is given the low impurity concentration, there are arranged the floating gates 9. These floating gates 9 are overlain by the word lines which are formed integrally with the contact gates.

Figure 56A:
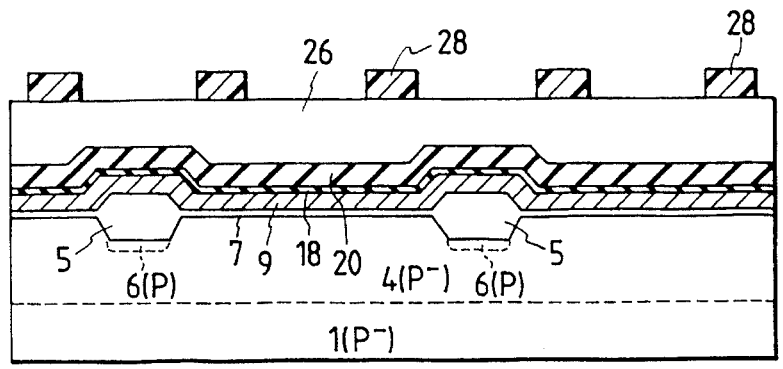
FIGS. 56A to 56D are sections showing the element structures of portions of FIG. 55.

FIGS. 56A to 56D and FIGS. 57A and 57B are sections showing the element structure and taken along section lines 56A—56A, 56B—56B, 56C—56C, 56D—56D, 57A—57A and 57B—57B of FIG. 55, respectively. Of these, FIG. 56A presents a section showing the element structure, as taken in the direction of the arrows in line 56A—56A. This is a section taken in parallel with the block selecting lines, and block selecting lines WB1 are formed by the first conductor layer 9. This first conductor layer 9 is overlain by the second conductor layer 20 through the second gate insulating film 18. These two conductor layers 9 and 20 are suitably connected to reduce the wiring resistance of the block selecting lines, although not especially limitative thereto. For example, the two conductor layers 9 and 20 are connected at the portion corresponding to the righthand side of FIG. 45.

Figure 56B:
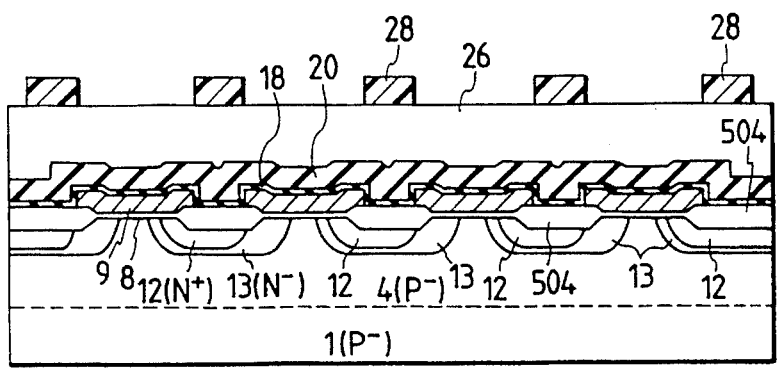

FIG. 56B is a section showing the element structure, as taken in the direction of the arrows in line 56B—56B. This section is in parallel with the word lines. The $N^+$-type semiconductor region 12 is formed in the $N^-$-type semiconductor region 13 so that the floating gate 9 overlaps the outer $N^-$-type semiconductor region 13 only but is extended on the other side to the $N^+$-type semiconductor region 12.

In this embodiment, in order to reduce the parasitic capacitance between the floating gate and the source and drain and to increase the parasitic capacitance between the floating gate and the contact gate, there is formed an oxide film 504 which is relatively thick at the two sides of the floating gates in the word line direction. Thus, the oxide film is formed to increase the size of the floating gates 9 in the word line direction thereby to accordingly increase the parasitic capacitances with the control gates (or word lines) 20 to be formed thereover, but not the parasitic capacitances with the diffusion layers 12 and 13 arranged therebelow, through the oxide film 504 made thicker, as described above. Thanks to this structure, the potential of the floating gates can be raised according to the writing potential coming from the word lines thereby to enhance the writing efficiency.

Figure 56C:
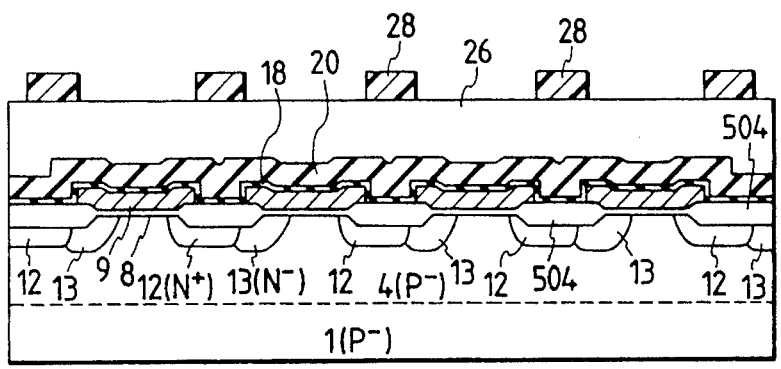

FIG. 56C is a section showing the element structure according to another embodiment. In this embodiment, the $N^-$-type semiconductor region 13 is formed along the aforementioned $N^+$-type semiconductor region 12. This embodiment is similar to that of FIG. 56B excepting the difference in the structure of the source and drain (or block data lines).

Figure 56D:
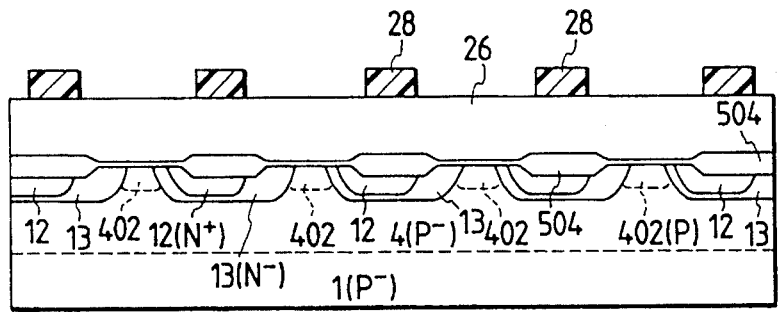

FIG. 56D is a section showing the element structure, as taken in the direction of the arrows in line 56D—56D. This is a section taken in parallel with and between the word lines, thus clarifying the structure between the block data lines. Specifically, the P-type channel stopper regions 402 are formed between the block data lines of the diffusion layers 12 and 13 to prevent the leakage current from flowing between the memory cells adjacent to each other.

In FIGS. 56A to 56D, the reference numeral 28 designates the data (main) lines which are formed of a metal layer of aluminum or the like through the insulating film 26 formed on the second conductor layer 20. The numeral 1 designates the semiconductor substrate, and the numeral 4 designates the well region formed in the portion to be formed with the memory cells. Moreover, the P-type channel stopper is formed below the field insulating film 5.

FIG. 57A is a section showing the element structure and taken in the direction of the arrows in line 57A—57A. This is a section taken along the data lines to clarify the relations among the main data line 28, the block data lines 12 and 13 and the switch MOSFETs. Specifically, the main data line 28 is connected through the through hole 27 with the diffusion layer forming the switch MOSFET. Of the remaining diffusion layers 21 and 24 forming the switch MOSFET, the diffusion layer 24 is extended and connected with the diffusion layers 12 and 13 forming the block data lines. The $N^-$-type semiconductor region 21 having the low impurity concentration is provided for raising the breakdown voltage of the switch MOSFET.

FIG. 57B is a section showing the element structure and taken in the direction of the arrows in line 57B—57B. This a section taken in parallel with and between the data lines to clarify the relations between the memory cells arranged in the data line direction and with the switch MOSFET. Specifically, the memory cells arranged in the memory mat in the data line direction are constructed such that they are formed with the P-type channel stopper regions 402 to prevent any leakage current from flowing between the adjacent memory cells. The semiconductor region 24 of the switch MOSFET at the side of the block data lines is cut by the field insulating film and is extended and connected with the block data lines below the main data lines formed with none of that field insulating film.

The switch MOSFETs have their gates given a width two times as large as the pitch of the block data lines (or buried data lines) 12 and 13. Incidentally, this width includes the width of the blocking and isolating field insulating film 5. Thanks to this large gate width, the switch MOSFETs can have their ON resistances made sufficiently low.

FIGS. 58A to 58C and FIG. 59 are sections showing the steps for explaining a process for fabricating the nonvolatile memory device which has been described with reference to FIGS. 54 to 57. In those Figures, there are shown in addition to the aforementioned flash memory, a high-breakdown voltage N-channel MOSFET (HNMOS), a high-breakdown voltage P-channel MOSFET (HPMOS), an ordinary N-channel MOSFET (NMOS) and an ordinary P-channel MOSFET (PMOS).

In FIG. 58A, ①: as in FIGS. 34A and 34B, the $P^-$-type semiconductor substrate 1 is formed on its main surface with the two $N^-$-type well regions 2 and 3, the $P^-$-type well region 4 and the thick field insulating film 5, and the channel stopper 6 is formed below the filed insulating film 5.

②: A thermally oxidized film 501 is formed, and a silicon nitride film 502 and a silicon oxide film 503 are sequentially formed on the thermally oxidized film 501 by the CVD method. These silicon nitride film 502 and the silicon nitride film 503 are etched off from the region of the buried data lines (or the source and drain diffusion layers) by using a photoresist film as the mask.

③: After this photoresist film has been removed, a mask of a photoresist film is newly formed to form the $N^+$-type semiconductor region 12 having the high impurity concentration by the ion implantation over the one-end sides of the aforementioned silicon films 502 and 503.

④: After this new photoresist film has been removed, the aforementioned $N^+$-type semiconductor region 12 is thermally diffused by the heat treatment. This treatment is to cause the $N^+$-type semiconductor region 12 to overlap the floating gate to be formed later.

⑤: The $N^-$-type semiconductor region 13 having the low impurity concentration is formed by the ion implantation using the silicon nitride film 502 and the silicon oxide film 503 as the mask.

As described above, the buried data lines are made wider at the lightly doped $N^-$-type semiconductor region 13 at one end and narrower at the other end. If the silicon nitride film 502 is made thicker than the mask to be used for the ion implantation of the $N^-$-type semiconductor region 13, the silicon oxide film 503 need not be used. With the structure shown in FIG. 56C, the $N^-$-type semiconductor region 13 may formed at the previous step ⑤ by using a photoresist film as the mask.

In FIG. 58B, ①: after the silicon oxide film 503 has been removed, the relatively thick silicon oxide film 504 of about 200 nm is formed over the buried data lines by the thermal oxidation method using the silicon nitride film 502 as the mask.

②: The silicon nitride film 502 is removed to form the first gate insulating film 8 for the tunnel region of the flash memory and the gate insulating film 7 for the high-breakdown voltage MOSFET (HNMOS and HPMOS), as in FIGS. 34B and 34C. At this time, the gate insulating film of the switch MOSFET for selecting the memory block (or memory mat) is also formed simultaneously with the gate insulating film 7 of the aforementioned high-breakdown voltage MOSFET.

In FIG. 58C, ①: the first conductor layer 9 for the floating gates and the gate electrodes of the high-breakdown voltage MOSFETs (HNMOS and HPMOS) is formed and patterned to a predetermined shape.

②: As in FIG. 35B, there are formed the second gate insulating film 18 between the floating gates and the control gates and a gate insulating film 19 for the ordinary MOSFETs (NMOS and PMOS).

Figure 59:
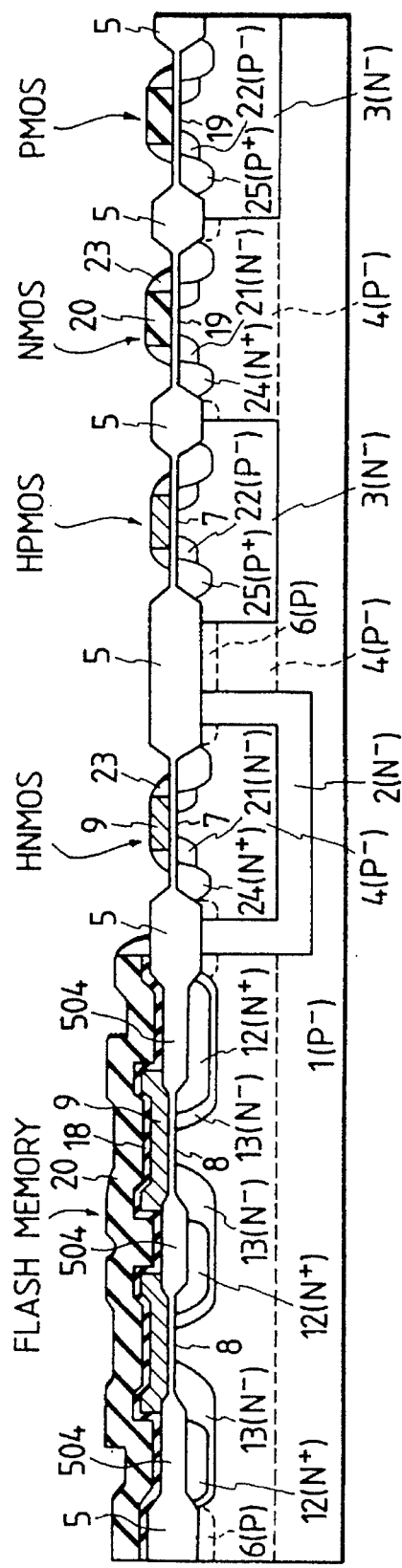

In FIG. 59, ①: as in FIGS. 35C and 36A, there is formed the second conductor layer 20 for the control gates and the gate electrodes of the ordinary MOSFETs (HNMOS and PMOS). After this, a patterning is performed to form a predetermined shape.

②: As in the foregoing embodiments, there are individually formed the lightly doped $N^-$-type semiconductor region 21, the $P^-$-type semiconductor region 22, the heavily doped $N^+$-type semiconductor region 24 and the $P^+$-type semiconductor region 25, which form the high-breakdown voltage MOSFET (HNMOS and HPMOS) and the ordinary MOSFETs (NMOS and PMOS).

In order to form the silicon oxide film 504 over the buried data lines, the silicon nitride film may be shared with the silicon nitride film which is used for forming the field insulating film 5. Specifically, ①: the field insulating film 5 is formed of the silicon nitride film 502. ②: Excepting this silicon nitride film 502, the silicon nitride film 502 in the region of the buried data lines is patterned. ③: After this, the procedure of FIG. 58A is followed.

Figure 60:
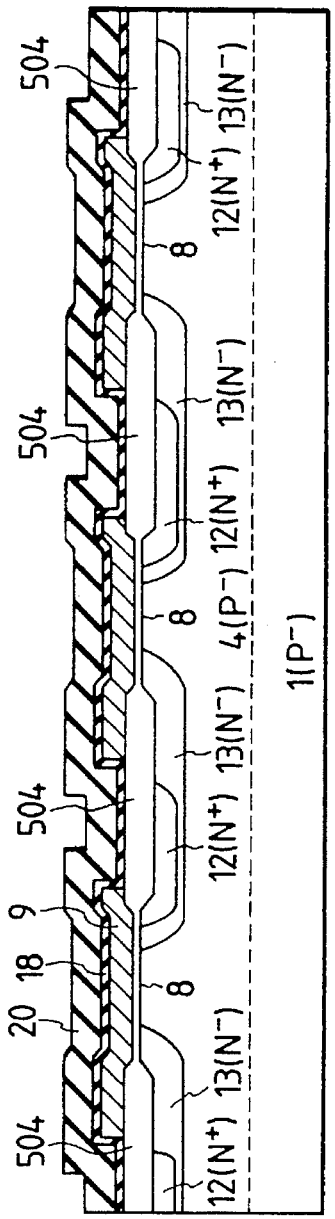
FIG. 60 is a section showing an element structure of another embodiment of the memory cell portion according to the present invention.

FIG. 60 is a section showing an element structure of another embodiment of the memory cell portion according to the present invention. In this embodiment, the first conductor layer 9 for the floating gates is offset downward of the drawing to reduce the overlapping area with the heavily doped $N^+$-type semiconductor region 12 of the buried data lines thereby to reduce the parasitic capacitance accordingly. As a result, the potential of the floating gates can be prevented from fluctuating by the voltage to be applied to the $N^+$-type semiconductor region 12 when in the writing operation.

In the present invention, the writing operation and the erasing operation are carried out by the F-N tunneling of electrons. Moreover, the memory current can be established from the heavily doped source and drain in the embodiment of FIG. 1 if the read voltage used will not produce the hoe electrons. We have noted this fact and have found that a nonvolatile memory device can be constructed in the memory element having the stacked gate structure forming the EPROM of the prior art, if the insulating film between the floating gates and the substrate surface is formed of the tunnel insulating film such as the aforementioned first gate insulating film.

Figure 48:
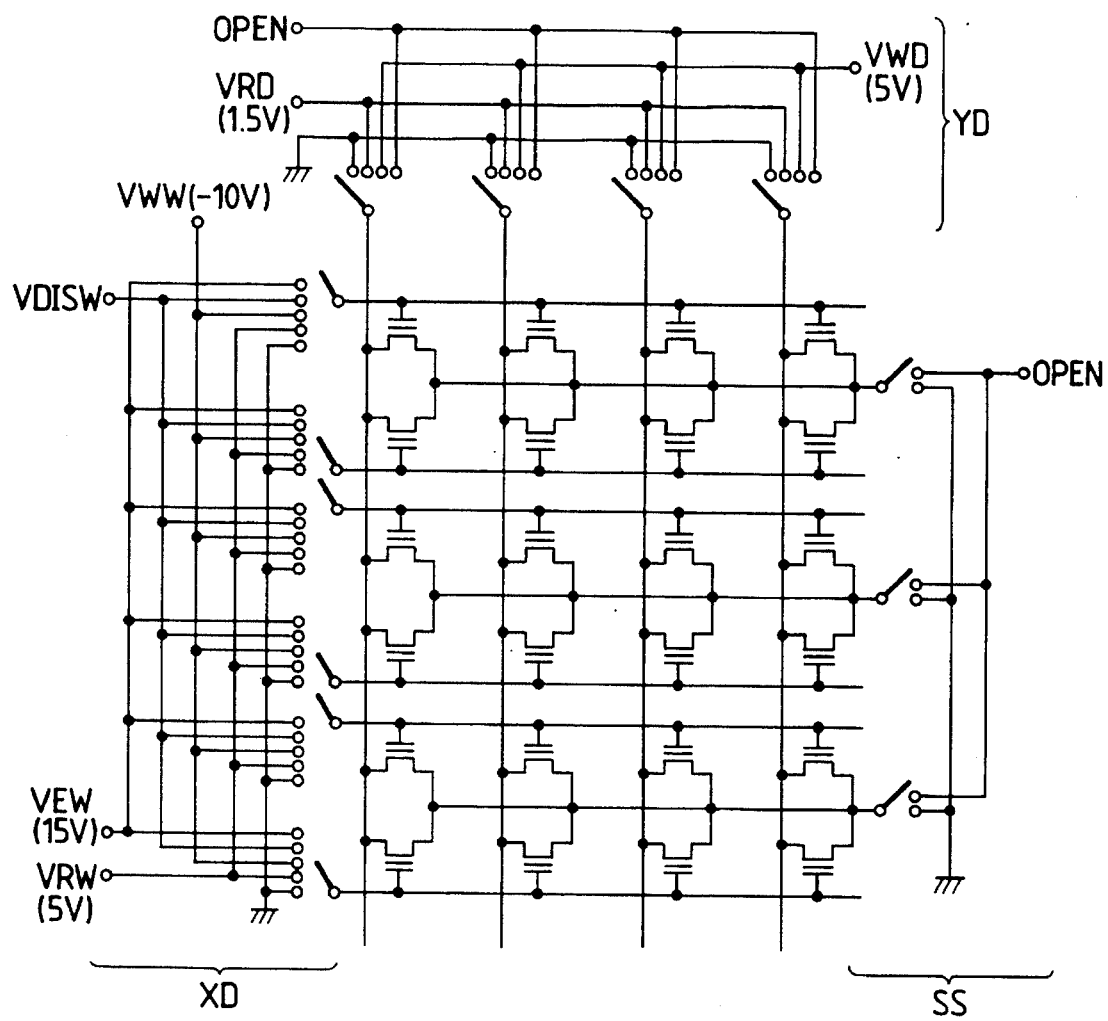
FIG. 48 is a schematic circuit diagram showing another embodiment of the nonvolatile memory device according to the present invention.

FIG. 48 is a schematic diagram showing another embodiment of the nonvolatile memory device according to the present invention. The memory array is constructed as in the well-known EPROM such that the memory elements of the stacked gate structure composed of the control gates and the floating gates are formed in the NOR type. However, the insulating film below the floating gates of the memory elements is formed of the tunnel insulating film, as described above.

For the writing, erasing and reading operations of those memory cells, the word lines to be connected with the control gates of the memory cells are selectively supplied with five kinds of writing, erasing and reading voltages VDISW, VWW, VEW, VRW and GND by the X-decoder XD, as shown in the switch shape. On the other hand, the data lines to be connected with the drains of the memory elements are selectively supplied with four kinds of voltages of the floating state (OPEN), VWD, VRD and GND by the Y-decoder YD, as shown in the switch shape. Moreover, the source lines to be connected with the sources of the memory elements are selectively supplied with the floating state (OPEN) and GND by the source switch SS. Of the aforementioned voltages: the voltage VWW is set to −10 V; the voltage VEW is set to 15 V; the voltage VRW is set to 5 V; the voltage VWD is set to 5 V; and the voltage VRD is set to 1.5 V.

Figure 49A:
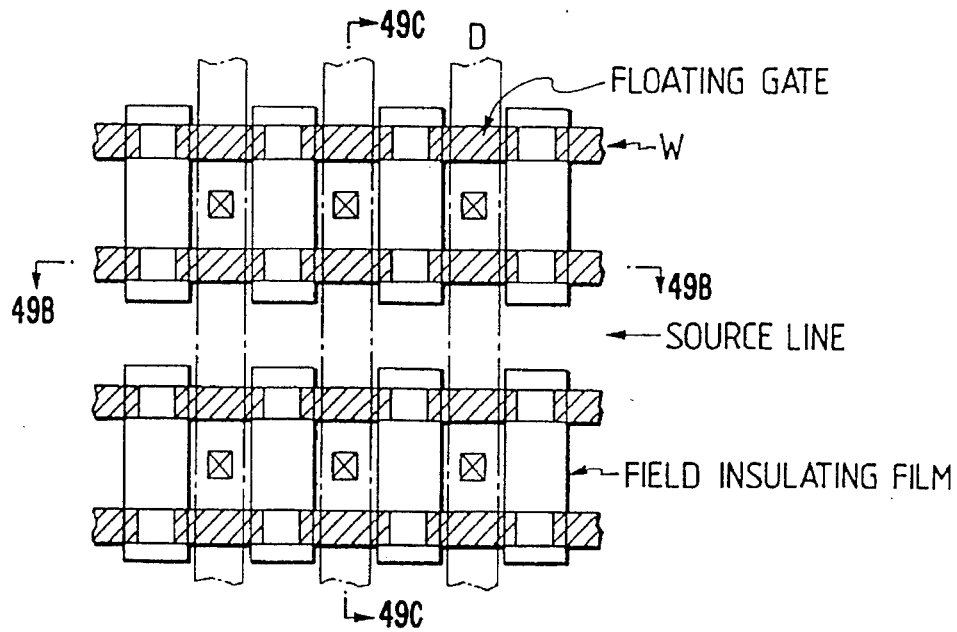
FIGS. 49A to 49C are a layout for explaining the memory array portion of FIG. 48 and sections showing the structures of portions corresponding thereto.
Figure 49B:
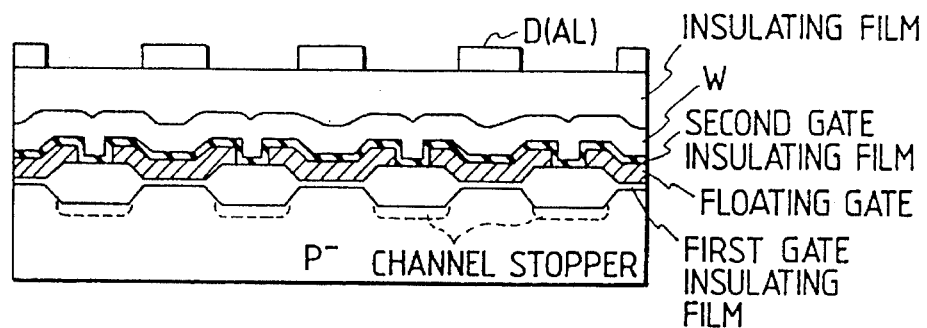
Figure 49C:
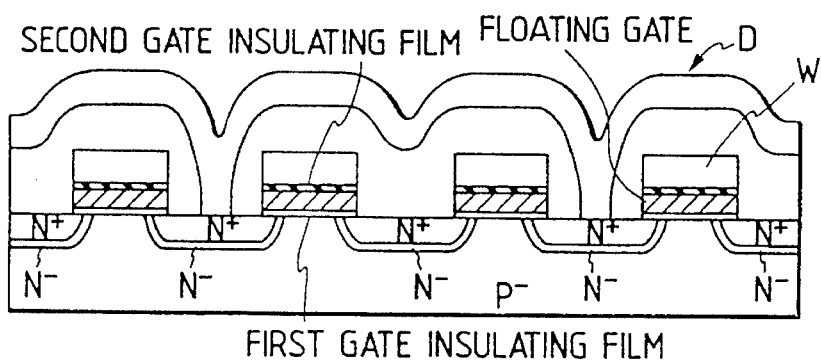

FIGS. 49A to 49C are a layout and sections showing the memory array portion. Of these: FIG. 49A is a top plan layout diagram; FIG. 49B is a section taken along line 49B—49B of FIG. 49A; and FIG. 49C is a section taken along line 49C—49C of FIG. 49A.

In these Figures, the first gate insulating film is formed of a tunnel insulating film as thin as 8 to 10 nm, as described before. Moreover, the source and drain diffusion layer is formed by forming the heavily doped $N^+$-type semiconductor region in the lightly doped $N^-$-type semiconductor region. Thanks to this structure, the read voltage is set to a voltage as low as 1.5 V, and the establishment of hot electrons is suppressed in the vicinity of the drain at the reading time to prevent an erroneous erasure accompanying the reading operation. This dual diffusion structure can also be achieved by one similar to that of the aforementioned high-breakdown voltage MOSFET.

Figure 50:
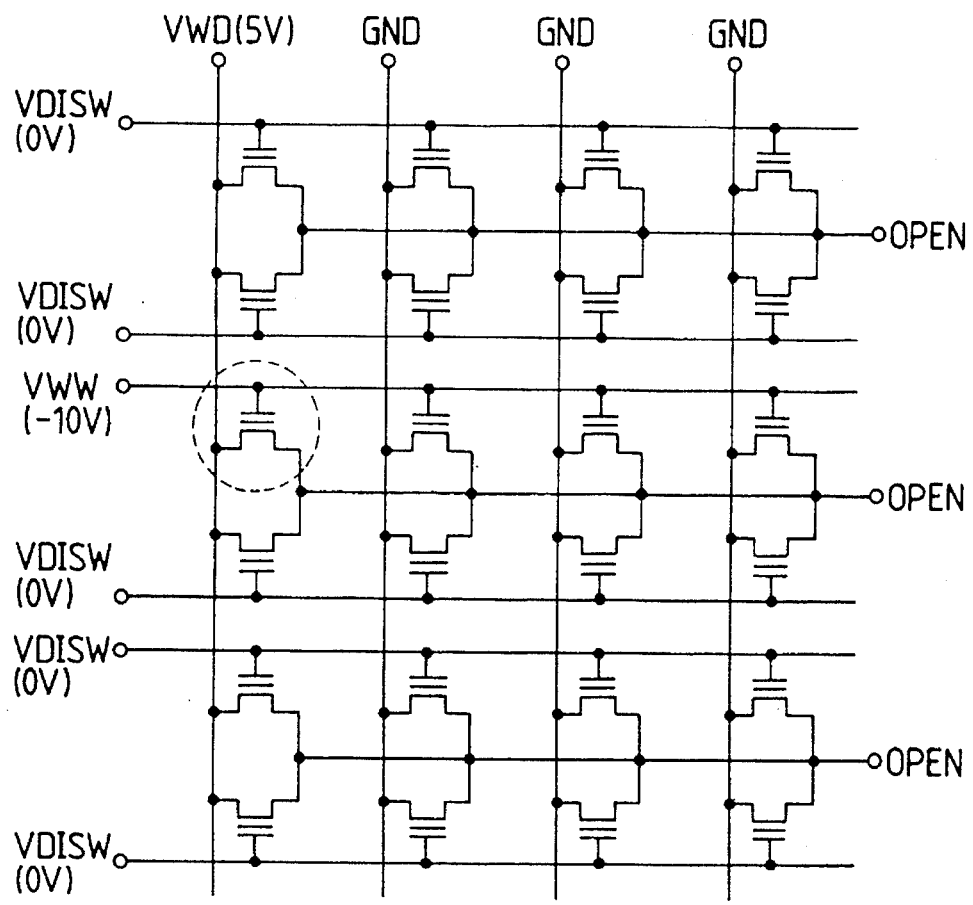
FIGS. 50A and 50B are a circuit diagram for explaining the writing operation of the nonvolatile memory device of FIG. 48 and a section showing a schematic structure, respectively.
Figure 50:
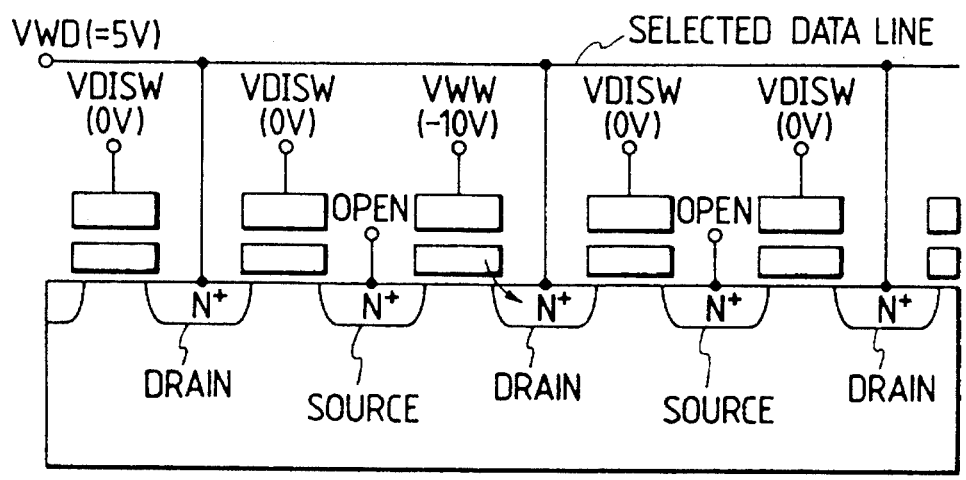

FIGS. 50A and 50B are a schematic circuit diagram and a schematic structural section, respectively, for explaining one embodiment of the writing operation of the nonvolatile memory device of FIG. 48. In this embodiment, too, the writing operation is termed to extract the electrons like before from the floating gates FG of the memory cells to the drains by the F-N tunneling of electrons.

The selected word line is supplied with the write voltage VWW such as −10 V. The remaining unselected word lines are supplied with the voltage VDISW of 0 V. At this time, all the source lines are set to the floating state. The selected data line is supplied with the write voltage of 5 V, and the unselected data lines are set to the ground potential of the circuit.

In this state, in the memory cell of the selected bit of FIG. 50B, a voltage as high as 15 V is applied between the control gate and the drain so that the tunneling current flows from the floating gate to the drain to effect the writing operation. In the memory cell having its data line selected but its word line unselected, on the contrary, a voltage as low as about 5 V is applied between the control gate and the drain, no tunneling current flows so that the writing operation is not effected. In the memory cell having its word line selected but its data line unselected, the writing operation is not carried out either, because a voltage of about 10 V is applied between the control gate and the drain so that no tunneling current flows.

Figure 51A:
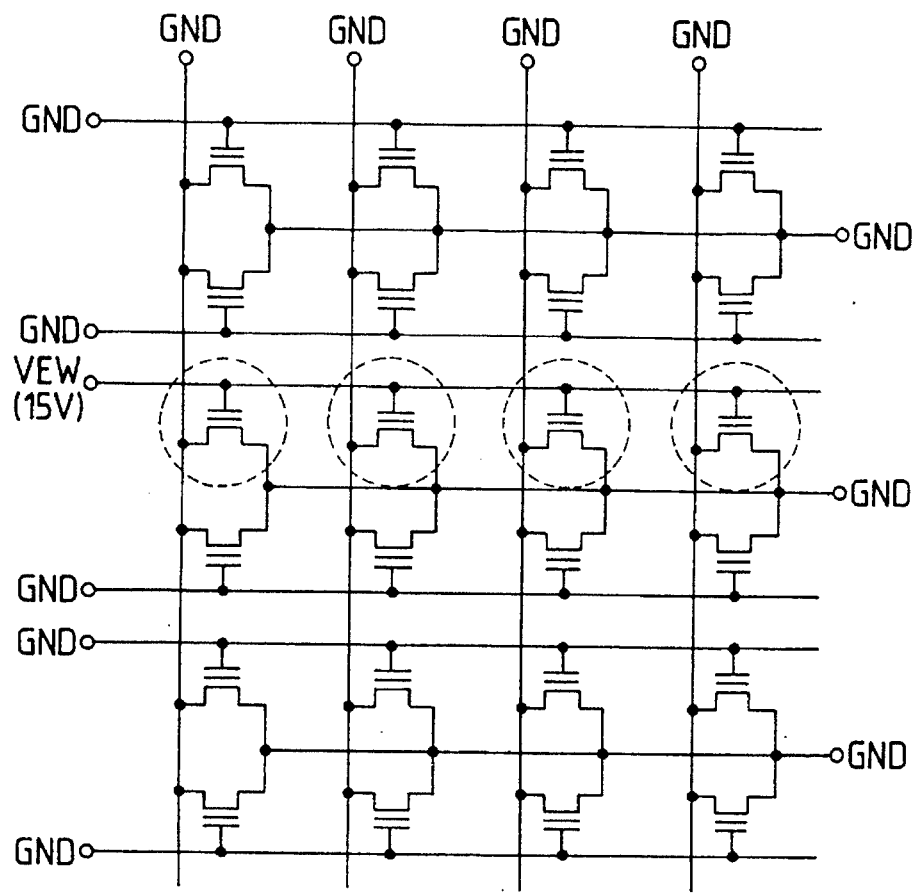
FIGS. 51A and 51B are a circuit diagram for explaining the erasing operation of the nonvolatile memory device of FIG. 48 and a section showing a schematic structure, respectively.
Figure 51B:
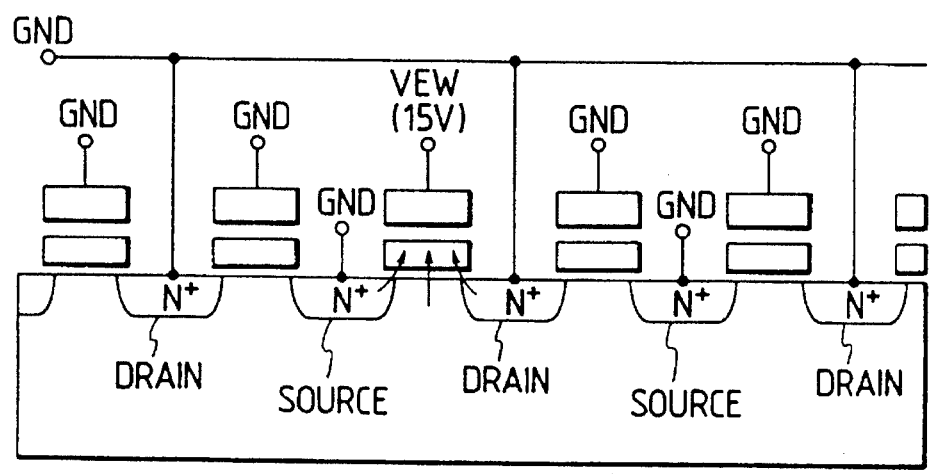

FIGS. 51A and 51B are a schematic circuit diagram and a schematic structural section, respectively, for explaining one embodiment of the erasing operation of the nonvolatile memory device of FIG. 48. In this embodiment, too, the erasing operation is termed to inject the electrons like before into the floating gates FG of the memory cells by the F-N tunneling of electrons.

The selected word line is supplied with the erase voltage VEW such as 15 V. The remaining unselected word lines are supplied with the voltage of 0 V. At this time, all the source lines are set to the ground potential of the circuit. All the data lines are set to the circuit ground potential.

In this state, in the memory cell of the selected bit of FIG. 51B, a voltage as high as 15 V is applied between the control gate and the drain and between the source and the substrate so that the tunneling current flows to the floating gaze to effect the erasing operation. In the memory cell having its word line selected, on the contrary, the tunneling current is not established because of the potential equal to the circuit ground potential GND so that the erasing operation is not carried out.

Figure 52A:
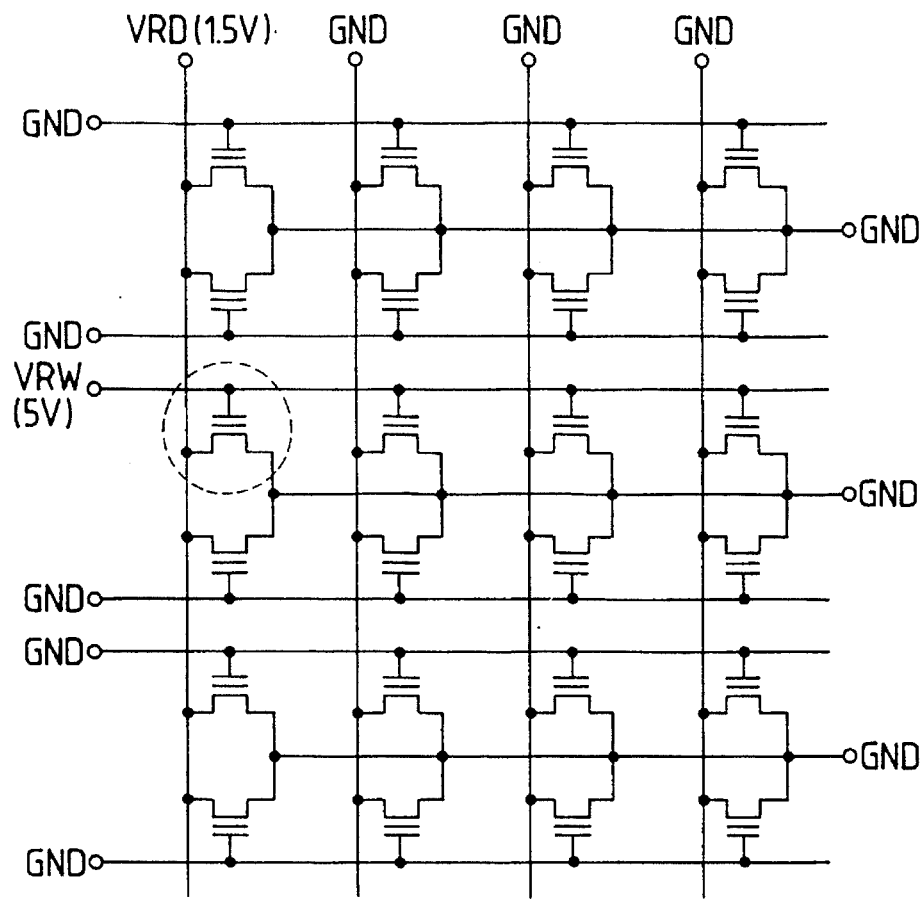
FIGS. 52A and 52B are a circuit diagram for explaining the reading operation of the nonvolatile memory device of FIG. 48 and a section showing a schematic structure, respectively.
Figure 52B:
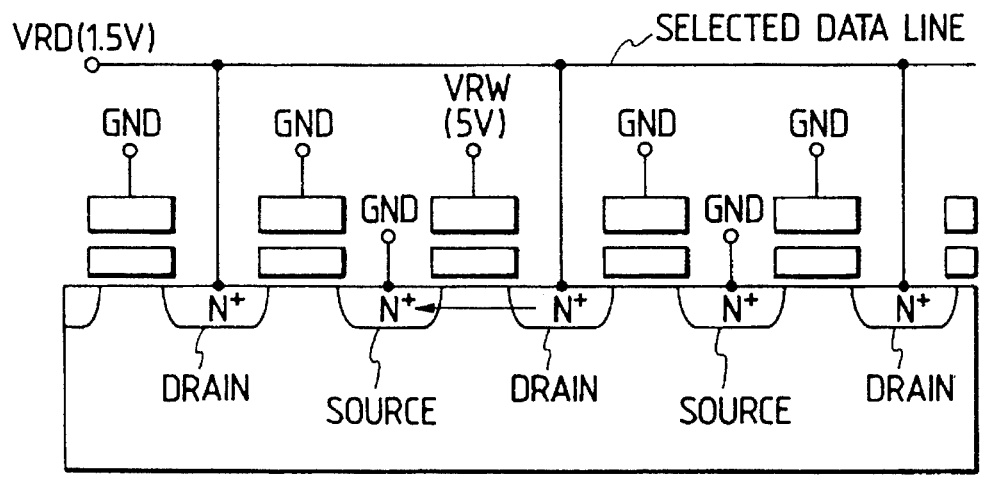

FIGS. 52A and 52B are a schematic circuit diagram and a schematic structural section, respectively, for explaining one embodiment of the reading operation of the nonvolatile memory device of FIG. 48. The selected word line is supplied with the read voltage VRW of 5 V. The remaining unselected word lines are supplied with the voltage of 0 V. At this time, all the source lines are see to the ground potential of the circuit. The selected data line is supplied with the read voltage VRD as low as 1.5 V, and the unselected data lines are see to the circuit ground potential.

In this state, the memory current flows from the drain to the source of the selected memory cell, as shown in FIG. 52B, if the writing operation is carried out to drop the threshold voltage. Unless the writing operation is carried out, no memory current flows. Whether or not such memory current is present is sensed by the sense amplifier to produce the read data.

Figure 53A:
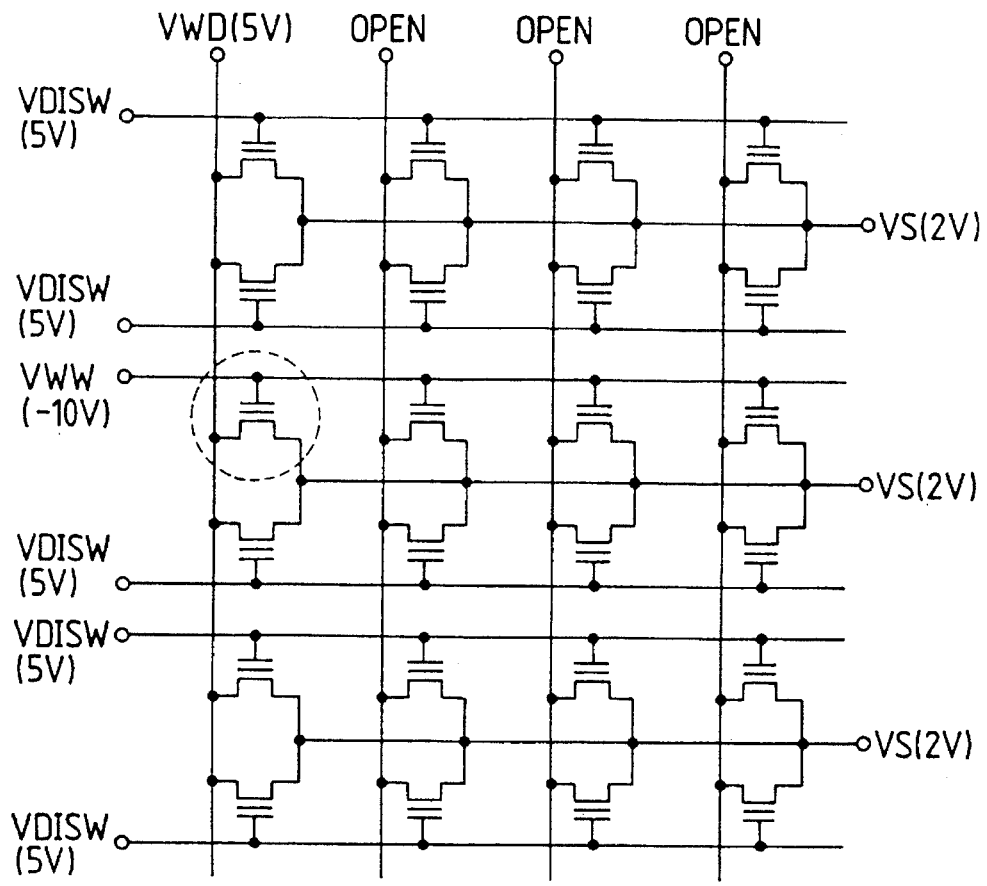
FIGS. 53A and 53B are a schematic circuit diagram showing still another embodiment of the nonvolatile memory device according to the present invention and a section showing a schematic structure, respectively.
Figure 53B:
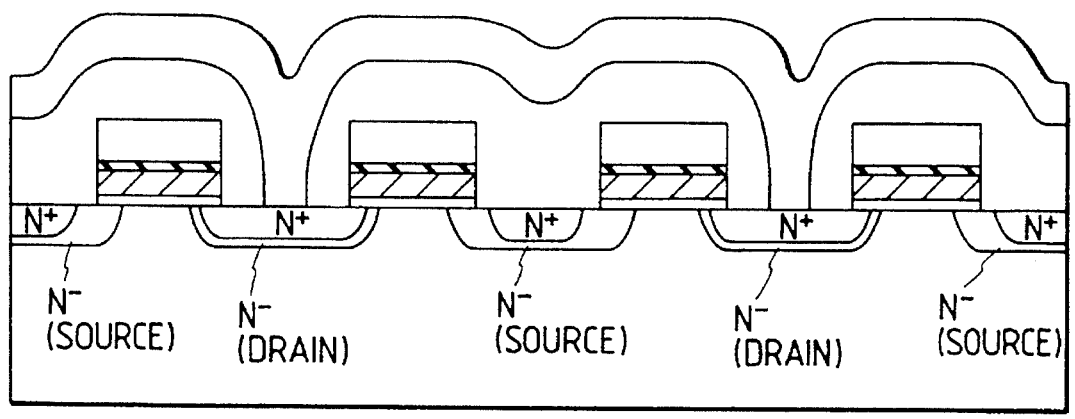

FIGS. 53A and 53B are a schematic circuit diagram and a schematic structural section, respectively, for explaining another embodiment of the writing operation of the aforementioned NOR type nonvolatile memory device. In this embodiment, too, the writing operation is termed to extract one electrons like before from the floating gates FG of the memory cells to the drains by the F-N tunneling of electrons.

The selected word line is supplied with the write voltage VWW such as −10 V. The remaining unselected At this lines are supplied with the voltage VDISW of 5 V. At this time, the source lines are supplied with the bias voltage of 2 V. The selected data line is supplied with the write voltage of 5 V, and the unselected data lines are set to the floating state (OPEN).

By applying the bias voltage of 2 V to the source lines, as described above, it is possible no prevent any leakage current in the unselected bits which have their word lines see to 5 V and their data lines set to 5 V. Moreover, the data to be written can be prevented from being disturbed, because the voltage of 5 V is applied to the unselected word lines, as described above.

As shown in FIG. 53B, the N$^+$-type layer in the drain portion is so extended below the floating gazes as to overlap, and the N$^+$-type layer in the source portion is not extended below the floating gates, that is to say, the floating gates are made to overlap only the N$^-$-type layer so that no writing current may flow from the source side. This concept is similar to that of the foregoing embodiment of FIG. 1 excepting that the source and drain are different.

In the nonvolatile memory device according to the present invention thus far described, the writing operation and the batch erasure at the minimum unit of word lines are carried out by using the F-N tunneling of electrons so that the nonvolatile memory device can be operated by the write voltage and the erase voltage which are generated by the internal circuit. As a result, the nonvolatile memory device can be subjected to the writing/erasing operation while it is packaged in a system such as a microcomputer. Moreover, the operating voltage can be generated by the aforementioned single power source such as 5 V or 3 V so that the power source device for the system can be simplified.

Noting that the writing operation is carried out by the tunneling of electrons, a plurality of bits can be simultaneously written. In the embodiment of FIG. 1, for example, the memory cells of every other data lines can be simultaneously written. For this operation, the input buffer is equipped with the latch for latching the data corresponding to every other memory cells of one word line temporarily so that the data may be written all at once, as described above.

In the present invention, the writing operation is termed to extract the electrons from the floating gates by the tunneling of electrodes, and the erasing operation is termed to inject the electrons into the floating gates. This structure is advantageous especially if the memory cell is composed of one element, as in the embodiments of FIG. 1 and FIG. 48. This will be reasoned in the following. The erasing operation takes the batch erasure mode using the word lines as the minimum unit so that its verification is troublesome. In the present invention, however, the erasing operation is controlled to raise the threshold voltage of the memory elements. Unlike the flash ROM of the prior art, there is no fear that the memory elements are brought by an excessive erasure into the depletion mode in which the reading operation is impossible.

On the other hand, the reading operation is basically carried out by selecting one memory cell. Thus, the writing rate can be accurately controlled with relative ease by the high-speed algorithm of repeating the writing operation and the writing verification. If the writing rate is thus accurately controlled, the erasing operation may be effected by injecting the electrons with reference to the writing rate so that the writing/erasing operations can be easily controlled as a whole.

The effects to be obtained from the embodiments thus far described are as follows.

(1) A semiconductor substrate of a first conductivity type has formed on its main surface a floating gate through a first gate insulating film and further, has formed over the floating gate a control gate through a second gate insulating film. In one of a source and drain which are of a second conductivity type and which form a paired source and drain formed in the semiconductor substrate beneath the floating gate, a semiconductor region of the second conductivity type having a lower impurity concentration is formed in a portion overlapping, with respect to a plan view, the floating gate. A nonvolatile memory device thus constructed has its writing operation carried out by extracting electrons from the floating gate to the other of the paired source and drain by an F-N (i.e., Fowler-Nordheim) tunneling of electrons flowing through the first gate insulating film, its erasing operation carried out by injecting from the paired source and drain or the semiconductor substrate into the floating gate by the F-N tunneling of electrons flowing through the first gate insulating film, and its reading operation carried out by raising the potential of the control gate to sense whether or not the memory current flows from one of the source and drain region to the other source and drain region. According to the structure described above, one source and drain can be shared as the data lines or source lines between memory cells adjacent to each other in a word line direction so that the memory cells can be substantially small-sized. The writing operation and the erasing operation can be carried out by the tunnel current so that their necessary high voltages can be generated by the internal circuits.

(2) A semiconductor substrate of a first conductivity type has formed above its main surface a floating gate in a manner in which one end thereof is overlapping, with respect to a plan view, through a first gate insulating film, one of source and drain regions which are semiconductor regions of a second conductivity type forming a paired source and drain and has further formed, over the floating gate and over the semiconductor substrate between the other end of the floating gate and the other one of the source and drain regions, a control gate through a second gate insulating film. A nonvolatile memory device thus constructed has its writing operation carried out by extracting electrons from the floating gate to one of the paired source and drain by the F-N tunneling of electrons flowing through the first gate insulating film, its erasing operation carried out by injecting from the paired source and drain or the semiconductor substrate into the floating gate by the F-N tunneling of electrons, and its reading operation carried out by raising the potential of the control gate to sense whether or not the memory current flows from the other of the source and drain region to one of the source and drain region. According to the structure described above, one source and drain can be shared as the data lines or source lines between memory cells adjacent to each other in a word line direction so that the memory cells can be substantially small-sized. The writing operation and the erasing operation can be carried out by the tunnel current so that their necessary high voltages can be generated by the internal circuits.

(3) A nonvolatile memory device comprises: a floating gate formed on the main surface of a semiconductor substrate of a first conductivity type through a first gate insulating film: a control gate formed over the floating gate through a second gate insulating film; and a semiconductor region formed over the semiconductor substrate across the floating gate for forming a pair of source and drain of a second conductivity type. The nonvolatile memory device thus constructed has its writing operation carried out by extracting electrons from the floating gate to one of the paired source and drain by the F-N tunneling of electrons flowing through the first gate insulating film, its erasing operation carried out by injecting from the paired source and drain or the semiconductor substrate into the floating gate by the F-N tunneling of electrons flowing through the first gate insulating film, and its reading operation carried out by raising the potential of the control gate to sense whether or not the memory current flows from one of the source and drain region given a potential too low to establish the hot electrons to the other source and drain region. The structure described above can be achieved merely by changing a portion of the EPROM of the prior art, and a high voltage necessary for the writing operation or the erasing operation can be generated by the internal circuit.

(4) Thanks to the aforementioned effect (1) or (2), the hot electrons can be prevented from being established at the reading time, by forming the heavily doped region in the lightly doped region. Thus, the memory current can be fed from the same data line as the data line to be written, so that the data line selecting circuit can be simplified.

(5) Since the writing operation is carried out by the tunneling of electrons, the writing time can be shortened, that is, the writing operation can be substantially speeded up by carrying out the writing operation at the unit of plural bits to be simultaneously selected.

(6) When each memory block is equipped with the switch MOSFET for connecting the main data lines and the buried data lines of the memory block, the switch MOSFETs are arranged at the upper and lower sides of every other memory blocks so that the block data line resistance can be equalized independently of the position of the memory cells. In the write mode, the write voltage can be less dispersed for the connected positions of the memory cells to stabilize the writing operation. Moreover, the reading operation can be speeded up at a low voltage.

(7) A relatively thick oxide film is formed over the buried data lines by the thermal oxidation method, and the floating gates are extended to the oxide film. As a result, the capacitance between the floating gates and the control gates can be made larger than the parasitic capacitance between the floating gates and the underlying diffusion layer, so that the writing operation can be made efficient and stabilized.

Although our invention has been specifically described in connection with the exemplified embodiments, it should not be considered as being limited thereto. That is, the present invention is not only inclusive of the exemplified embodiments but, also, can be considered as being inclusive of various and obvious modifications of such embodiments as well as inclusive of other embodiments which are exemplary of the invention. For example, the specific structure of the X-decoder or Y-decoder may be any if it can output the individual voltages, as described above, in accordance with the operation modes. The aforementioned writing/erasing voltages may be set in any manner if it can establish the tunneling of electrons in the writing operation from the floating gates to the selected source or drain and in the erasing operation from the source and drain or the substrate in the memory cell connected with the selected word line to the floating gates. In the reading operation, moreover, the voltage setting may be devised to establish a condition in which hot electrons are precluded from the vicinity of the drain to be read. The structure of the elements forming the memory cells or its peripheral circuit may be any if it is substantially identical to those of the foregoing embodiments.

The nonvolatile memory device according to the present invention can be used not only as a single nonvolatile memory device but also a memory device to be packaged in the aforementioned microcomputer or a variety of digital data processors.

The effects to be obtained by the representative of the invention disclosed herein will be briefly described in the following. Specifically, the semiconductor substrate of a first conductivity type has formed on its main surface a floating gate through a first gate insulating film and has further formed over the floating gate a control gate through the second gate insulating film. In one of a source and drain which are of a second conductivity type and which form a paired source and drain formed in the semiconductor substrate beneath the floating gate, a semiconductor region of the second conductivity type having a lower impurity concentration is formed in the portion overlapping, with respect to a plan view, the floating gate. The nonvolatile memory device thus constructed has its writing operation carried out by extracting electrons from the floating gate to the other of the paired source and drain by an F-N (Fowler-Nordheim) tunneling of electrons flowing through the first gate insulating film, its erasing operation carried out by injecting from the paired source and drain or the semiconductor substrate into the floating gate by the F-N tunneling of electrons flowing through the first gate insulating film, and its reading operation carried out by raising the potential of the control gate to sense whether or not the memory current flows from one of the source and drain region to the other source and drain region. According to the structure described above, one source and drain can be shared as the data lines or source lines between memory cells adjacent to each other in the word line direction so that the memory cells can be substantially small-sized. The writing operation and the erasing operation can be carried out by the tunnel current so that their necessary high voltages can be generated by the internal circuits.

The semiconductor substrate of the first conductivity type has formed above its main surface the floating gate in a manner in which one end thereof is overlapping, with respect to a plan view, through the first gate insulating film, one of source and drain regions which are semiconductor regions of the second conductivity type forming a paired source and drain and has further formed, over the floating gate and over the semiconductor substrate between the other end of the floating gate and the other one of the source and drain regions, the control gate through the second gate insulating film. The nonvolatile memory device thus constructed has its writing operation carried out by extracting electrons from the floating gate to one of the paired source and drain by the F-N tunneling of electrons flowing through the first gate insulating film, its erasing operation carried out by injecting from the paired source and drain or the semiconductor substrate into the floating gate by the F-N tunneling of electrons, and its reading operation carried out by raising the potential of the control gate to sense whether or not the memory current flows from the other of the source and drain region to one of the source and drain region. According to the structure described above, one source and drain can be shared as the data lines or source lines between memory cells adjacent to each other in the word line direction so that the memory cells can be substantially small-sized. The writing operation and the erasing operation can be carried out by the tunnel current so that their necessary high voltages can be generated by the internal circuits.

What is claimed is:

1. A semiconductor memory device comprising:

a semiconductor substrate having a main surface;

word lines formed over said main surface and extending in a first direction;

a plurality of memory cells, each comprised of a single MISFET which includes a floating gate electrode, a control gate electrode, first and second semiconductor regions formed in said substrate, and a channel forming region formed in said substrate and between said first and second semiconductor regions, wherein said memory cells are arranged in said first direction and a second direction, perpendicular to said first direction, wherein said floating gate electrode is formed over a first gate insulating film formed over said main surface, wherein said control gate electrode is formed over a second gate insulating film formed over said floating gate electrode, wherein the control gate electrodes of said memory cells arranged in said first direction are integrally formed with corresponding ones of said word lines, wherein said first and second semiconductor regions are extended under said floating gate electrode, and wherein an impurity concentration of said second semiconductor region is lower than that of said first semiconductor region; and buried lines formed in said substrate and extending in said second direction, wherein said buried lines are formed commonly for adjacent memory cells arranged in said first direction and are integrally formed with said first and second semiconductor regions in such a manner that a second semiconductor region of a memory cell is integrally formed, at a first end of said channel thereof, with a first semiconductor region of a memory cell adjacent to said memory cell in said first direction, that a first semiconductor region of said memory cell is integrally formed, at a second, opposite end of said channel thereof, with a second semiconductor region of another memory cell adjacent to said memory cell in said first direction, and that each first semiconductor region is formed under a floating gate electrode of a corresponding memory cell and is spaced apart, in said first direction, from a floating gate electrode of a memory cell adjacent to said memory cell in said first direction, wherein said buried lines are extended in said second direction in such a manner that said buried lines are integrally formed with said first and second semiconductor regions of said memory cells arranged in said second direction, wherein, when a first negative voltage, a first positive voltage and a second voltage, more positive than said first negative voltage, are applied to one word line, one buried line and other word lines, respectively, in a write operation, electrons are transferred from a floating gate electrode of a memory cell associated with said one word line to a first semiconductor region of said memory cell associated with said one buried line by electron tunneling through a first gate insulating film of said memory cell, and wherein, when a second positive voltage and a ground potential are applied to said word line and said buried lines, respectively, in an erasing operation, electrons are transferred from said substrate to said floating gate electrode by electron tunneling through said first gate insulating film.

2. A semiconductor memory device according to claim 1, wherein said second semiconductor region has an impurity concentration in which a depletion layer is formed in a surface portion of said second semiconductor region, under said floating gate, associated with said one buried line in said write operation, and wherein said first semiconductor region has an impurity concentration in which a depletion layer is not formed in a surface portion of said first semiconductor region, under said floating gate, associated with said one buried line in said write operation.

3. A semiconductor memory device according to claim 2, wherein said second voltage is a ground potential or a positive voltage.

4. A semiconductor memory device according to claim 3, wherein, in said erasing operation, said second positive voltage and a ground potential are applied to at least one of said word lines and the remaining ones of said word lines, respectively.

5. A semiconductor memory device according to claim 1, wherein, in said erasing operation, said second positive voltage and a ground potential are applied to at least one of said word lines and the remaining ones of said word lines, respectively.

6. A semiconductor memory device according to claim 2, wherein, in each said buried line, said second semiconductor region is formed to surround said first semiconductor region.

7. A semiconductor memory device according to claim 1, wherein, in each said buried line, said second semiconductor region is formed to surround said first semiconductor region.

8. A semiconductor memory device according to claim 2, wherein said channel forming region is of p-type conductivity, and said first and second semiconductor regions are of n-type conductivity.

9. A semiconductor memory device according to claim 1, wherein said first and second semiconductor regions are of n-type conductivity, and said semiconductor substrate is of p-type conductivity.

10. A semiconductor memory device comprising:

a semiconductor substrate having a main surface;

word lines formed over said main surface and extending in a first direction;

a plurality of memory cells, each comprised of a single MISFET which includes a floating gate electrode, a control gate electrode, first and second semiconductor regions formed in said substrate, and a channel forming region formed in said substrate and between said first and second semiconductor regions, wherein said memory cells are arranged in said first direction and a second direction, perpendicular to said first direction, wherein said floating gate electrode is formed over a first gate insulating film formed over said main surface, wherein said control gate electrode is formed over a second gate insulating film formed over said floating gate electrode, wherein the control gate electrodes of said memory cells arranged in said first direction are integrally formed with corresponding ones of said word lines, wherein said first and second semiconductor regions are extended under said floating gate electrode, and wherein an impurity concentration of said second semiconductor region is lower than that of said first semiconductor region; and buried lines formed in said substrate and extending in said second direction, wherein said buried lines are formed commonly for adjacent memory cells arranged in said first direction and are integrally formed with said first and second semiconductor regions in such a manner that a second semiconductor region of a memory cell is integrally formed, at a first end of said channel thereof, with a first semiconductor region of a memory cell adjacent to said memory cell in said first direction, that a first semiconductor region of a memory cell is integrally formed, at a second, opposite end of said channel thereof, with a second semiconductor region of another memory cell adjacent to said memory cell in said first direction, and that each first semiconductor region is formed under a floating gate electrode of a corresponding memory cell and is spaced apart, in said first direction, from a floating gate electrode of a memory cell adjacent to said memory cell in said first direction, wherein said buried lines are extended in said second direction in such a manner that said buried lines are integrally formed with said first and second semiconductor regions of said memory cells arranged in said second direction, wherein, when a first negative voltage, a first positive voltage and a second voltage, more positive than said first negative voltage, are applied to one word line, one buried line and other word lines, respectively, in a write operation, electrons are transferred from a floating gate electrode of a memory cell associated with said one word line to a first semiconductor region of said memory cell associated with said one buried line by electron tunneling through a first gate insulating film of said memory cell, and wherein, when a second positive voltage and a third voltage, more negative than said second positive voltage, are applied to said word line and said buried line, respectively, in an erasing operation, electrons are transferred from said substrate to said floating gate electrode by electron tunneling through said first gate insulating film.

11. A semiconductor memory device according to claim 10, wherein said second semiconductor region has an impurity concentration in which a depletion layer is formed in a surface portion of said second semiconductor region, under said floating gate, associated with said one buried line in said write operation, and wherein said first semiconductor region has an impurity concentration in which a depletion layer is not formed in a surface portion of said first semiconductor region, under said floating gate, associated with said one buried line in said write operation.

12. A semiconductor memory device according to claim 11, wherein said second voltage is a ground potential or a positive voltage.

13. A semiconductor memory device according to claim 12, wherein said first and second semiconductor regions are of n-type conductivity, and said semiconductor substrate is of p-type conductivity.

14. A semiconductor memory device according to claim 13, wherein said third voltage is a ground potential.

15. A semiconductor memory device according to claim 11, wherein, in each said buried line, said second semiconductor region is formed to surround said first semiconductor region.

16. A semiconductor memory device according to claim 10, wherein said first and second semiconductor regions are of n-type conductivity, and said semiconductor substrate is of p-type conductivity.

* * * * *